(12) United States Patent
Kitano et al.

(10) Patent No.: US 11,159,173 B2
(45) Date of Patent: Oct. 26, 2021

(54) DAC CIRCUIT, SOLID-STATE IMAGING ELEMENT, AND ELECTRONIC EQUIPMENT

(71) Applicant: SONY SEMICONDUCTOR SOLUTIONS CORPORATION, Kanagawa (JP)

(72) Inventors: Shin Kitano, Tokyo (JP); Masaki Sakakibara, Kanagawa (JP); Hidekazu Kikuchi, Kanagawa (JP); Mitsuaki Osame, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/961,565

(22) PCT Filed: Jan. 15, 2019

(86) PCT No.: PCT/JP2019/000874
§ 371 (c)(1),
(2) Date: Jul. 10, 2020

(87) PCT Pub. No.: WO2019/146443
PCT Pub. Date: Aug. 1, 2019

(65) Prior Publication Data
US 2021/0067168 A1 Mar. 4, 2021

(30) Foreign Application Priority Data
Jan. 29, 2018 (JP) .............................. JP2018-012704

(51) Int. Cl.
*H03M 1/66* (2006.01)
*H03M 1/56* (2006.01)
*H04N 5/3745* (2011.01)

(52) U.S. Cl.
CPC .......... *H03M 1/56* (2013.01); *H04N 5/37455* (2013.01)

(58) Field of Classification Search
CPC ...... H03M 1/56; H03M 1/66; H04N 5/37455; H04N 5/37457
(Continued)

(56) References Cited

U.S. PATENT DOCUMENTS 5,952,949 A * 9/1999 Coy ...................... H03K 3/0231
341/144
2004/0008270 A1 1/2004 Hisamatsu et al.
(Continued)

FOREIGN PATENT DOCUMENTS

JP 2003-348376 A 12/2003
JP 2014-165845 A 9/2014
(Continued)

OTHER PUBLICATIONS

International Search Report and Written Opinion of PCT Application No. PCT/JP2019/000874, dated Apr. 16, 2019, 10 pages of ISRWO.

*Primary Examiner* — Peguy Jean Pierre
(74) *Attorney, Agent, or Firm* — Chip Law Group

(57) ABSTRACT

The present technology relates to a DAC circuit, a solid-state imaging element, and electronic equipment that can be achieved with a small-scale circuit configuration. The DAC circuit includes: a ramp DAC that generates a ramp signal that changes in voltage with a constant time gradient; an injection DAC that outputs a predetermined voltage during a reset period for resetting a comparison target voltage to be compared with the ramp signal; and an adding circuit that adds an output of the ramp DAC and an output of the injection DAC and outputs the outputs to a comparison circuit as a comparison reference voltage. The present
(Continued)

technology can be applied to, for example, a DAC circuit of a solid-state imaging element, and the like.

17 Claims, 52 Drawing Sheets

(58) Field of Classification Search
USPC .................. 341/144, 155, 118, 120, 169
See application file for complete search history.

(56) References Cited

U.S. PATENT DOCUMENTS

| | | |
|---|---|---|
| 2009/0009822 A1 | 1/2009 | Mizuguchi et al. |
| 2014/0240568 A1 | 8/2014 | Yamagata et al. |
| 2017/0078607 A1 | 3/2017 | Totsuka et al. |
| 2017/0201693 A1 | 7/2017 | Sugizaki et al. |
| 2018/0324377 A1* | 11/2018 | Zhu ..................... H03M 1/34 |

FOREIGN PATENT DOCUMENTS

| | | |
|---|---|---|
| JP | 2017-055382 A | 3/2017 |
| WO | 2007/122665 A1 | 11/2007 |
| WO | 2016/009832 A1 | 1/2016 |
| WO | 2016/013412 A1 | 1/2016 |
| WO | 2016/136448 A1 | 9/2016 |

\* cited by examiner

DAC CIRCUIT, SOLID-STATE IMAGING ELEMENT, AND ELECTRONIC EQUIPMENT

CROSS REFERENCE TO RELATED APPLICATIONS

This application is a U.S. National Phase of International Patent Application No. PCT/JP2019/000874 filed on Jan. 15, 2019, which claims priority benefit of Japanese Patent Application No. JP 2018-012704 filed in the Japan Patent Office on Jan. 29, 2018. Each of the above-referenced applications is hereby incorporated herein by reference in its entirety.

TECHNICAL FIELD

The present technology relates to a DAC circuit, a solid-state imaging element, and electronic equipment, and particularly to a DAC circuit, a solid-state imaging element, and electronic equipment that can be achieved with a small-scale circuit configuration.

BACKGROUND ART

There is an image sensor including photoelectric conversion elements arranged in an array and an AD conversion circuit for digitizing one output selected from several photoelectric conversion elements. As the number of photoelectric conversion elements allocated to one AD conversion circuit decreases, the imaging frame rate of the image sensor increases, the in-plane skew of the image acquisition timing decreases, and an image with high synchronism can be obtained. For this reason, it is common to provide AD conversion circuits that are the same as the number of columns of the photoelectric conversion element array or a multiple thereof. In these cases, the number of photoelectric conversion elements is several hundreds to several thousands. In configuring a high-resolution image sensor by reducing the number of photoelectric conversion elements allocated to one AD conversion circuit, the number of integrated AD conversion circuits becomes enormous, and the area or power consumption per AD conversion circuit are subject to strict restrictions.

Thus, for example, Patent Documents 1 and 2 disclose an AD conversion circuit that achieves a small area and power saving. With this AD conversion circuit, a high-resolution image sensor having one AD conversion circuit for every one or several photoelectric conversion elements becomes possible.

CITATION LIST

Patent Document

Patent Document 1: WO 2016/009832 A
Patent Document 2: WO 2016/136448 A

SUMMARY OF THE INVENTION

Problems to be Solved by the Invention

In addition to achieving an AD conversion circuit with a small area and power saving, it is desirable that a DAC circuit that generates a ramp signal to be supplied to the AD conversion circuit is also achieved with a small-scale circuit.

The present technology has been made in view of such circumstances and enables achievement of a DAC circuit with a small-scale circuit configuration.

Solutions to Problems

A DAC circuit according to a first aspect of the present technology includes: a ramp DAC that generates a ramp signal that changes in voltage with a constant time gradient; an injection DAC that outputs a predetermined voltage during a reset period for resetting a comparison target voltage to be compared with the ramp signal; and an adding circuit that adds an output of the ramp DAC and an output of the injection DAC and outputs the outputs to a comparison circuit as a comparison reference voltage.

A solid-state imaging element according to a second aspect of the present technology includes: a DAC circuit including: a ramp DAC that generates a ramp signal that changes in voltage with a constant time gradient; an injection DAC that outputs a predetermined voltage during a reset period for resetting a comparison target voltage to be compared with the ramp signal; and an adding circuit that adds an output of the ramp DAC and an output of the injection DAC and outputs the outputs to a comparison circuit as a comparison reference voltage.

Electronic equipment according to a third aspect of the present technology includes: a solid-state imaging element including a DAC circuit including: a ramp DAC that generates a ramp signal that changes in voltage with a constant time gradient; an injection DAC that outputs a predetermined voltage during a reset period for resetting a comparison target voltage to be compared with the ramp signal; and an adding circuit that adds an output of the ramp DAC and an output of the injection DAC and outputs the outputs to a comparison circuit as a comparison reference voltage.

According to the first to third aspects of the present technology, in the DAC circuit, the ramp signal that changes in voltage with a constant time gradient is generated by the ramp DAC; the predetermined voltage is output by the injection DAC during a reset period for resetting the comparison target voltage to be compared with the ramp signal; and the output of the ramp DAC and the output of the injection DAC are added by the adding circuit and the outputs are output to the comparison circuit as the comparison reference voltage.

The DAC circuit, the solid-state imaging element, and the electronic equipment may be independent apparatuses or may be a module incorporated in another apparatus.

Effects of the Invention

According to the first to third aspects of the present technology, it can be achieved with a small-scale circuit configuration.

Note that effects described herein are not necessarily limited, but may also be any of those described in the present disclosure.

MODE FOR CARRYING OUT THE INVENTION

Figure 1:
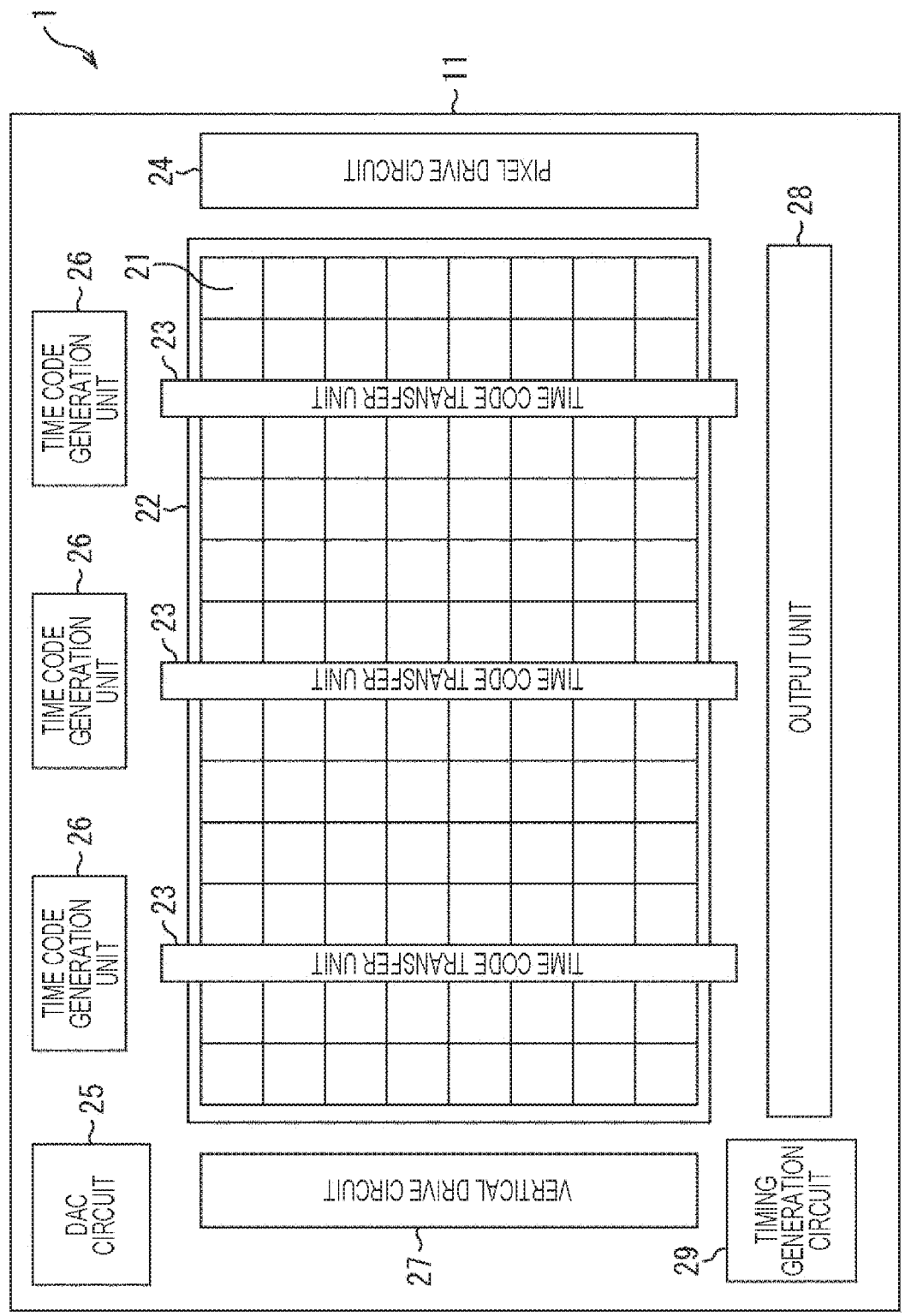
FIG. 1 is a diagram illustrating a schematic configuration of a solid-state imaging element to which the present technology is applied.

Modes for carrying out the present technology (hereinafter, the embodiments) are described below. Note that a description will be presented in the following order.

1. Schematic configuration example of solid-state imaging element
2. Detailed configuration example of the pixel
3. Configuration example of the comparison circuit
4. Detailed configuration example of the pixel circuit
5. Regarding feedthrough of FD direct-coupled comparator
6. Timing chart of AD conversion operation
7. First embodiment of DAC circuit
8. Variation example of the first embodiment
9. Variation example of pixel circuit
10. Second embodiment of DAC circuit
11. Third embodiment of DAC circuit
12. Fourth embodiment of DAC circuit
13. Detailed configuration of timing generation circuit
14. Fifth Embodiment of DAC circuit 15. Control variation example of DAC circuit of third embodiment
16. Acquisition of P-phase data by light-shielded pixel
17. Other detailed configuration of timing generation circuit
18. Sixth embodiment of DAC circuit
19. Seventh embodiment of DAC circuit
20. Examples of application to electronic equipment
21. Application examples to mobile objects

1. Schematic Configuration Example of Solid-State Imaging Element

FIG. 1 illustrates a schematic configuration of a solid-state imaging element according to the present disclosure.

A solid-state imaging element 1 in FIG. 1 includes a pixel array unit 22 in which pixels 21 are arranged in a two-dimensional array pattern on a semiconductor substrate 11 using, for example, silicon (Si) as a semiconductor. The pixel array unit 22 is also provided with time code transfer units 23 that transfer a time code generated by time code generation units 26 to each pixel 21. Then, around the pixel array unit 22 on the semiconductor substrate 11, a pixel drive circuit 24, a D/A converter (DAC) circuit 25, the time code generation units 26, a vertical drive circuit 27, an output unit 28, and a timing generation circuit 29 are formed.

As will be described later with reference to FIG. 2, each of the pixels 21 arranged in a two-dimensional array pattern is provided with a pixel circuit 41 and an AD conversion circuit (ADC) 42. The pixel 21 generates a charge signal corresponding to the amount of light received by a photoelectric conversion element in the pixel, converts it into a digital pixel signal SIG, and outputs the pixel signal SIG.

The pixel drive circuit 24 drives the pixel circuit 41 (FIG. 2) in the pixel 21. The DAC circuit 25 generates the reference signal REF, which is a slope signal whose level (voltage) monotonously decreases with time, and supplies it to each pixel 21. The time code generation unit 26 generates a time code used when each pixel 21 converts the analog pixel signal SIG into a digital signal (AD conversion), and supplies the time code to the corresponding time code transfer unit 23. A plurality of time code generation units 26 is provided with respect to the pixel array unit 22, and as many time code transfer units 23 as the number corresponding to the time code generation units 26 are provided in the pixel array unit 22. That is, the time code generation unit 26 and the time code transfer unit 23 that transfers the time code generated thereby correspond one-to-one.

The vertical drive circuit 27 performs control to cause the output unit 28 to output the digital pixel signal SIG generated in the pixel 21 in a predetermined order on the basis of a timing signal supplied from the timing generation circuit 29. The digital pixel signal SIG output from the pixel 21 is output from the output unit 28 to the outside of the solid-state imaging element 1. The output unit 28 performs predetermined digital signal processing such as black level correction processing for correcting the black level, correlated double sampling (CDS) processing, or the like, as necessary, and then outputs the resulting signal to the outside.

The timing generation circuit 29 includes a timing generator or the like that generates various timing signals, and supplies the generated various timing signals to the pixel drive circuit 24, the DAC circuit 25, the vertical drive circuit 27, and the like.

The solid-state imaging element 1 is configured as described above. Note that, in FIG. 1, as described above, it has been described that all the circuits constituting the solid-state imaging element 1 are formed on one semiconductor substrate 11. However, the circuits constituting the solid-state imaging element 1 may be separately arranged on a plurality of semiconductor substrates 11.

2. Detailed Configuration Example of the Pixel

Figure 2:
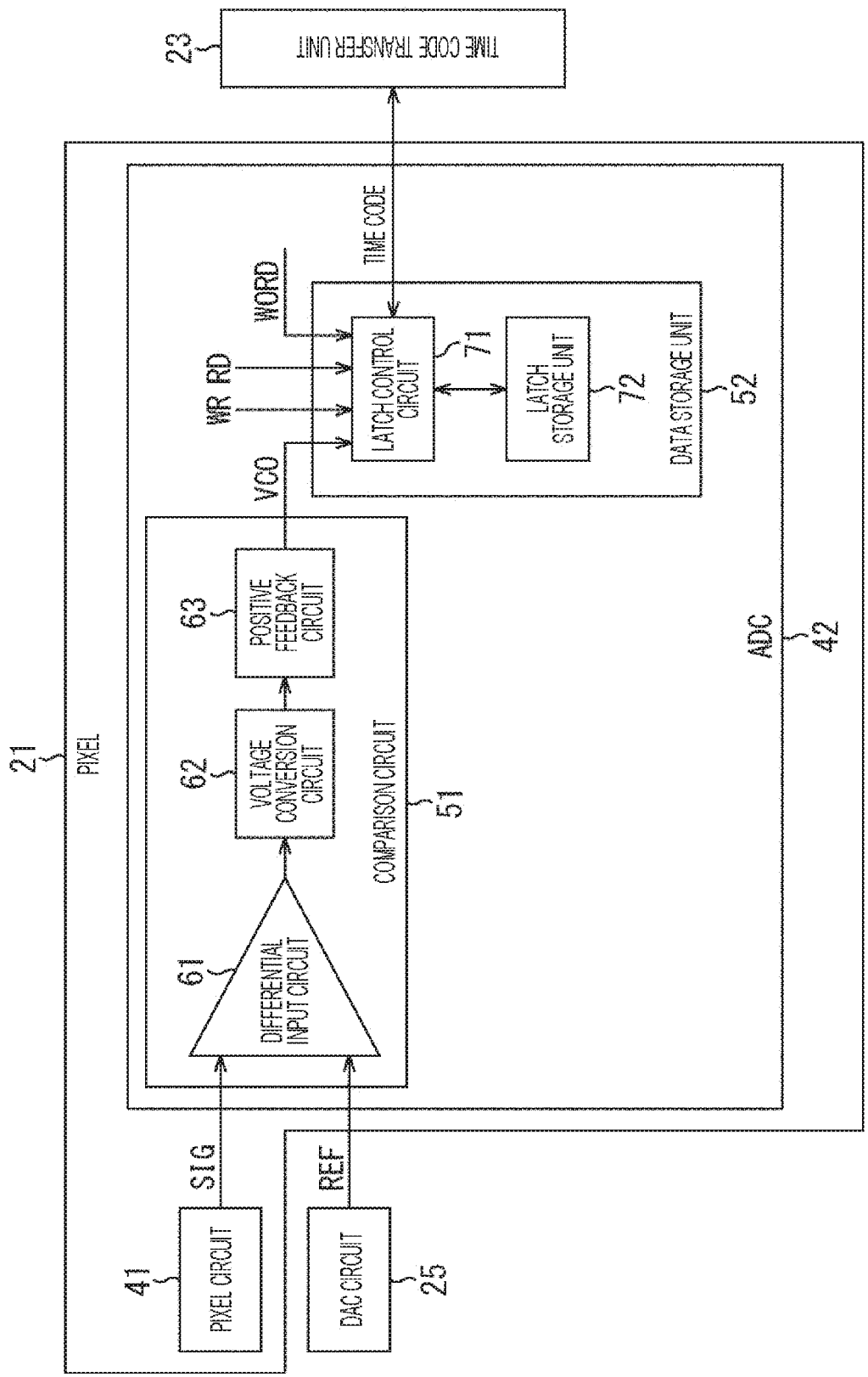
FIG. 2 is a block diagram illustrating a detailed configuration example of a pixel.

FIG. 2 is a block diagram illustrating a detailed configuration example of the pixel 21.

The pixel 21 includes the pixel circuit 41 and the AD conversion circuit (ADC) 42.

The pixel circuit 41 outputs a charge signal corresponding to the received light amount to the AD conversion circuit 42 as an analog pixel signal SIG. The AD conversion circuit 42 converts the analog pixel signal SIG supplied from the pixel circuit 41 into a digital signal.

The AD conversion circuit 42 includes a comparison circuit 51 and a data storage unit 52.

The comparison circuit 51 compares the reference signal REF supplied from the DAC circuit 25 with the pixel signal SIG, and outputs an output signal VCO as a comparison result signal indicative of a comparison result. The reference signal REF is a comparison reference voltage signal that is compared and referenced with the pixel signal SIG, and the pixel signal SIG is a comparison target voltage signal that is compared with the reference signal REF. The comparison circuit 51 inverts the output signal VCO when the reference signal REF and the pixel signal SIG are the same (voltage). The DAC circuit 25 may supply the reference signal REF to the plurality of AD conversion circuits 42, or may be provided in a one-to-one correspondence with the AD conversion circuits 42 and supply the reference signal REF to one AD conversion circuit 42.

The comparison circuit 51 includes a differential input circuit 61, a voltage conversion circuit 62, and a positive feedback circuit (PFB) 63. Details will be described later with reference to FIG. 3.

In addition to receiving the output signal VCO from the comparison circuit 51, the data storage unit 52 receives a WR signal indicating a pixel signal writing operation and an RD signal indicating a pixel signal reading operation from the vertical drive circuit 27, and a WORD signal for controlling the read timing of the pixel 21 during a read operation of the pixel signal from the vertical drive circuit 27. Furthermore, the time code generated by the time code generation unit 26 is also supplied via the time code transfer unit 23.

The data storage unit 52 includes a latch control circuit 71 that controls a write operation and a read operation for a time code on the basis of the WR signal and the RD signal, and a latch storage unit 72 that stores the time code.

In the time code writing operation, the latch control circuit 71 causes the latch storage unit 72 to store the time code supplied from the time code transfer unit 23 and updated every unit time while the Hi (High) output signal VCO is input from the comparison circuit 51. Then, when the reference signal REF and the pixel signal SIG are the same (voltage) and the output signal VCO supplied from the comparison circuit 51 is inverted to Lo (Low), by a latch control circuit 71, writing (updating) of the supplied time code is stopped, and the time code stored last in the latch storage unit 72 is retained in the latch storage unit 72. The time code stored in the latch storage unit 72 represents the time when the pixel signal SIG and the reference signal REF are equal, and data indicating that the pixel signal SIG was the reference voltage at that time, i.e., a digitized light amount value.

After the sweep of the reference signal REF ends, and the time code is stored in the latch storage units 72 of all the pixels 21 in the pixel array unit 22, the operation of the pixel 21 is changed from the write operation to the read operation.

In the time code read operation, the latch control circuit 71 outputs the time code (digital pixel signal SIG) stored in the latch storage unit 72 to the time code transfer unit 23 when the pixel 21 has reached its own read timing on the basis of the WORD signal that controls the read timing. The time code transfer unit 23 sequentially transfers the supplied time code in the column direction (vertical direction) and supplies it to the output unit 28.

3. Configuration Example of the Comparison Circuit

Figure 3:
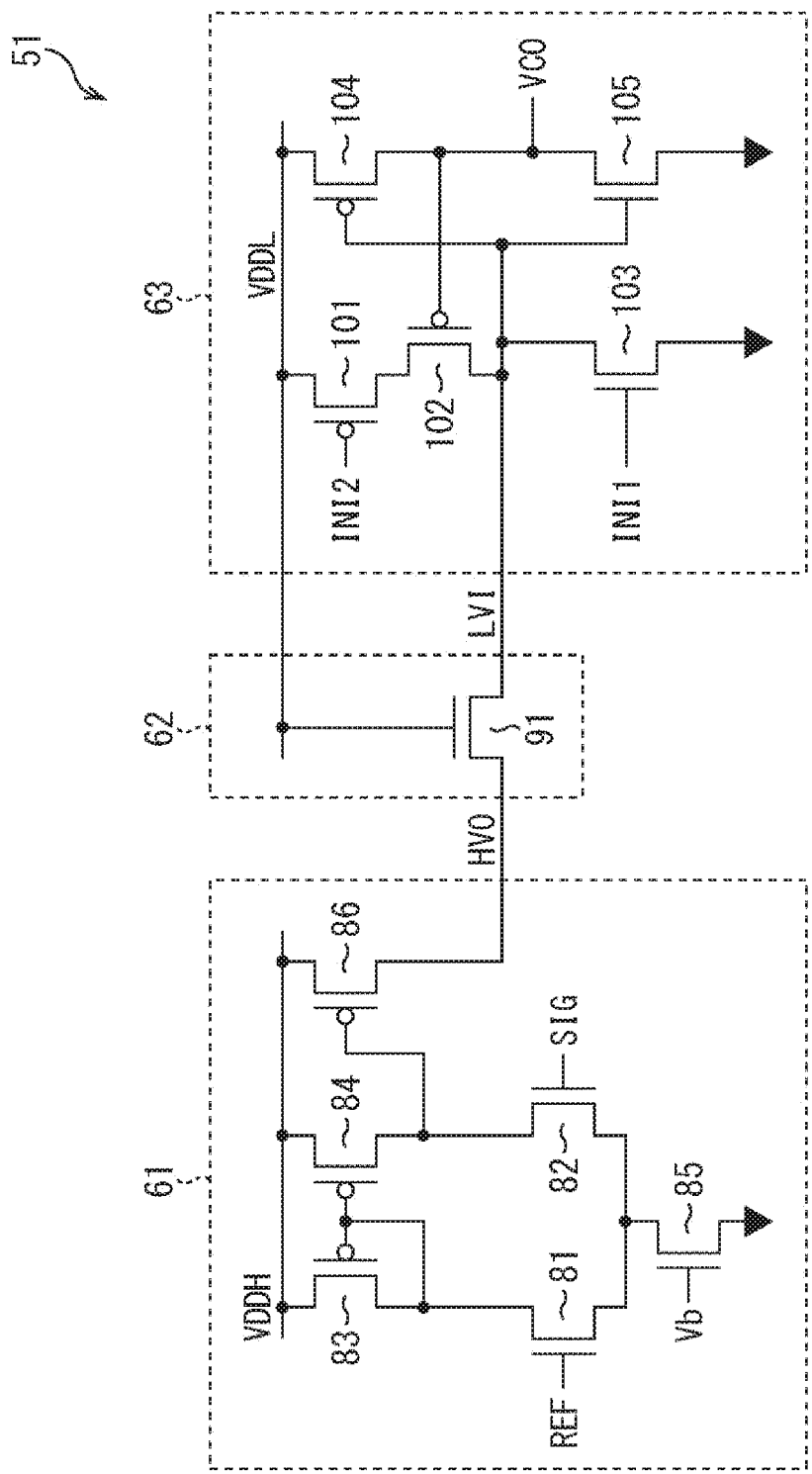
FIG. 3 is a circuit diagram illustrating a detailed configuration of a comparison circuit.

FIG. 3 is a circuit diagram illustrating a detailed configuration of the differential input circuit 61, the voltage conversion circuit 62, and the positive feedback circuit 63 that constitute the comparison circuit 51.

The differential input circuit 61 compares the pixel signal SIG output from the pixel circuit 41 in the pixel 21 with the reference signal REF output from the DAC circuit 25, and outputs a predetermined signal (current) when the pixel signal SIG is higher than the reference signal REF.

The differential input circuit 61 includes transistors 81 and 82 forming a differential pair, transistors 83 and 84 constituting a current mirror, a transistor 85 as a constant current source for supplying current IB corresponding to current source control bias Vb, and a transistor 86 for outputting an output signal HVO of the differential input circuit 61.

The transistors 81, 82, and 85 are constituted by negative channel MOS (NMOS) transistors, and the transistors 83, 84, and 86 are constituted by positive channel MOS (PMOS) transistors.

Of the transistors 81 and 82 forming the differential pair, the reference signal REF output from the DAC circuit 25 is input to the gate of the transistor 81, and the pixel signal SIG output from the pixel circuit 41 in the pixel 21 is input to the gate of the transistor 82. The sources of the transistors 81 and 82 are connected to the drain of the transistor 85, and the source of the transistor 85 is connected to a predetermined voltage lower than the first power supply voltage VDDH and the second power supply voltage VDDL, and in the present embodiment is, for example, GND.

The drain of the transistor 81 is connected to the gates of the transistors 83 and 84 constituting the current mirror circuit and the drain of the transistor 83, and the drain of the transistor 82 is connected to the drain of the transistor 84 and the gate of the transistor 86. The sources of the transistors 83, 84, and 86 are connected to a first power supply voltage VDDH.

The voltage conversion circuit 62 includes, for example, an NMOS transistor 91. The drain of the transistor 91 is connected to the drain of the transistor 86 of the differential input circuit 61, the source of the transistor 91 is connected to a predetermined connection point in the positive feedback circuit 63, and the gate of the transistor 91 is connected to second power supply voltage VDDL.

The transistors 81 to 86 that constitute the differential input circuit 61 are circuits that operate at a high voltage up to the first power supply voltage VDDH, and the positive feedback circuit 63 is a circuit that operates at a second power supply voltage VDDL that is lower than the first power supply voltage VDDH. The voltage conversion circuit 62 converts the output signal HVO input from the differential input circuit 61 into a low voltage signal (conversion signal) LVI that allows the positive feedback circuit 63 to operate, and supplies it to the positive feedback circuit 63.

The positive feedback circuit 63 outputs a comparison result signal that is inverted when the pixel signal SIG is higher than the reference signal REF on the basis of the conversion signal LVI obtained by converting the output signal HVO from the differential input circuit 61 into a signal corresponding to the second power supply voltage VDDL. Furthermore, the positive feedback circuit 63 increases the transition speed when the output signal VCO output as the comparison result signal is inverted.

The positive feedback circuit 63 includes five transistors 101 to 105. Here, the transistors 101, 102, and 104, are configured by PMOS transistors, and the transistors 103 and 105 are configured by NMOS transistors.

The source of the transistor 91 which is the output terminal of the voltage conversion circuit 62 is connected to the drains of the transistors 102 and 103 and the gates of the transistors 104 and 105. The sources of the transistors 101 and 104 are connected to the second power supply voltage VDDL, the drain of the transistor 101 is connected to the source of the transistor 102, and the gate of the transistor 102 is connected to the drains of the transistors 104 and 105 that are also the output terminals of the positive feedback circuit 63. The sources of the transistors 103 and 105 are connected to GND. An initialization signal INI2 is supplied to the transistor 101. An initialization signal INI1 is supplied to the gate of the transistor 103.

The transistors 104 and 105 constitute an inverter circuit, and a connection point between their drains is an output terminal from which the comparison circuit 51 outputs the output signal VCO.

The operation of the comparison circuit 51 configured as described above will be described.

First, the reference signal REF is set to a voltage higher than the pixel signals SIG of all the pixels 21, the initialization signals INI1 and INI2 are set to Hi, and the comparison circuit 51 is initialized. Note that there is a slight time difference from when the initialization signal INI1 is set to Hi to when the initialization signal INI2 is set to Hi.

More specifically, the reference signal REF is applied to the gate of the transistor 81, and the pixel signal SIG is applied to the gate of the transistor 82. When the voltage of the reference signal REF (hereinafter, also referred to as REF voltage) is higher than the voltage of the pixel signal SIG, most of the current output from the transistor 85 serving as a current source flows to the transistor 83, which is diode-connected via the transistor 81. The channel resistance of the transistor 84 having a common gate with the transistor 83 becomes sufficiently low, and the gate of the transistor 86 is kept substantially at the level of the first power supply voltage VDDH, and the transistor 86 is cut off. Therefore, even if the transistor 91 of the voltage conversion circuit 62 is conductive, the positive feedback circuit 63, which is a charging circuit, does not charge the conversion signal LVI. On the other hand, since the Hi signal is supplied as the initialization signal INI1, the transistor 103 is conductive, and the positive feedback circuit 63 discharges the conversion signal LVI. Furthermore, since the transistor 101 is cut off, the positive feedback circuit 63 does not charge the conversion signal LVI via the transistor 102. As a result, the conversion signal LVI is discharged to the GND level, the positive feedback circuit 63 outputs the Hi output signal VCO by the transistors 104 and 105 constituting the inverter, and the comparison circuit 51 is initialized.

After the initialization, the initialization signals INI1 and INI2 are set to Lo, and the sweep of the reference signal REF is started.

In a period where the reference signal REF is higher in voltage than the pixel signal SIG, the transistor 86 is turned off and cut off, and the output signal VCO becomes a Hi signal, so that the transistor 102 is turned off and cut off. The transistor 103 is also cut off because the initialization signal INI1 is Lo. The conversion signal LVI maintains the GND level in the high impedance state, and the Hi output signal VCO is output.

When the reference signal REF becomes lower than the pixel signal SIG, the output current of the transistor 85 as the current source stops flowing through the transistor 81, the gate potentials of the transistors 83 and 84 rise, and the channel resistance of the transistor 84 increases. The current flowing therethrough through the transistor 82 causes a voltage drop to lower the gate potential of the transistor 86, and the transistor 91 becomes conductive. The output signal HVO output from the transistor 86 is converted into a conversion signal LVI by the transistor 91 of the voltage conversion circuit 62 and supplied to the positive feedback circuit 63. The voltage conversion circuit 62 as a charging circuit charges the conversion signal LVI, and brings the potential from the GND level close to the second power supply voltage VDDL.

Then, when the voltage of the conversion signal LVI exceeds a threshold voltage of the inverter including the transistors 104 and 105, the output signal VCO becomes Lo, and the transistor 102 becomes conductive. The transistor 101 is also conductive because the initialization signal INI2 of Lo is applied, and the positive feedback circuit 63 rapidly charges the conversion signal LVI via the transistors 101 and 102 and lifts the potential to the second power supply voltage VDDL at once.

Since the second power supply voltage VDDL is applied to the gate of the transistor 91 of the voltage conversion circuit 62, the transistor 91 is cut off when the voltage of the conversion signal LVI reaches a voltage value lower than the second power supply voltage VDDL by a transistor threshold. Even if the transistor 86 remains conductive, the conversion signal LVI is not charged any more, and the voltage conversion circuit 62 also functions as a voltage clamp circuit.

The charging of the conversion signal LVI due to the conduction of the transistor 102 is a positive feedback operation that starts when the conversion signal LVI has risen to the inverter threshold value, and accelerates its movement. In the transistor 85, which is a current source of the differential input circuit 61, because the number of circuits that operate in parallel and simultaneously in the solid-state imaging element 1 is enormous, the current per circuit is set to a very small current. Moreover, the reference signal REF is swept very slowly because the voltage that changes in the unit time at which the time code switches becomes an LSB step of AD conversion. Therefore, the change in the gate potential of the transistor 86 is also slow, and the change in the output current of the transistor 86 driven thereby is also slow. However, by applying positive feedback to the conversion signal LVI charged with the output current in a subsequent stage, the output signal VCO can transition sufficiently quickly. Desirably, the transition time of the output signal VCO is a fraction of the unit time of the time code, 1 ns or less in a typical example. The comparison circuit 51 of the present disclosure can achieve this output transition time only by setting a small current of, for example, 0.01 uA in the transistor 85, which is the current source.

4. Detailed Configuration Example of the Pixel Circuit

A detailed configuration of the pixel circuit 41 will be described with reference to FIG. 4.

Figure 4:
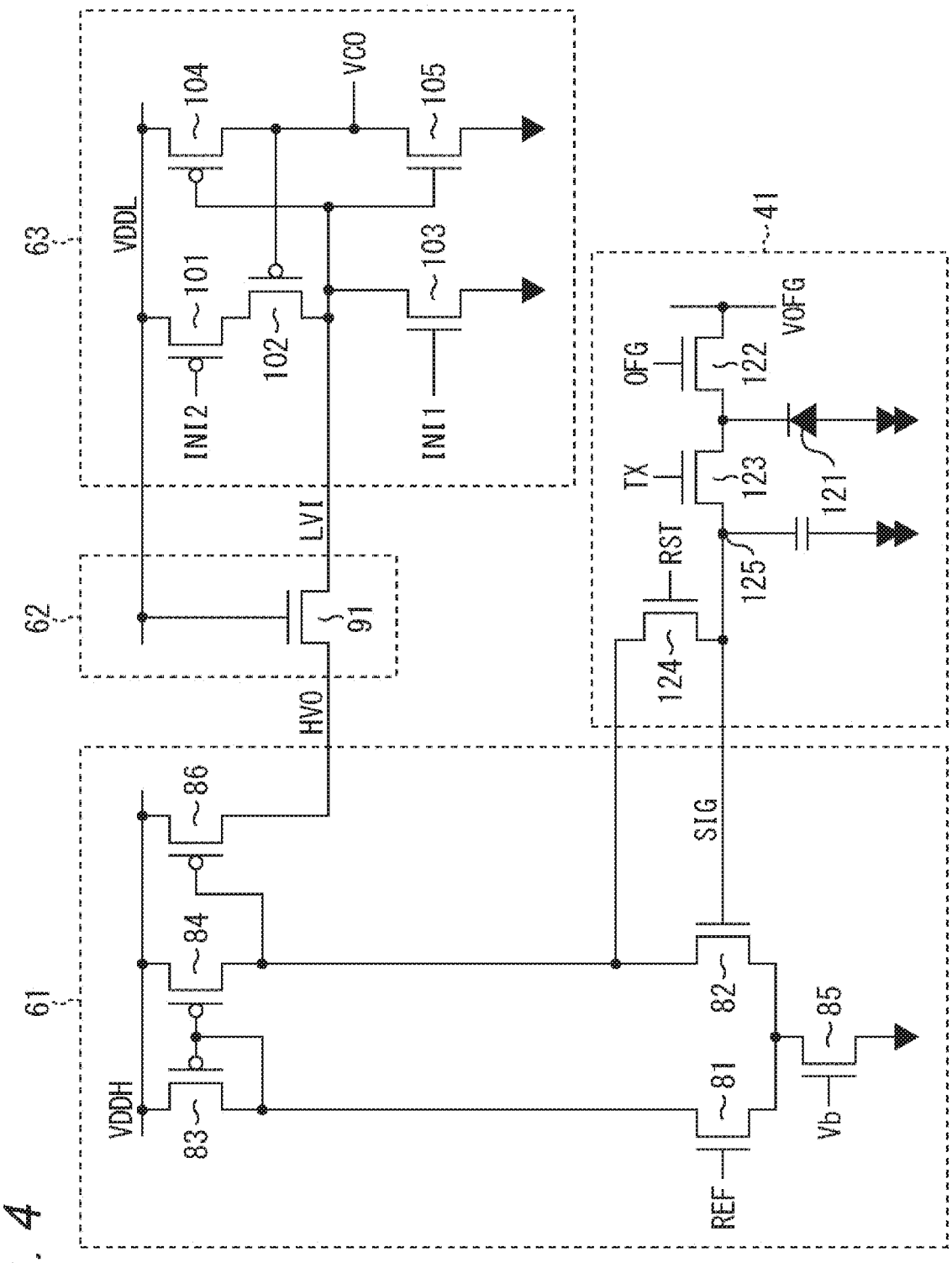
FIG. 4 is a diagram illustrating a detailed configuration of a pixel circuit.

FIG. 4 is a circuit diagram illustrating details of the pixel circuit 41 in addition to the comparison circuit 51 illustrated in FIG. 3.

The pixel circuit 41 includes a photoelectric conversion element 121 including a photodiode (PD) and the like, a discharge transistor 122, a transfer transistor 123, a reset transistor 124, and an FD (floating diffusion layer) 125.

The discharge transistor 122 is used in a case where the exposure period is adjusted. Specifically, when the exposure period is to be started at an arbitrary timing, a Hi OFG signal is supplied to the gate of the discharge transistor 122, the discharge transistor 122 is turned on, and the charges accumulated in the photoelectric conversion element 121 up to then are discharged. As a result, the exposure period starts after the discharge transistor 122 is turned off.

The transfer transistor 123 transfers the charge generated by the photoelectric conversion element 121 to the FD 125. The reset transistor 124 resets the charge held in the FD 125, that is, the voltage of the FD 125 (FD voltage). The FD 125 is connected to the gate of the transistor 82 of the differential input circuit 61, and the voltage of the FD 125 is supplied to the gate of the transistor 82 as a pixel signal SIG. The transistor 82 of the differential input circuit 61 also functions as an amplification transistor of the pixel circuit 41.

The source of the reset transistor 124 is connected to the gate of the transistor 82 of the differential input circuit 61 and the FD 125, and the drain of the reset transistor 124 is connected to the drain of the transistor 82. Therefore, there is no fixed reset voltage for resetting the voltage of the FD 125. This is because, by controlling the circuit state of the differential input circuit 61, a reset voltage for resetting the voltage of the FD 125 can be arbitrarily set using the reference signal REF.

Note that a configuration in which the AD conversion circuit 42 is supplied by a plurality of pixels 21 is also possible.

Figure 5:
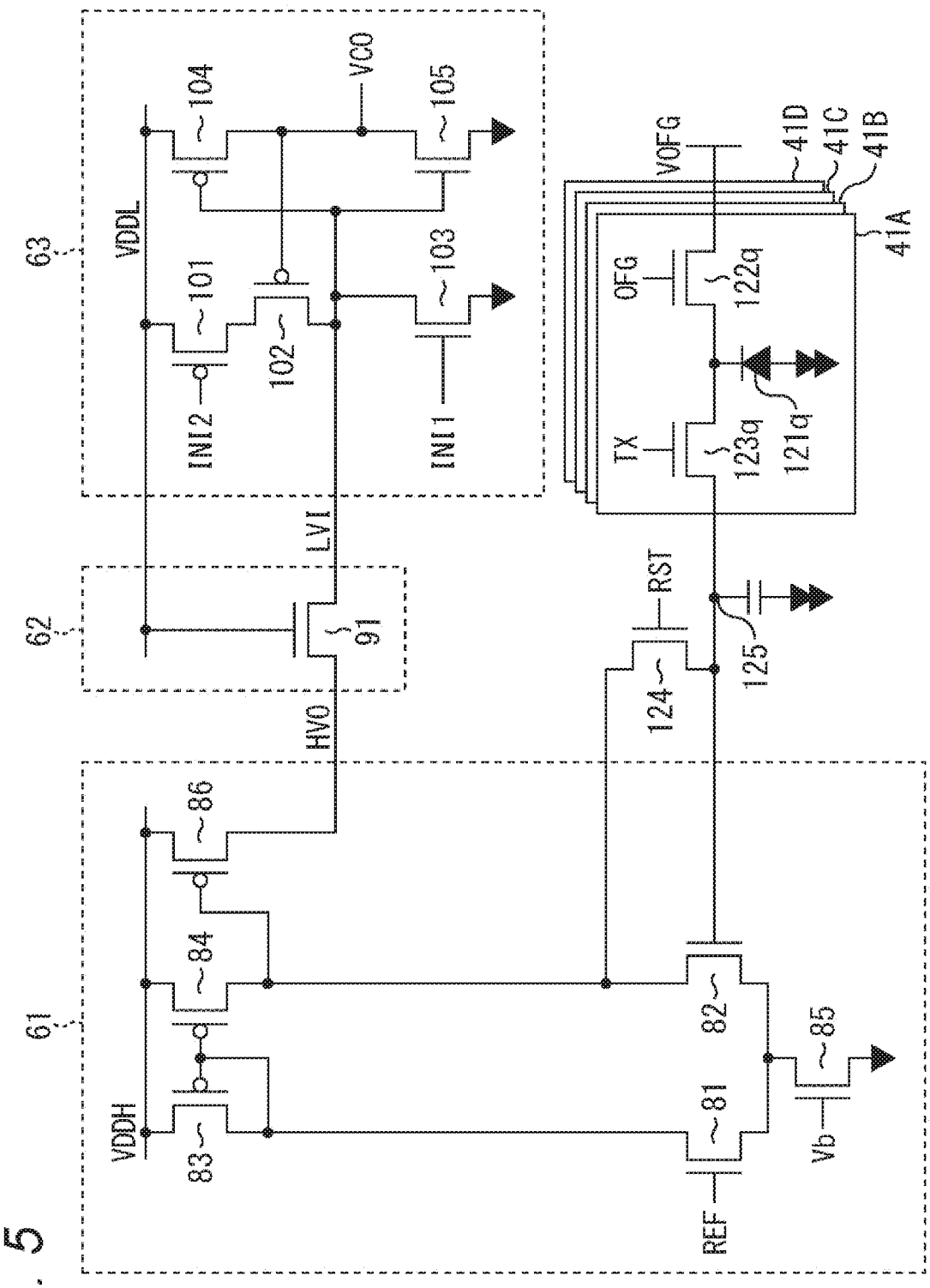
FIG. 5 is a diagram illustrating a detailed configuration of a pixel circuit in a case where an AD conversion circuit is shared.

For example, when one AD conversion circuit 42 is shared by the four pixels 21A to 21D, as illustrated in FIG. 5, the four pixels 21A to 21D are provided with pixel circuits 41A to 41D, respectively. The pixel circuits 41A to 41D are individually provided with a photoelectric conversion element $121q$, a discharge transistor $122q$, and a transfer transistor $123q$. On the other hand, the reset transistor 124 and the FD 125 are shared by the four pixels 21A to 21D.

5. Regarding Feedthrough of FD Direct-Coupled Comparator

As illustrated in FIGS. 4 and 5, in the differential input circuit 61, the voltage (comparison target voltage) of the FD 125 is DC-directly coupled to the gate of the transistor 82 of the source common MOS differential pair, which is one input of the differential input circuit 61, and the REF voltage is DC-directly coupled to the gate of the transistor 81 of the source common MOS differential pair, which is the other input, and the voltage of the FD 125 is compared with the REF voltage. Such a configuration of the differential input circuit 61 is also called an FD direct-coupled comparator 61 or simply a comparator 61.

The transistors 81 and 82 of this differential pair are configured by MOS transistors having a very small area due to the area limitation of the AD conversion circuit 42. Therefore, the differential input conversion offset due to characteristic variations of the MOS transistors is large. To cancel this offset, the FD 125 is reset not at a fixed voltage but at the output of a differential amplifier configured by a differential pair and an active load. Therefore, in the reset operation, the voltage of the FD 125 is set to the sum (Vrst+Vofst) of the reset voltage Vrst of the reference signal REF and the differential offset voltage Vofst. In the conversion sequence after the reset performed with this as a starting point, the differential offset voltage Vofst is almost canceled, and the comparator output inversion time before the charge transfer, that is, the P-phase data can be prevented from being distributed over a wide range due to offset variations.

However, the reset operation is accompanied by a phenomenon called feedthrough. The voltage of the FD 125 while the high voltage is applied to the gate of the reset transistor 124 is the sum (Vrst+Vofst) of the reset voltage Vrst and the differential offset voltage Vofst. When the gate of the reset transistor 124 transitions to a low voltage to end the reset operation, the voltage of FD 125 transitions to a voltage (Vrst+Vofst−Vft) lower than the sum (Vrst+Vofst) of the reset voltage Vrst and the differential offset voltage Vofst due to feedthrough. The feedthrough drop voltage Vft is generated when a part of the channel charge accumulated at the gate interface of the reset transistor 124 moves to the FD 125 and when the voltage change of the gate signal of the reset transistor 124 reaches the FD 125 by coupling due to the parasitic capacitance. The drop voltage Vft is a function of the circuit element size, the amplifier circuit bias, the gate amplitude, the drop speed, the temperature, and the like of the reset transistor 124, and varies.

The maximum charge amount that can be transferred from the photoelectric conversion element 121 to the FD 125, that is, the saturated charge, is determined by the voltage (Vrst+Vofst−Vft) of the FD 125 after the reset operation. Furthermore, the dark current that flows into the FD 125 during the AD conversion operation and becomes noise in the AD conversion also depends on this voltage (Vrst+Vofst−Vft). Therefore, the voltage (Vrst+Vofst−Vft) of the FD 125 after the reset operation is a very important parameter for the AD conversion operation.

Furthermore, if there is an unpredictable variation in the voltage of the FD 125 after the reset operation, the voltage range (sweep range) for RAMP sweeping the REF voltage in the AD conversion operation needs to be increased, which leads to an increase in AD conversion time. Therefore, it is desirable that the voltage (Vrst+Vofst−Vft) of the FD 125 after the reset operation is controlled as accurately as possible to an expected voltage.

The differential offset voltage Vofst is a voltage that varies uniquely in each AD conversion circuit, but the feedthrough drop voltage Vft is approximately the same value in all the AD conversion circuits 42 integrated in one solid-state imaging element 1, and its absolute value is orders of magnitude larger than the differential offset voltage Vofst. Therefore, if the DAC circuit 25 that supplies the REF voltage to all the AD conversion circuits 42 or by some sections generates the desired reset voltage Vrst, the FD voltage after the reset operation (the reset FD voltage) can be controlled to almost the expected voltage. The DAC circuit 25 of the solid-state imaging element 1 is configured to control the reset FD voltage to an expected voltage and generate an REF signal that can unfailingly perform AD conversion on the distributed reset FD voltage.

6. Timing Chart of AD Conversion Operation

First, a typical AD conversion operation by the FD direct-coupled comparator will be described with reference to the timing chart of FIG. 6.

Figure 6:
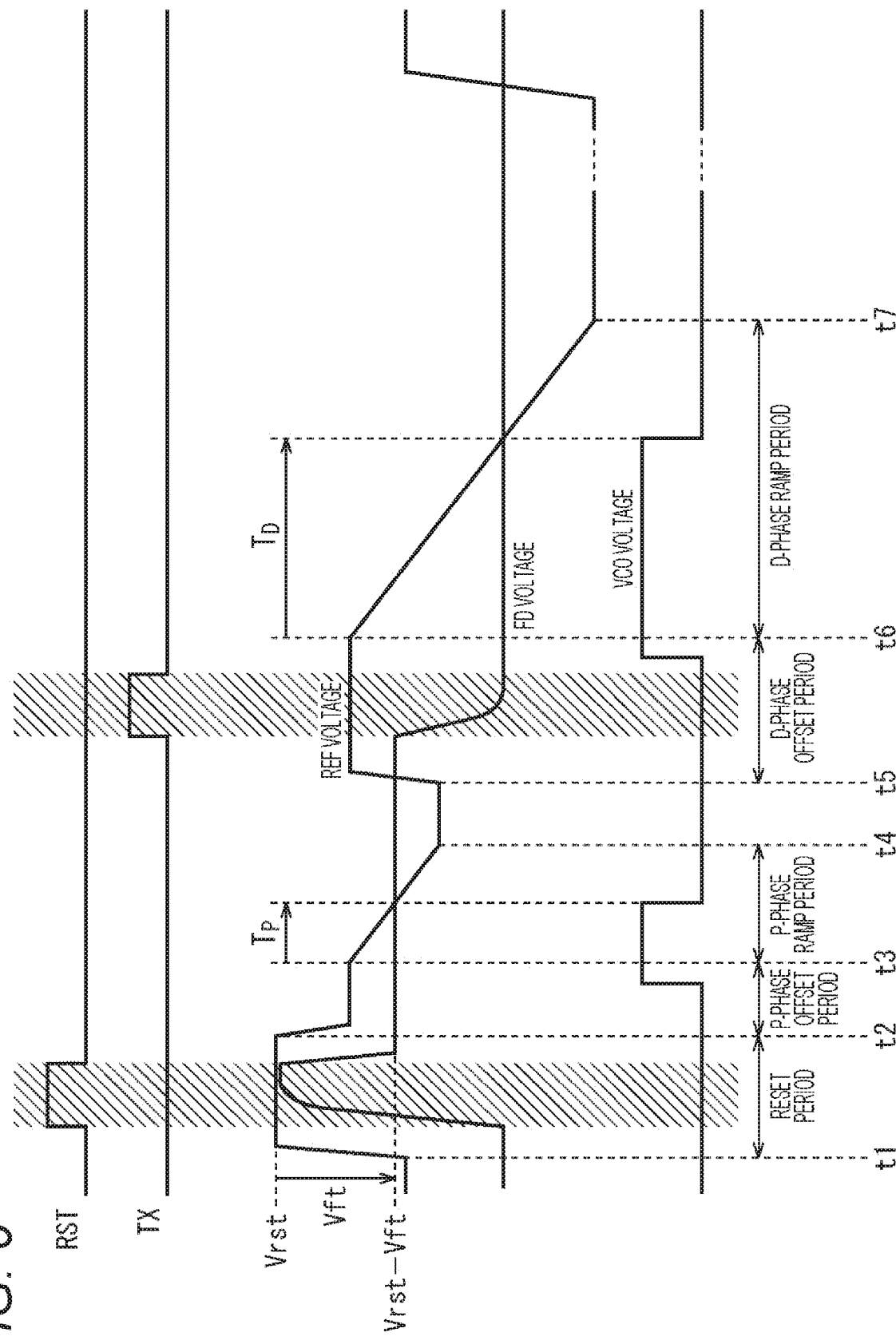
FIG. 6 is a diagram explaining a typical AD conversion operation by a FD direct-coupled comparator.

Note that in the description of FIG. 6, for the sake of easy understanding, reference numerals of respective units of the solid-state imaging element 1 are added, and the solid-state imaging element 1 is described as performing a typical AD conversion operation. Furthermore, in FIG. 6, the description will be provided assuming that there is no differential offset voltage Vofst.

A period from the first time t1 to time t2 is a reset period for resetting the voltage of the FD 125 (FD voltage).

In the reset period, the DAC circuit 25 outputs a fixed voltage Vrst (reset voltage Vrst) as the reference signal REF for a certain period of time. During this period, the Hi RST signal is supplied to the gate of the reset transistor 124 and the reset transistor 124 is turned on, and thus the first-stage differential circuit of the comparator 61 is in a voltage follower state, and the FD voltage becomes almost equal to the reset voltage Vrst.

The reset transistor 124 is turned to being cut off within the time during which the REF voltage maintains the reset voltage Vrst. At this time, feedthrough occurs and the FD voltage drops to (Vrst−Vft).

The period from the next time t2 to time t3 is a P-phase offset period in which the REF voltage is fixed to a potential unfailingly higher than the FD voltage prior to a next P-phase ramp period.

During the P-phase offset period, the initialization signals INI1 and INI2 are set to Hi, and the positive feedback circuit 63 is initialized. Therefore, the comparison circuit 51 is initialized, and outputs a Hi output signal VCO.

The period from the next time t3 to time t4 is a P-phase ramp period for detecting the reset level in the CDS processing. During the P-phase ramp period, the REF voltage drops at a constant time gradient and the time $T_p$ until matching the FD voltage is counted. Among the REF voltages, the REF voltage that drops at a constant time gradient is also referred to as an REF ramp waveform or a REF ramp signal.

During the P-phase ramp period, when the REF voltage drops at a constant time gradient and the REF voltage reaches the FD voltage, the output signal VCO (VCO voltage) of the AD conversion circuit 42 changes from Hi to Lo. While the output signal VCO is Hi, the latch control circuit 71 keeps taking in the time code supplied from the time code transfer unit 23, but after turning to Lo, stops writing (updating) the time code. That is, the time code at which the REF voltage reaches the FD voltage is stored in the latch storage unit 72. This time code is acquired as P-phase data indicating the reset level of the pixel in the CDS processing.

The period from the next time t5 to time t6 is a D-phase offset period in which the REF voltage is fixed to a potential unfailingly higher than the FD voltage prior to a next D-phase ramp period.

During the D-phase offset period, the DAC circuit 25 again sets the REF voltage to an unfailingly higher potential than the FD voltage. Furthermore, during the D-phase offset period, a TX signal supplied to the gate of the transfer transistor 123 is set to Hi, and the charge is transferred from the photoelectric conversion element 121 to the FD 125. Therefore, the FD voltage drops. Furthermore, the initialization signals INI1 and INI2 are set to Hi again, and the positive feedback circuit 63 is initialized again. Therefore, the comparison circuit 51 outputs the Hi output signal VCO again.

The period from the time t6 to time t7 is a D-phase ramp period for detecting a signal level in the CDS processing. During the D-phase ramp period, the REF voltage drops at a constant time gradient and the time $T_D$ until matching the FD voltage is counted.

Specifically, during the D-phase ramp period, similarly to the P-phase ramp period, when the REF voltage drops at a constant time gradient and the REF voltage reaches the FD voltage, the output signal VCO of the AD conversion circuit 42 changes from Hi to Lo, and the time code at that point of time is stored in the latch storage unit 72. This time code is acquired as D-phase data indicating the signal level of the pixel in the CDS processing. The difference between the P-phase data and the D-phase data is determined by CDS arithmetical operation, and it is an AD conversion result of the FD voltage change caused by the charge transfer.

The FD voltage (Vrst-Vft) after the reset period must be within the sweep range of the REF voltage during the P-phase ramp period. The FD voltage (Vrst-Vft) here is an average value of the FD voltage over many times, and in each AD conversion operation, a random number noise (so-called KT/C noise) caused by switching of the reset transistor 124 is superimposed. It is desirable that the FD voltage (Vrst-Vft) be equal to the P-phase ramp sweep center voltage Vpc to acquire normal P-phase data with a very high probability. That is, it is desirable that the REF voltage during reset be (Vpc+Vft).

7. First Embodiment of DAC Circuit

Figure 7:
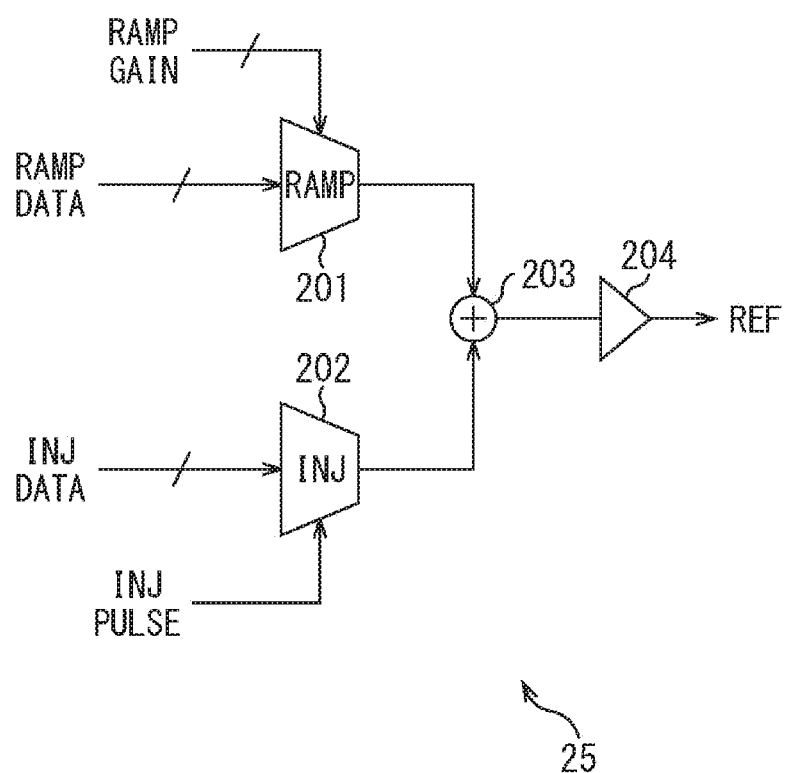
FIG. 7 is a diagram illustrating a conceptual circuit configuration of a first embodiment of a DAC circuit.

FIG. 7 illustrates a conceptual circuit configuration of the first embodiment of the DAC circuit 25.

The DAC circuit 25 includes a ramp DAC 201, an injection DAC 202, an adding circuit 203, and a current amplification circuit 204.

The ramp DAC 201 outputs an analog voltage obtained by multiplying a step voltage set by a gain setting input RAMP GAIN by a digital numerical bus by a ramp data input RAMP DATA by a digital numerical bus. Therefore, the ramp DAC 201 generates and outputs an REF ramp signal whose voltage changes at a constant time gradient during the P-phase ramp period and the D-phase ramp period.

The injection DAC 202 outputs an analog voltage obtained by multiplying the step voltage independent of the step voltage of the ramp DAC 201 by an injection data input INJ DATA by a digital numerical bus only when an injection pulse INJ PULSE is active. Therefore, the injection DAC 202 outputs a predetermined voltage during a reset period for resetting the voltage of the FD 125 before transferring the signal charge to the FD 125. Note that the step voltage of the ramp DAC 201 is set smaller than the step voltage of the injection DAC 202.

The adding circuit 203 adds the output of the ramp DAC 201 and the output of the injection DAC 202 and outputs the result. The current amplification circuit 204 current-amplifies the REF output of the adding circuit 203 and outputs the result. The current amplification circuit 204 may be omitted.

Figure 8:
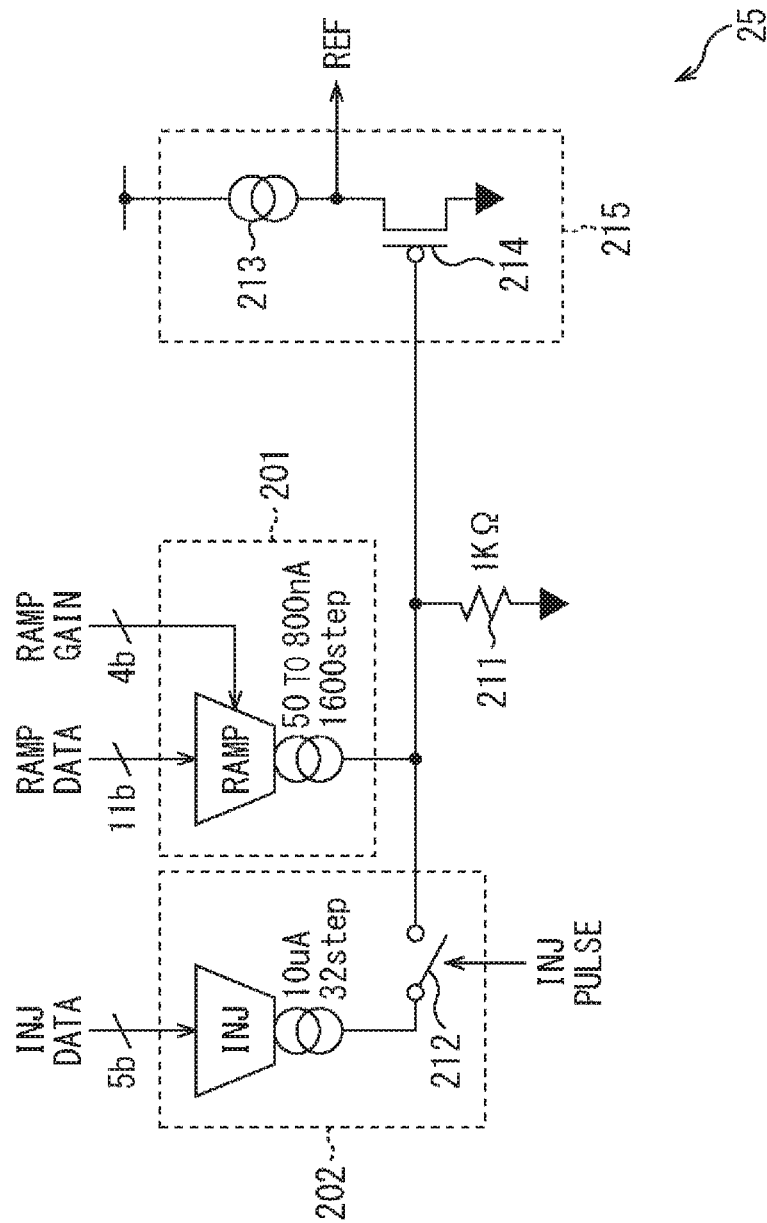
FIG. 8 is a diagram illustrating a more detailed configuration example of the DAC circuit in FIG. 7.

FIG. 8 illustrates a more detailed configuration of the DAC circuit 25 in FIG. 7.

The ramp DAC 201 and the injection DAC 202 are both current output DACs (iDACs), and their outputs are connected to a common load resistor 211, so that the output currents are added. The output of the injection DAC 202 is connected to the output of the ramp DAC 201 via a switch 212 whose connection is turned on and off on the basis of the injection pulse INJ PULSE.

The voltage generated by the product of the added current obtained by adding the current outputs of the ramp DAC 201 and the injection DAC 202 and the load resistor 211 is supplied as the reference signal REF to the FD direct-coupled comparator 61 via a source follower circuit 215 including the current source 213 and the PMOS transistor 214. The source follower circuit 215 corresponds to the current amplification circuit 204 in FIG. 7.

The ramp DAC 201 has a 4-bit gain setting input RAMP GAIN, and sets the step current to any of 50, 100, 150, . . . 800 nA according to the numerical value given thereto. The ramp data input RAMP DATA is 11-bit, and outputs a current obtained by multiplying the numerical value input here by a step current based on the gain setting input RAMP GAIN.

The injection DAC 202 is an iDAC having a 5-bit injection data input INJ DATA with a fixed step current of 10 uA, and outputs current to the load resistor 211 only when the injection pulse INJ PULSE is active.

Figure 9:
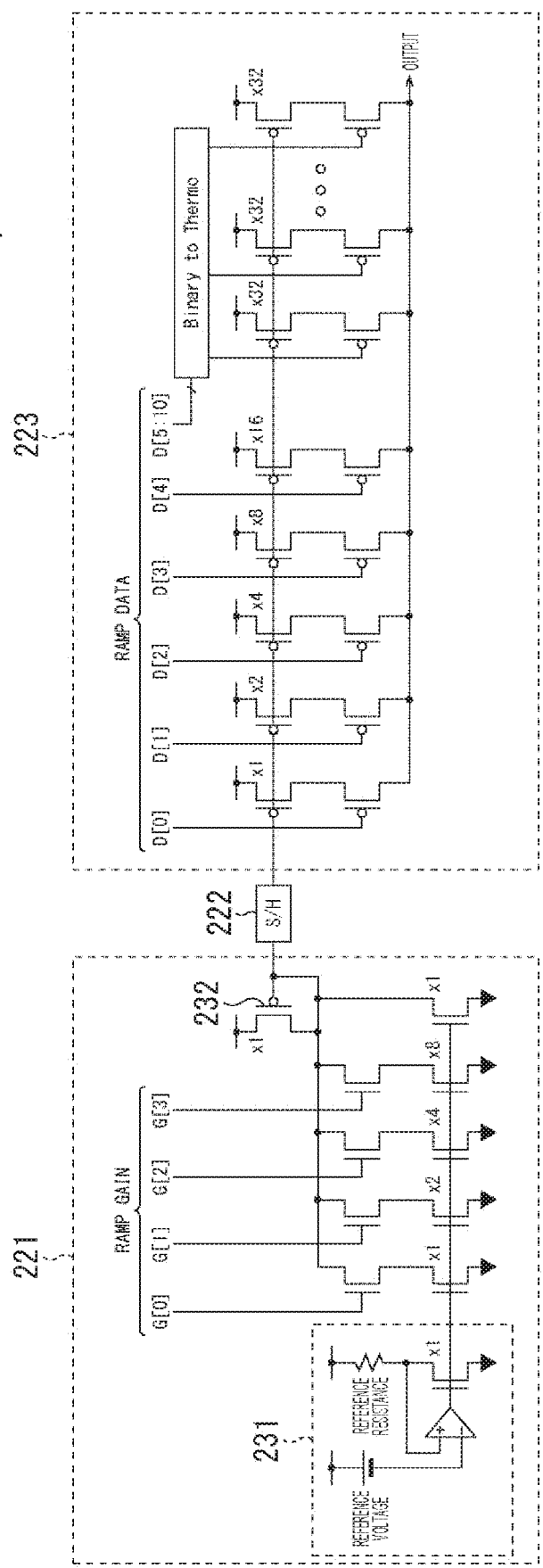
FIG. 9 is a diagram illustrating a circuit example of a ramp DAC.

FIG. 9 illustrates a circuit example of the ramp DAC 201.

The ramp DAC 201 includes a step current generation unit 221 for generating a step current, a sample-hold circuit (S/H) 222 for holding and outputting the step current output from the step current generation unit 221, and a ramp current generation unit 223 that generates a ramp current by multiplying the step current by a predetermined number according to the ramp data input RAMP DATA.

A 4-bit gain setting input RAMP GAIN is input to a gain setting bus G[0:3] of the step current generation unit 221. A reference current generation circuit 231 generates a reference current on the basis of a reference voltage and a reference resistance. The reference current generated by the reference current generation circuit 231 is multiplied by a predetermined number in accordance with the numerical value input to the gain setting bus G[0:3], and the result flows through a master transistor 232 as a step current. The step current can take any of 50, 100, 150, . . . 800 nA according to the numerical value input to the gain setting bus G[0:3]. The numerical value input to the gain setting bus G[0:3] is determined depending on, for example, the amount of received light in a previous frame, sensitivity setting, and the like.

An 11-bit ramp data input RAMP DATA is input to a ramp data bus D[0:10] of the ramp current generation unit 223. The numerical value input to the ramp data bus D[0:10] forms a pair with the master transistor 232 and sets how many slave transistors constituting a current mirror circuit are activated. The total number of slave transistors is equivalent to 1600 master transistors 232. The 11-bit ramp data input RAMP DATA is a binary code in which D[0] is LSB. When the input is 0, all the slave transistors are activated, and the output current becomes 1600 times the step current. Each time the input increases by 1, the output current of the ramp current generation unit 223 decreases by the step current. This output current is converted by the load resistor 211 into a voltage based on GND. That is, the REF voltage output from the DAC circuit 25 when the ramp data input RAMP DATA is 0 is the maximum voltage, and the REF voltage drops by the step voltage, which is step current x load resistor value, every time the numerical value of the ramp data input RAMP DATA increases by 1.

A high-order 6-bit D[5:10] of the ramp data bus input of the ramp current generation unit 223 is converted into a thermometer code, and the thermometer code output performs control as to whether or not to set the current output of the slave transistors 32 times the master transistor 232 to active. When such a thermo DAC is used in combination, differential linearity better than in a case where the entire ramp DAC 201 is configured by a binary DAC can be obtained.

Figure 10:
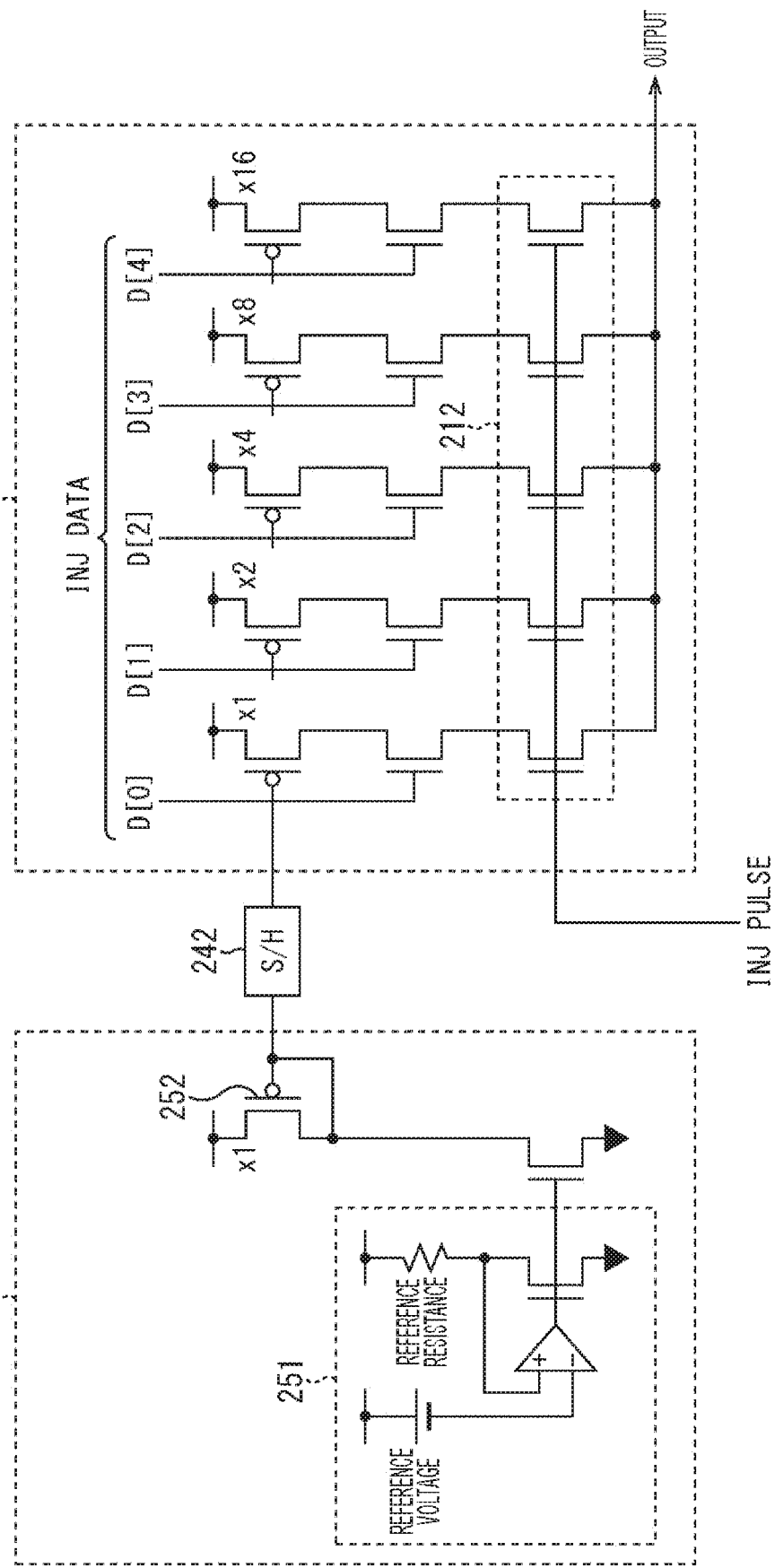
FIG. 10 is a diagram illustrating a circuit example of an injection DAC.

FIG. 10 illustrates a circuit example of the injection DAC 202.

The injection DAC 202 includes a step current generation unit 241 that generates a step current, a sample-hold circuit (S/H) 242 that holds and outputs the step current output from the step current generation unit 241, and an injection current generation unit 243 that generates an injection current by multiplying the step current by a predetermined number in accordance with an injection data input INJ DATA.

In the step current generation unit 241, the reference current generated by the reference current generation circuit 251 flows as it is to the master transistor 252 as a step current. Therefore, the step current of the injection DAC 202 is a fixed value. Note that the step current may be adjustable instead of a fixed value, but is independent of the step current of the ramp DAC 201.

A 5-bit injection data input INJ DATA is input to an injection data bus D[0:4] of the injection current generation unit 243. A numerical value input to the injection data bus D[0:4] forms a pair with the master transistor 252 and sets how many slave transistors constituting the current mirror circuit are activated. The switch 212 for turning on/off the connection on the basis of the injection pulse INJ PULSE is configured by an NMOS transistor.

When the 5-bit injection data input INJ DATA is 0 when the injection pulse INJ PULSE is active, the output current is 0. Each time the 5-bit injection data input INJ DATA increases by 1, the output current of the injection current generation unit 243 increases by the step current. This output current is also converted by the load resistor 211 into a voltage based on GND. That is, when the injection data input INJ DATA increases by 1, the REF voltage increases by the step voltage that is step current x load resistance value.

Figure 11:
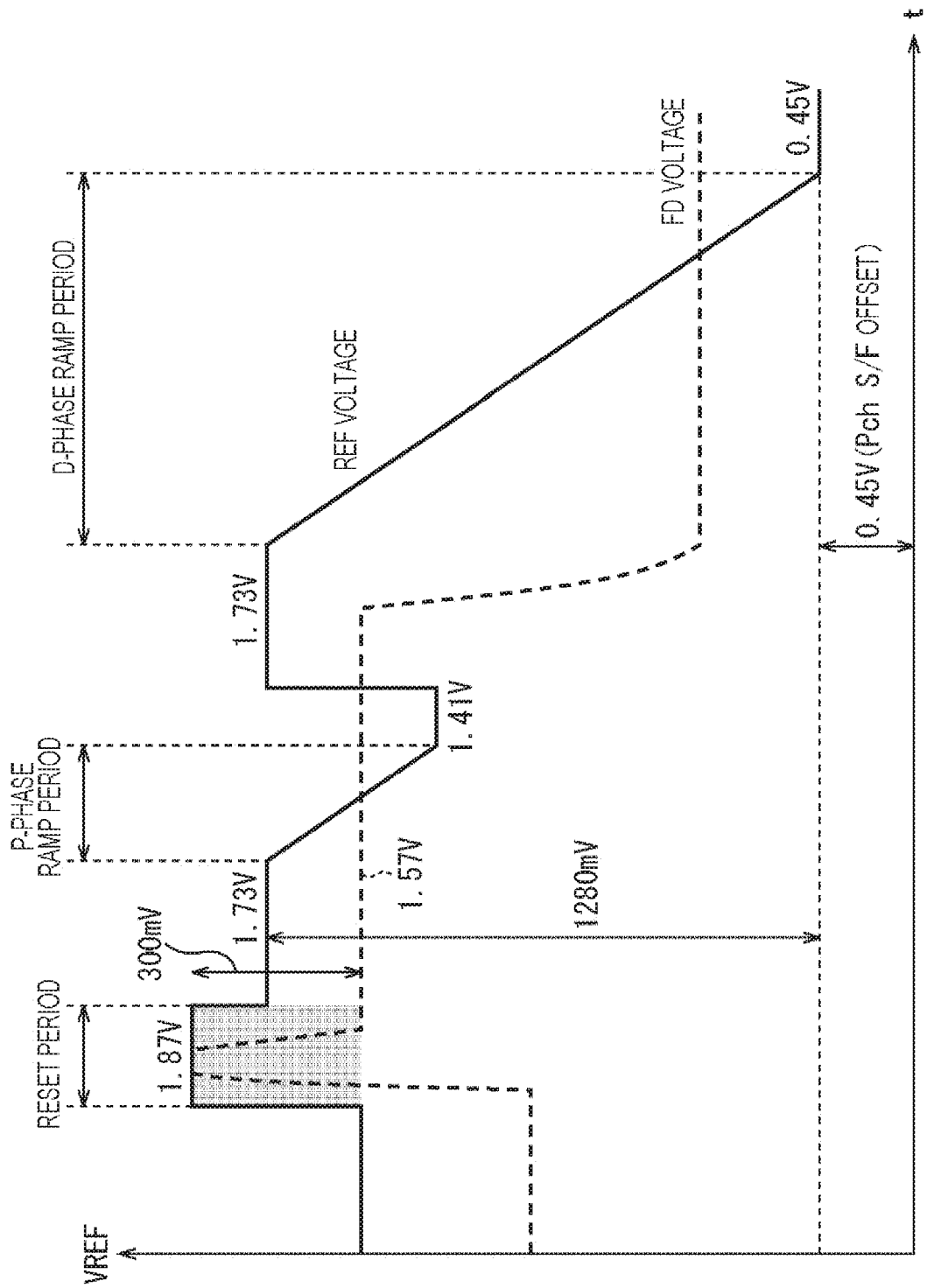
FIG. 11 is a diagram illustrating an example of an REF voltage generated by setting a step current to a predetermined value.
Figure 12:
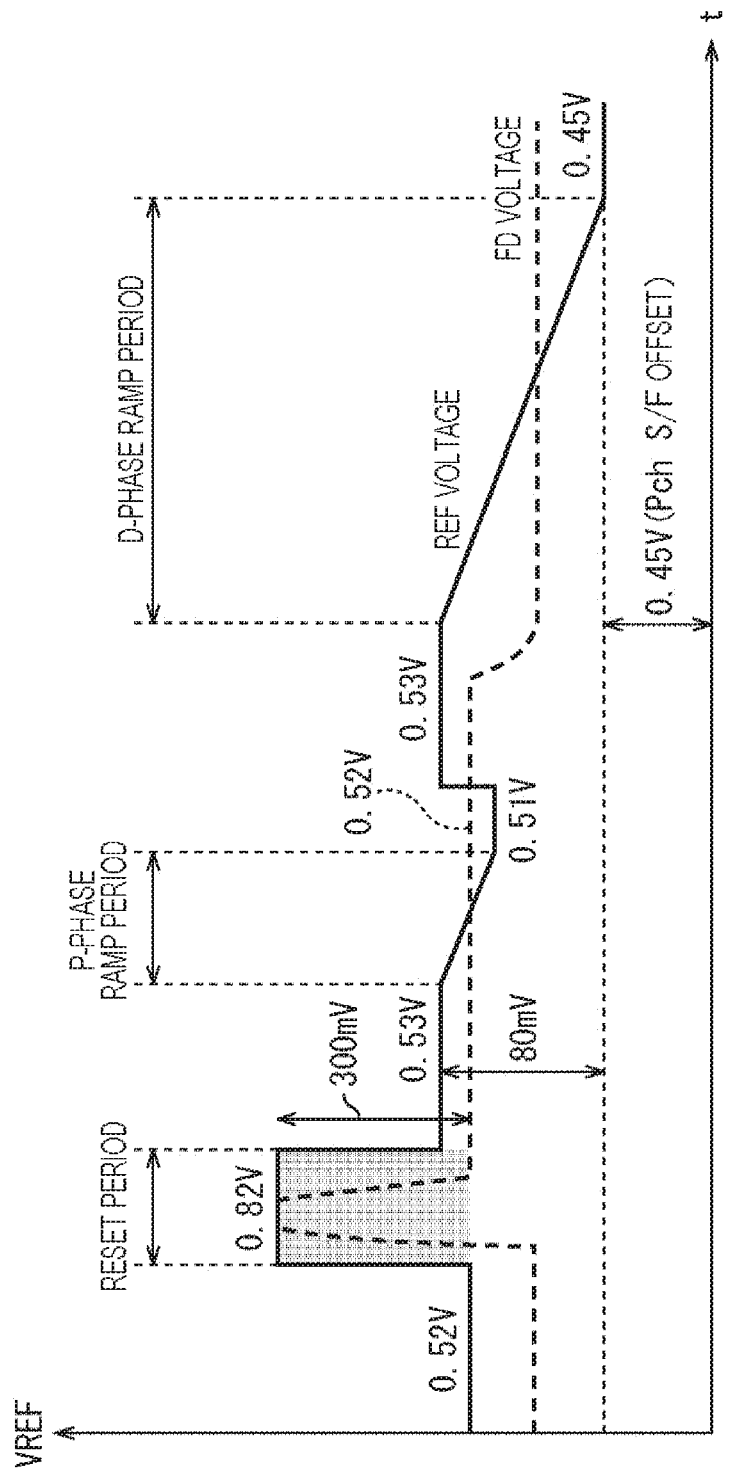
FIG. 12 is a diagram illustrating an example of an REF voltage generated by setting a step current to a predetermined value.

FIGS. 11 and 12 illustrate examples of the REF voltage generated by setting the step current to different values in the DAC circuit 25 of the first embodiment.

FIG. 11 illustrates an example of the REF voltage used for reference gain (0 dB) conversion intended to not saturate the AD conversion even when the charge transferred from the photoelectric conversion element 121 to the FD 125 is large, corresponding to the case where the amount of received light is large.

In the example of FIG. 11, the step current of the ramp DAC 201 is set to 800 nA, and the REF voltage drop due to the increase of the ramp data input RAMP DATA by 1 is 0.8 mV.

During the D-phase ramp period, the output current of the ramp DAC 201 starts from an output current of 1600*800 nA=1.28 mA, where the ramp data input RAMP DATA is 0, and sweeps up to an output current of 0, where the ramp data input RAMP DATA is 1600. That is, the sweep voltage width is 1.28 V (1280 mV).

Assuming that the input/output bias voltage of the source follower circuit 215 is 0.45 V, the start voltage (offset voltage) of the D-phase ramp period is 1.73 V and the end voltage is 0.45 V. It is expected that the REF ramp waveform crosses the voltage of the FD 125 (FD voltage) to which the charge has been transferred from the photoelectric conversion element 121 somewhere in the range.

The output current during the P-phase ramp period has the same start voltage and time gradient as the D-phase ramp period, and the duration is set to a short sweep of ¼ of the D-phase ramp period. Therefore, in the sweep, the ramp data input RAMP DATA ranges from 0 to 400, the output voltage width is 0.32 V, and the end voltage is 1.41 V. The reset FD voltage before the charge is transferred from the photoelectric conversion element 121 is desirably the center voltage of the P-phase sweep range, that is, 1.57 V.

Here, in a case where the FD voltage drops by 0.3 V due to the feedthrough of the reset transistor 124 at the end of the reset operation, during the reset period, the injection DAC 202 sets the ramp data input RAMP DATA to 200 for outputting the P-phase ramp center voltage, sets the injection data input INJ DATA to 30, activates the injection pulse INJ PULSE to output 10 uA*30 steps=300 uA. Therefore, the REF voltage becomes 1.87 V, which is 0.3 V higher than 1.57 V, which is the center voltage of the P-phase sweep range.

In FIG. 11, the shaded portion during the reset period indicates the voltage increased by the injection DAC 202.

FIG. 12 illustrates an example of the REF voltage used for high gain (24 dB) conversion intended for high resolution AD conversion, in which the charge transferred from the photoelectric conversion element 121 to the FD 125 is small, corresponding to the case where the amount of received light is small.

In the example of FIG. 12, the step current of the ramp DAC 201 is set to 50 nA, and the REF voltage drop due to the increase of the ramp data input RAMP DATA by 1 is 50 uV.

In the D-phase ramp period, the sweep voltage width corresponding to the ramp data input RAMP DATA from 0 to 1600 is reduced to 80 mV, and the start voltage (offset voltage) of the D-phase ramp period is 0.53 V.

Furthermore, the sweep voltage width during the P-phase ramp period is 20 mV, which is ¼ of the D-phase ramp period, and the center voltage of the desirable P-phase sweep range as the reset FD voltage is 0.52 V.

In a case where the FD voltage drops by 0.3 V due to the feedthrough of the reset transistor 124 at the end of the reset operation, during the reset period, the injection DAC 202 sets the ramp data input RAMP DATA to 200 for outputting the P-phase ramp center voltage, sets the injection data input INJ DATA to 30, activates the injection pulse INJ PULSE to output 10 uA*30 steps=300 uA. Therefore, the REF voltage becomes 0.82 V, which is 0.3 V higher than 0.52 V, which is the center voltage of the P-phase sweep range.

If the REF voltage that is 0.3 V higher than the center voltage of the P-phase sweep range and 0.29 V higher than the start voltage (offset voltage) is generated by extending the ramp DAC 201, not the injection DAC 202, extension of 0.29 V/50 uV=5800 steps is needed. This is equal to or more than three times the number of steps 1600 required for sweeping the D-phase ramp period, and the ramp DAC 201 becomes very large.

For a small step for conversion at a higher gain, for example, a 10 uV/step output that sweeps a 20 mV P-phase ramp period in 2000 steps is generated by an 11-bit gradation ramp DAC 201, for temporary increase in a relatively large REF voltage for compensating for reset feedthrough, generally output for increase of 200 to 300 mV is generated by a 5-bit gradation injection DAC 202 at 10 mV/step, such that the reference signal REF supplied to the FD direct-coupled comparator 61 can be generated without unnecessarily increasing the gradient of the DAC circuit 25. In order to generate a similar reference signal REF with only one linear DAC circuit without the injection DAC 202, 300 mV/10 uV=30,000 steps is required, and a very large 15-bit gradient DAC circuit is required.

The DAC circuit 25 of the first embodiment is provided with a small injection DAC 202 that does not share a step width with the ramp DAC 201, and temporarily operates only during the reset operation, thereby avoiding an increase in size of the ramp DAC 201.

That is, the DAC circuit 25 of the first embodiment includes the ramp DAC 201 and the injection DAC 202 that raises the REF voltage only during the reset period in consideration of feedthrough, thereby achieving the DAC circuit with a small-scale circuit configuration.

<Timing Relation Between Injection Pulse INJ PULSE and RST Signal>

Figure 13A:
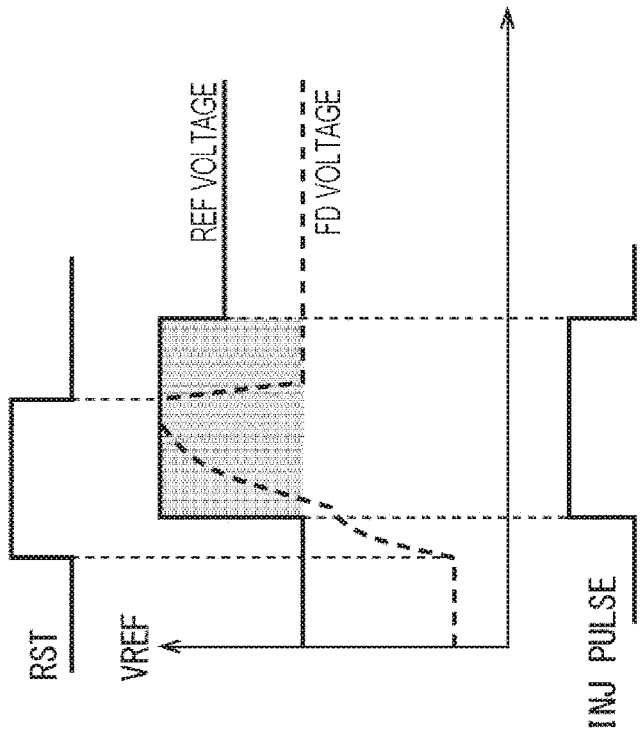
FIGS. 13A and 13B are diagrams explaining a timing relationship between an injection pulse and an RST signal.
Figure 13B:
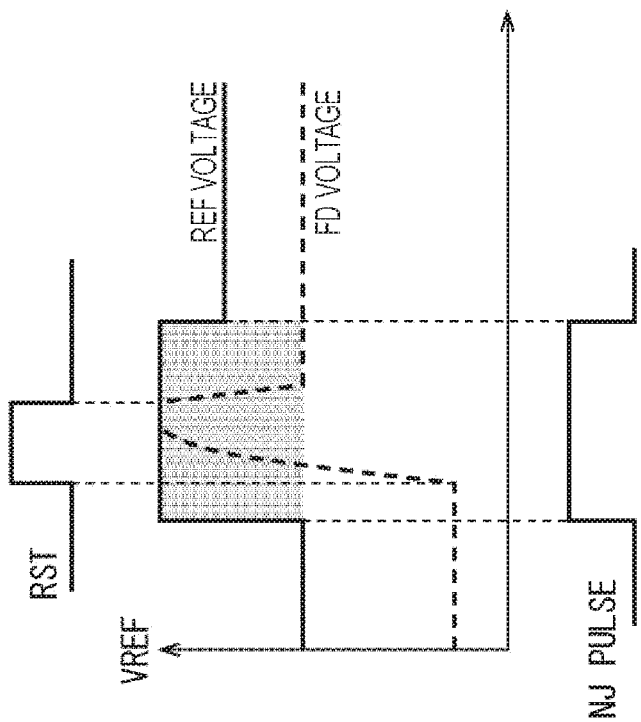

FIGS. 13A and 13B are diagrams illustrating a timing at which an injection pulse INJ PULSE for causing the injection DAC 202 to output current and a Hi RST signal is supplied to the gate of the reset transistor 124.

FIG. 13A illustrates an example in which the timing at which the injection pulse INJ PULSE becomes Hi precedes the timing at which the Hi RST signal is supplied to the gate of the reset transistor 124.

On the contrary, FIG. 13B illustrates an example in which the timing at which the Hi RST signal is supplied to the gate of the reset transistor 124 precedes the timing at which the injection pulse INJ PULSE becomes Hi.

As described above, regarding the timing of becoming Hi, whichever of the injection pulse INJ PULSE and the RST signal may come first. However, the timing when the injection pulse INJ PULSE becomes Lo is later than the timing when the RST signal becomes Lo. The overlap of Hi period between the injection pulse INJ PULSE and the RST signal is only required to ensure a time for the FD voltage to sufficiently converge to the REF voltage.

8. Variation Example of the First Embodiment

Figure 14:
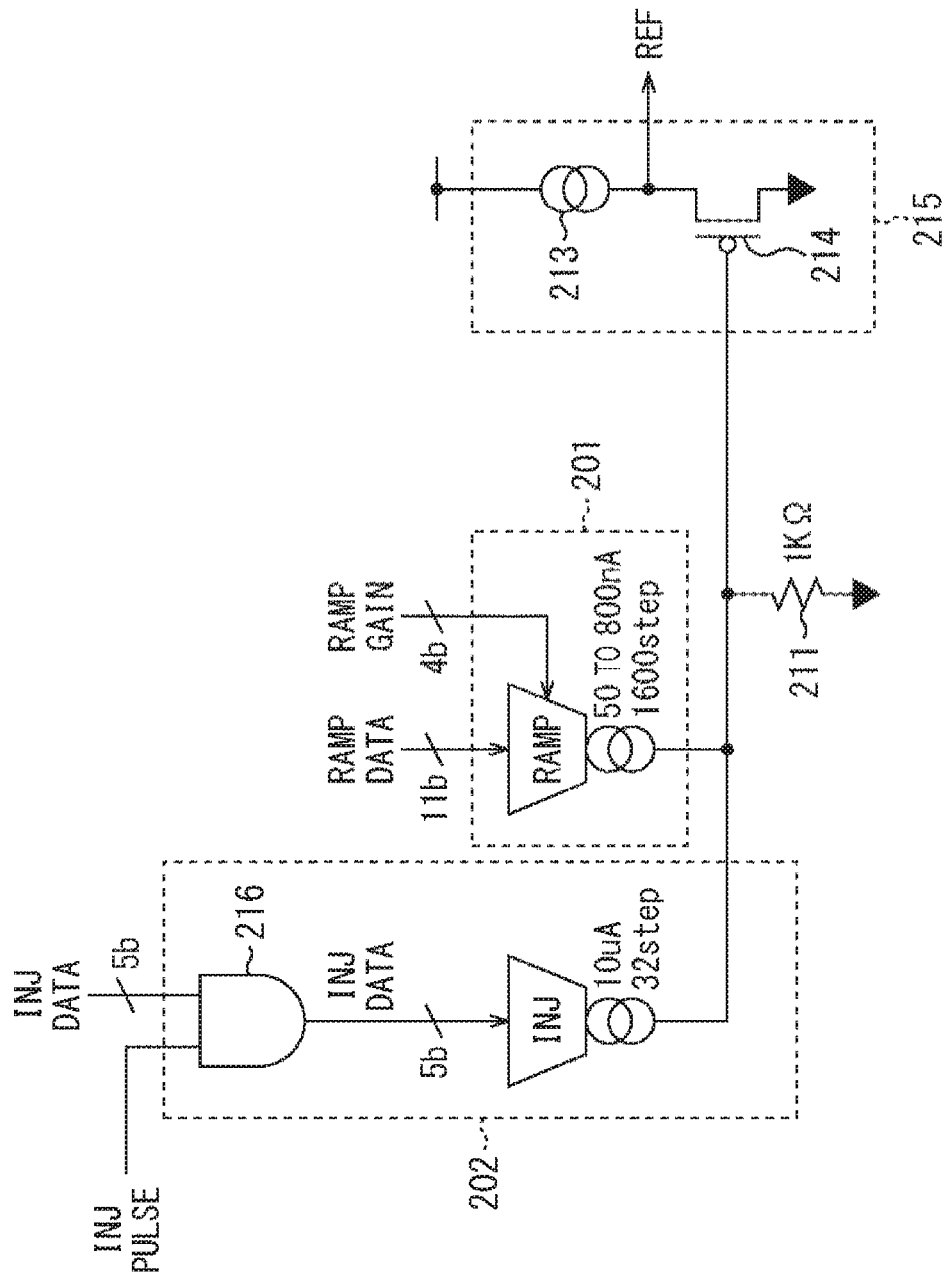
FIG. 14 is a diagram illustrating a variation example of the first embodiment in FIG. 7.

Note that, in the detailed configuration of the DAC circuit 25 illustrated in FIG. 8, the output of the injection DAC 202 is controlled by the injection pulse INJ PULSE. Instead of providing the switch 212 at the output stage of the injection DAC 202, for example, an AND circuit 216 may be provided at the input stage of the injection DAC 202 as illustrated in FIG. 14. The injection pulse INJ PULSE is 0 during a period other than the reset period and has a specific value of non-zero value during the reset period, and the AND circuit 216 inputs the injection data input INJ DATA to the current output DAC only during the reset period.

Alternatively, furthermore, if the voltage drop of the FD voltage due to the reset feedthrough falls within a constant range or a variation within an allowable range, a method of adding a fixed voltage value to the output current of the ramp DAC 201 only when the injection pulse INJ PULSE is active instead of the injection DAC 202 may be adopted.

Furthermore, in a case where the voltage drop of the FD voltage due to reset feedthrough drifts significantly due to a temperature change or the like while repeating the AD conversion operation, the configuration may be adopted in which the injection data input INJ DATA given to the injection DAC 202 or the step voltage of the injection DAC 202 can be adjusted and updated on the basis of an AD conversion result.

9. Variation Example of Pixel Circuit

Figure 15A:
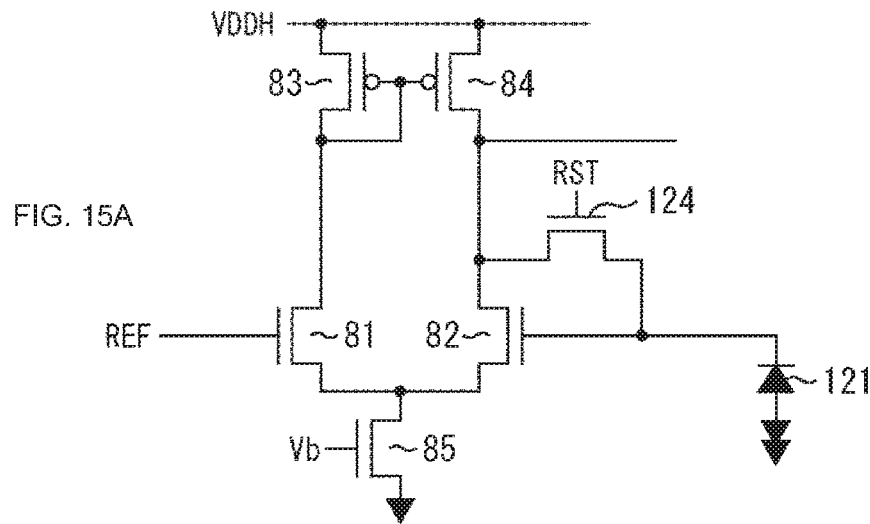
FIGS. 15A, 15B, and 15C are diagrams illustrating a variation example of the pixel circuit in FIG. 4.
Figure 15B:
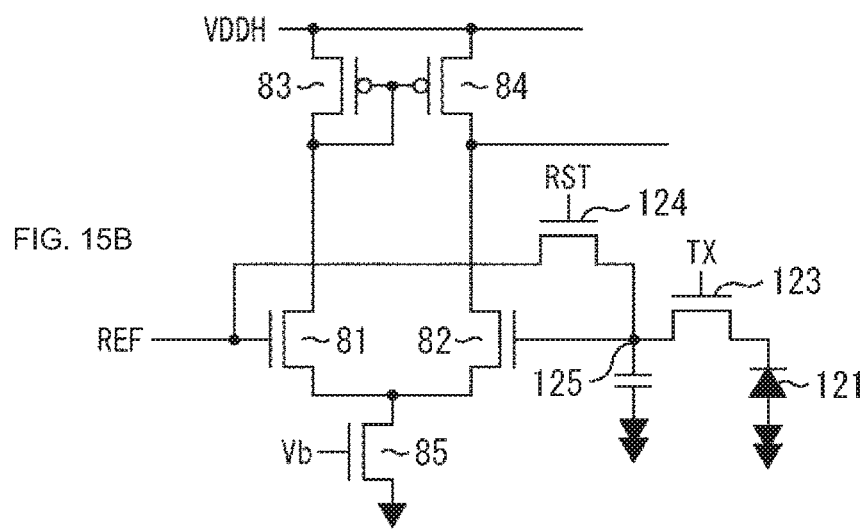
Figure 15C:
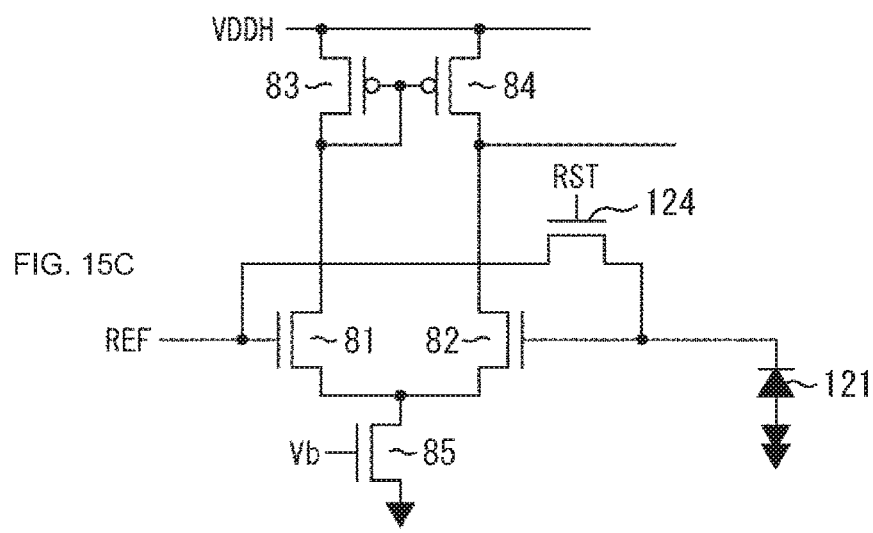

FIGS. 15A, 15B, and 15C illustrate a variation example of the pixel circuit 41.

In the pixel circuit 41 illustrated in FIG. 4, the transfer transistor 123 is disposed between the photoelectric conversion element 121 and the FD 125, and the source of the reset transistor 124 is connected to the gate of the transistor 82 of the differential input circuit 61 and the FD 125, and the drain of the reset transistor 124 is connected to the drain of the transistor 82.

On the other hand, for example, as illustrated in FIG. 15A, the configuration can also be adopted in which the transfer transistor 123 is omitted, and a cathode terminal PD of the reverse bias diode as the photoelectric conversion element 121 is DC-directly coupled to the differential input circuit 61, and the cathode terminal of the reverse bias diode is reset during the reset period.

Furthermore, as illustrated in FIG. 15B, the configuration may be adopted in which the drain of the reset transistor 124 is connected to the drain of the transistor 81, not the drain of the transistor 82, and reset by the REF voltage output from the DAC circuit 25.

Moreover, as illustrated in FIG. 15C, the configuration is also possible in which the transfer transistor 123 is omitted and the cathode terminal PD of the reverse bias diode as the photoelectric conversion element 121 is reset by the REF voltage output from the DAC circuit 25.

10. Second Embodiment of DAC Circuit

Figure 16:
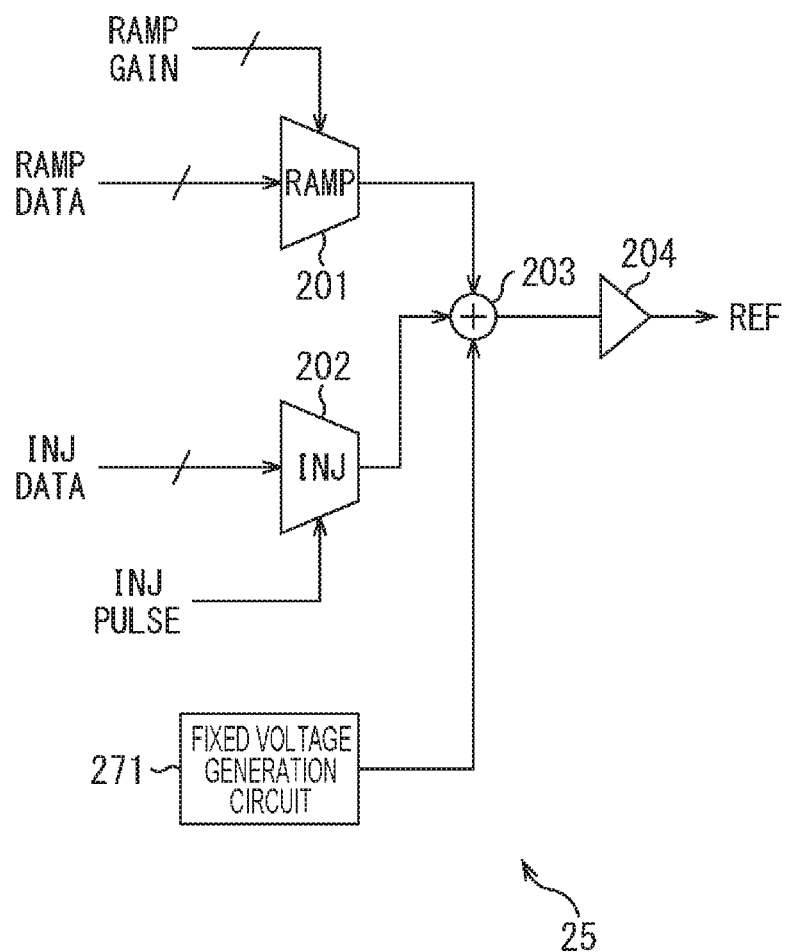
FIG. 16 is a diagram illustrating a conceptual circuit configuration of a second embodiment of the DAC circuit.

FIG. 16 illustrates a conceptual circuit configuration of the second embodiment of the DAC circuit 25.

In FIG. 16, parts corresponding to those of the first embodiment of FIG. 7 are designated by the same reference numerals, and description of the parts is omitted as appropriate.

In the DAC circuit 25 according to the second embodiment illustrated in FIG. 16, in addition to the configuration of the first embodiment illustrated in FIG. 7, a fixed voltage generation circuit 271 that generates a fixed bias voltage and supplies it to the adding circuit 203 is newly provided. The adding circuit 203 further adds the output of the fixed voltage generation circuit 271 to the output of the ramp DAC 201 and the output of the injection DAC 202 and outputs the result. Other configurations of the DAC circuit 25 of the second embodiment are similar to those of the DAC circuit 25 of the first embodiment.

Figure 17:
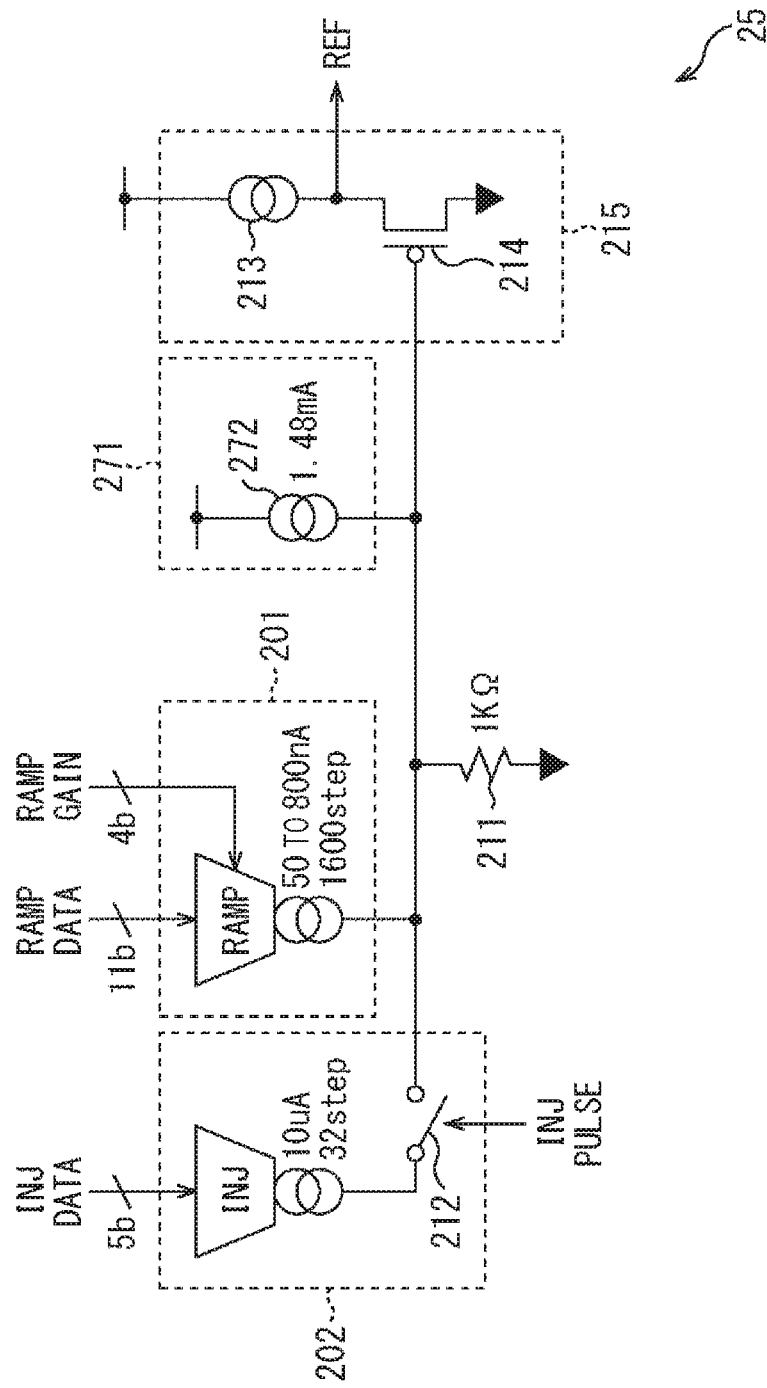
FIG. 17 is a diagram illustrating a more detailed configuration example of the DAC circuit in FIG. 16.

FIG. 17 illustrates a more detailed configuration of the DAC circuit 25 in FIG. 16.

Also in FIG. 17, parts corresponding to those of FIG. 8 of the first embodiment are designated by the same reference numerals, and description of the parts is omitted as appropriate.

The DAC circuit 25 of FIG. 17 is similar to that of the first embodiment illustrated in FIG. 8, except that the fixed voltage generation circuit 271 is added. The fixed voltage generation circuit 271 includes, for example, a fixed current source 272.

In the first embodiment, the desired FD voltage after the reset operation is uniquely determined by the maximum output of the ramp DAC 201 and the source follower offset. Taking the operation state of FIG. 12 as an example, expecting that the maximum output of the ramp DAC 201 is 80 mV, the D-phase ramp period uses up the output of the ramp DAC 201, the P-phase ramp period is ¼ of the D-phase ramp period, and the reset FD voltage is in the middle of the P-phase ramp period, the potential will be 0.52 V, which is ⅞ of 80 mV plus a 0.45 V source follower offset. The reset FD voltage determined in this manner may not be appropriate for charge transfer from the photoelectric conversion element 121. In other words, there is a case where the reset FD voltage is to be set to, for example, around 1.5 to 2.0 as illustrated in FIG. 11 regardless of the gain.

An optimal value of the reset FD voltage is determined in consideration of the input dynamic range of the FD direct-coupled comparator 61, the drive voltage of the transfer transistor 123, the saturation charge amount of the FD 125, the number of leak electrons flowing into the FD 125 during the AD conversion operation, and the like. The lower limit of the input dynamic range of the FD direct-coupled comparator 61 is a value obtained by adding a current source room head of about 0.5 V to a GND potential and a gate-source bias of a differential NMOS transistor of about 0.5 V, and the upper limit is a value obtained by subtracting a bias of about 0.5 V for the differential NMOS transistor and the active load PMOS to operate in the saturation region from the power supply voltage.

In order to suppress the voltage amplitude of the transfer transistor 123 and increase the saturation charge, the higher the reset FD voltage, the better, and is set near the upper limit of the input of the FD direct-coupled comparator 61. Furthermore, to detect a small change in the FD potential due to the transfer of a small amount of photoelectric conversion charges by applying a low-gradient REF voltage and taking time with low noise, it is preferable to set the reset FD voltage to near the lower limit of the input of the FD direct-coupled comparator 61 such that the leakage of an electron to the FD 125 during the AD conversion operation is reduced. For that purpose, it is necessary to adjust the fixed voltage so that the reset FD voltage value can be obtained depending on the situation and purpose of AD conversion.

Figure 18:
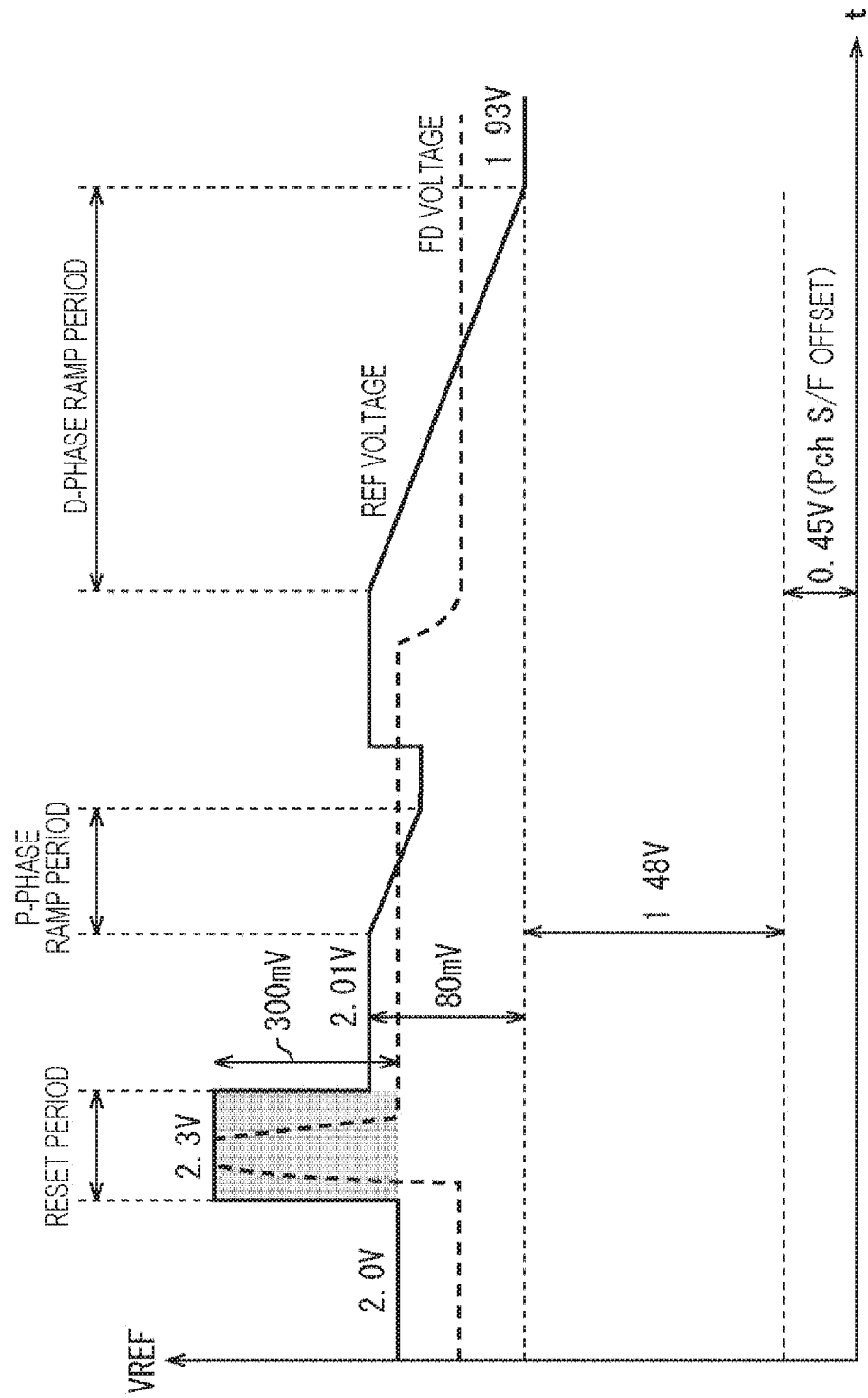
FIG. 18 is a diagram illustrating a control example of the DAC circuit according to the second embodiment.

Therefore, in the DAC circuit 25 of the second embodiment, as illustrated in FIG. 17, by adding a fixed current source of 1.48 mA for generating a fixed voltage of 1.48 V, for example, as the fixed current source 272, the reset FD voltage is set to 2 V as illustrated in FIG. 18. Thus, the reset FD voltage can be controlled by the setting of the fixed voltage generation circuit 271. The fixed voltage may be generated by a band gap reference (BGR) circuit or the like or may be generated by a DAC whose input numerical value is fixed. The input value to the bias DAC is set depending on the situation and purpose of the AD conversion, but is kept at a constant value during the series of AD conversion operations illustrated in FIG. 18.

As described above, with the DAC circuit 25 of the second embodiment, when a signal obtained by adding the output of the fixed voltage generation circuit 271 to the ramp DAC 201 and the injection DAC 202 is used as the reference signal REF, the reset FD voltage can be set to any voltage.

11. Third Embodiment of DAC Circuit

Figure 19:
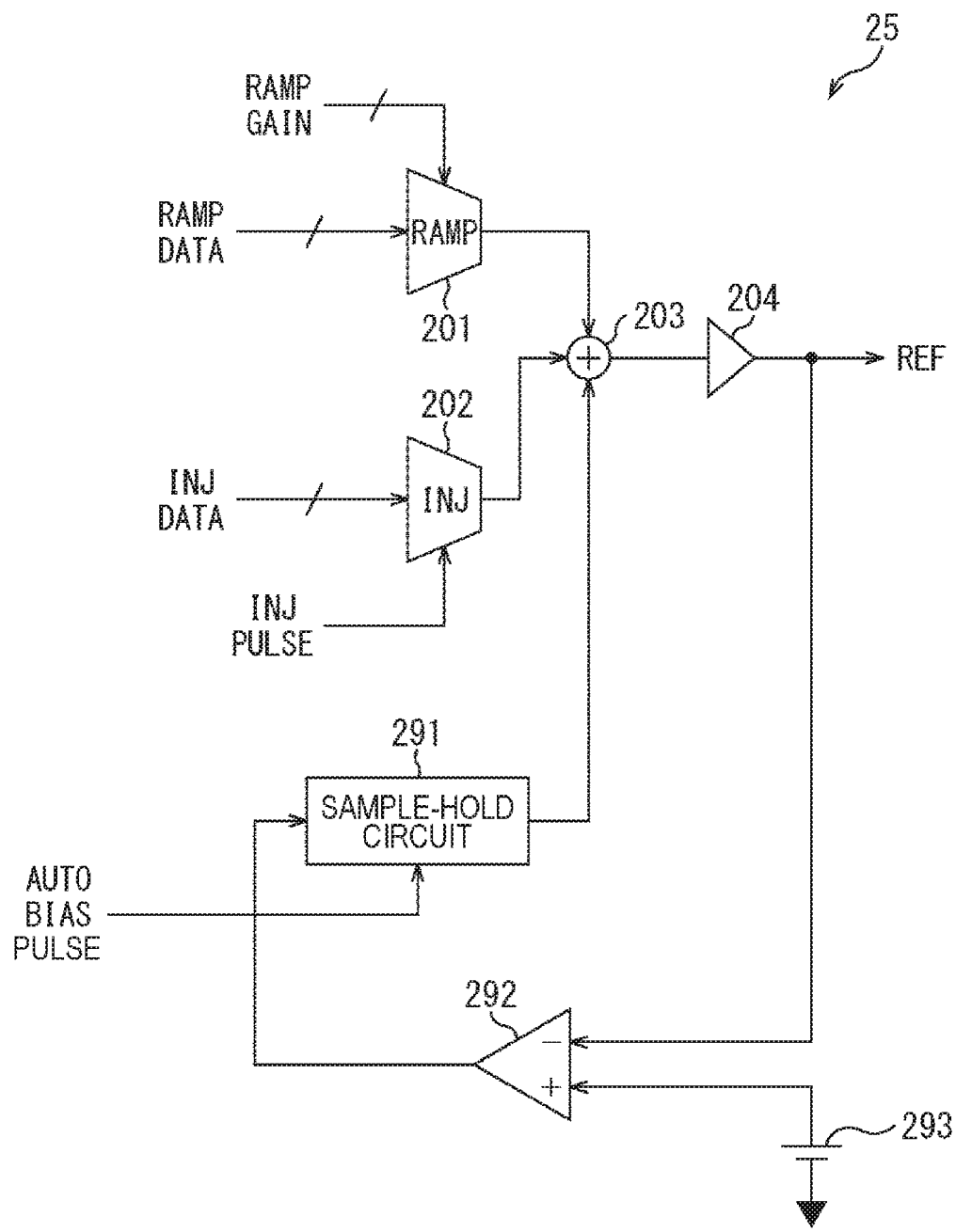
FIG. 19 is a diagram illustrating a conceptual circuit configuration of a third embodiment of the DAC circuit.

FIG. 19 illustrates a conceptual circuit configuration of the third embodiment of the DAC circuit 25.

In FIG. 19, parts corresponding to those of the second embodiment of FIG. 16 are designated by the same reference numerals, and description of the parts is omitted as appropriate.

In the DAC circuit 25 of the third embodiment of FIG. 19, a sample-hold circuit 291, an error amplifier 292, and a voltage source 293 are provided instead of the fixed voltage generation circuit 271 of the second embodiment of FIG. 16.

Other configurations of the DAC circuit 25 of the second embodiment are similar to those of the DAC circuit 25 of the second embodiment.

The sample-hold circuit 291 enters a track mode when an input AUTOBIAS pulse is active, and a negative feedback circuit is formed such that the DAC output becomes equal to a target voltage supplied from the voltage source 293 to the error amplifier 292. When the AUTOBIAS pulse is inert, the sample-hold circuit 291 enters a hold mode, the feedback circuit is opened, and the feedback is settled to hold the determined voltage. The fixed bias voltage output when the sample-hold circuit 291 is in the hold mode corresponds to the fixed bias voltage output from the fixed voltage generation circuit 271.

Figure 20:
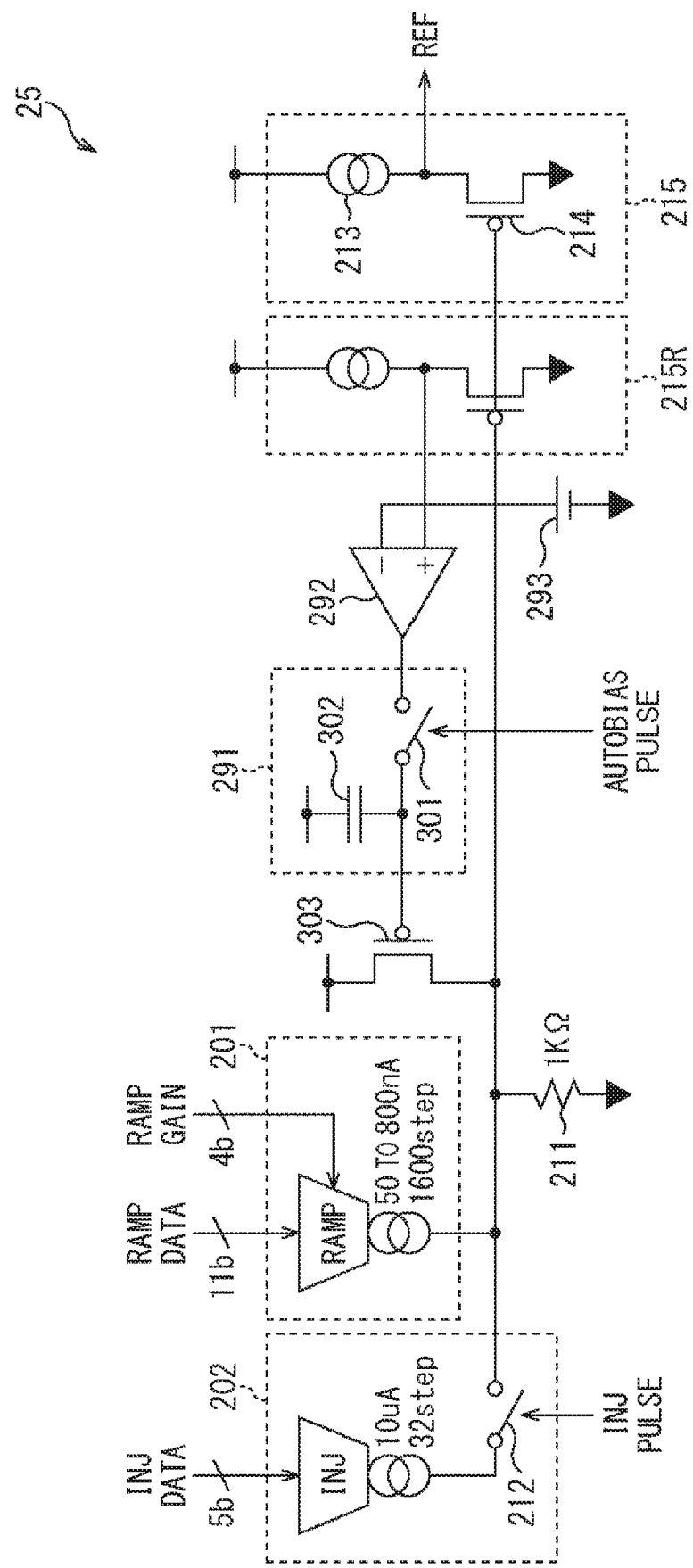
FIG. 20 is a diagram illustrating a more detailed first configuration example of the DAC circuit in FIG. 19.

FIG. 20 illustrates a detailed first configuration example of the DAC circuit 25 of FIG. 19.

Also in FIG. 20, parts corresponding to those of FIG. 17 of the second embodiment are designated by the same reference numerals, and description of the parts is omitted as appropriate.

In the first configuration example of FIG. 20, a source follower circuit 215R for duplicating an REF voltage output is additionally provided, and the REF voltage output of the source follower circuit 215R and the target voltage output by the voltage source 293 are input to the error amplifier 292. The output of the error amplifier 292 drives a PMOS transistor 303 as a current source via the sample-hold circuit 291 including a switch 301 and a sampling capacitor 302. The output of the PMOS transistor 303 as a current source is applied to the load resistor 211 common to the ramp DAC 201 and the injection DAC 202 to be voltage addition, which is reflected on the REF voltage output.

In the DAC circuit 25 of FIG. 20, when the AUTOBIAS pulse is active, the switch 301 is closed, the negative feedback functions, and the REF voltage and the target voltage almost match due to an imaginary short. The gate voltage of the PMOS transistor 303 at this time is stored in the sampling capacitor 302.

On the other hand, when the AUTOBIAS pulse is inert, the switch 301 is opened, and the voltage stored in the sampling capacitor 302 is continuously supplied to the gate of the PMOS transistor 303. The output current of the PMOS transistor 303 is kept constant by the stored gate voltage.

Figure 21:
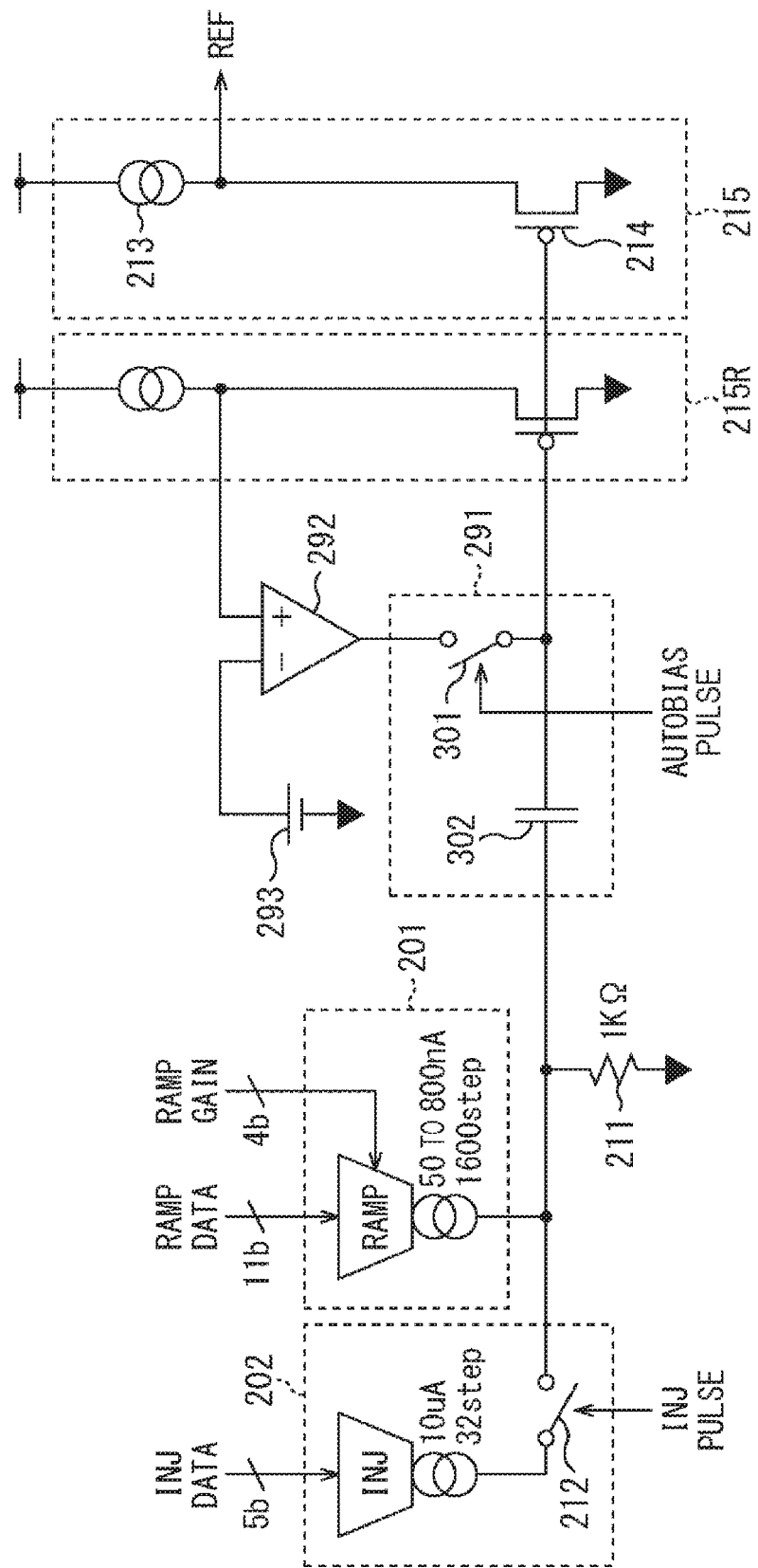
FIG. 21 is a diagram illustrating a more detailed second configuration example of the DAC circuit in FIG. 19.

FIG. 21 illustrates a detailed second configuration example of the DAC circuit 25 of FIG. 19.

Also in FIG. 21, parts corresponding to those of FIG. 17 of the second embodiment are designated by the same reference numerals, and description of the parts is omitted as appropriate.

Also in the second configuration example of FIG. 21, a source follower circuit 215R for duplicating an REF voltage output is additionally provided, and the REF voltage output of the source follower circuit 215R and the target voltage output by the voltage source 293 are input to the error amplifier 292.

The second configuration example is similar to the first configuration example of FIG. 20 in that the sample-hold circuit 291 includes the switch 301 and the sampling capacitor 302, but the sampling capacitor 302 is inserted in series between nodes of the ramp DAC 201, the injection DAC 202, and the load resistor 211 and the inputs of the source follower circuits 215 and 215R. The output of error amplifier 292 drives inputs of the source follower circuits 215 and 215R via the switch 301.

In the DAC circuit 25 of FIG. 20, when the AUTOBIAS pulse is active, the switch 301 is closed, the negative feedback functions, and the REF voltage and the target voltage almost match due to an imaginary short. At this time, a difference voltage between the nodes of the ramp DAC 201, the injection DAC 202, and the load resistor 211, and the output of the error amplifier 292, i.e., the inputs of the source follower circuits 215 and 215R is stored in the sampling capacitor 302.

On the other hand, when the AUTOBIAS pulse is inert, the switch 301 is opened, and the sampling capacitor 302 continuously supplies the voltage stored between the nodes of the ramp DAC 201, the injection DAC 202, and the load resistor 211, and the inputs of the source follower circuits 215 and 215R as a bias.

Figure 22:
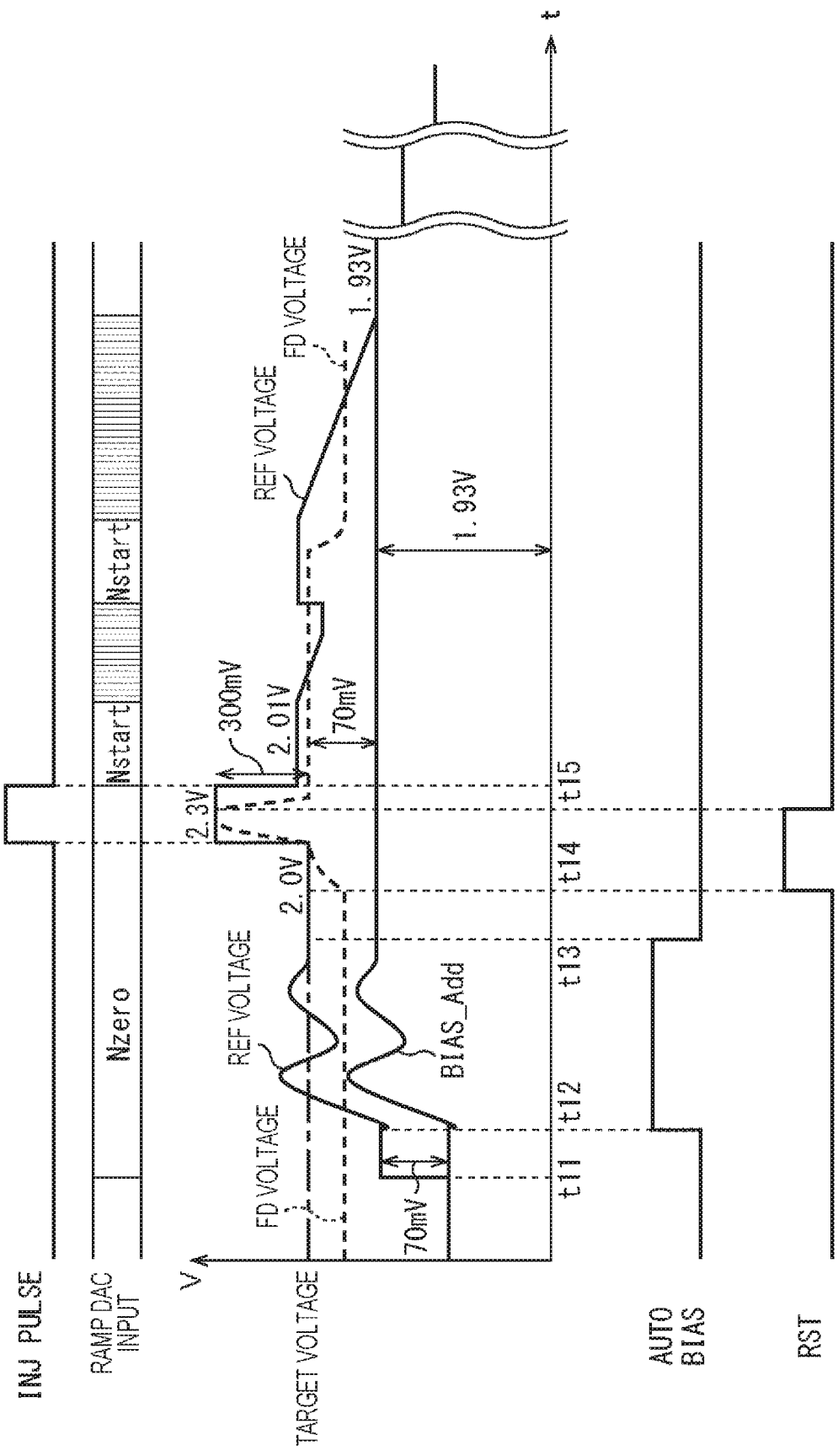
FIG. 22 is a timing chart explaining an AD conversion operation of the DAC circuit according to the third embodiment.

FIG. 22 illustrates a timing chart of the AD conversion operation of the DAC circuit 25 according to the third embodiment.

First, at time t11, the ramp data input RAMP DATA of the ramp DAC 201 is set to the target voltage of the reset FD voltage, that is, a value [Nzero] corresponding to the center voltage of the P-phase sweep range. In this example, Nzero=2.0 V.

From the next time t12 to t13, the AUTOBIAS pulse becomes active, and the REF voltage converges to a target voltage of 2.0 V by negative feedback.

When the AUTOBIAS pulse returns to inert at the time t13, the sample-hold circuit 291 fixes a bias addition BIAS_Add to the sum of the outputs of the ramp DAC 201 and the injection DAC 202 at the REF voltage to a fixed value (1.93 V in FIG. 22).

From time t14 to t15, the RST signal and the injection pulse INJ PULSE are set to Hi, and the reset operation of the FD 125 is performed. When the addition of the REF voltage output by the injection DAC 202 is equal to the feedthrough drop voltage, the FD voltage matches the target voltage.

The sample-hold circuit 291 remains in the hold mode until the AD conversion ends. After the end of the AD conversion, the sampling capacitor 302 gradually loses the stored voltage until the next AD conversion, and the voltage by the feedback is stored again at the beginning of the next AD conversion.

As described above, with the DAC circuit 25 of the third embodiment, when a signal obtained by adding the bias voltage BIAS_Add determined by the feedback circuit including the sample-hold circuit 291 to the outputs of the ramp DAC 201 and the injection DAC 202 is output as the reference signal REF, even in a case where the offset voltage of a current amplification stage of the REF output varies, the voltage of the reference signal REF (REF voltage) can be kept constant and the reset FD voltage can be set accurately.

12. Fourth Embodiment of DAC Circuit

Figure 23:
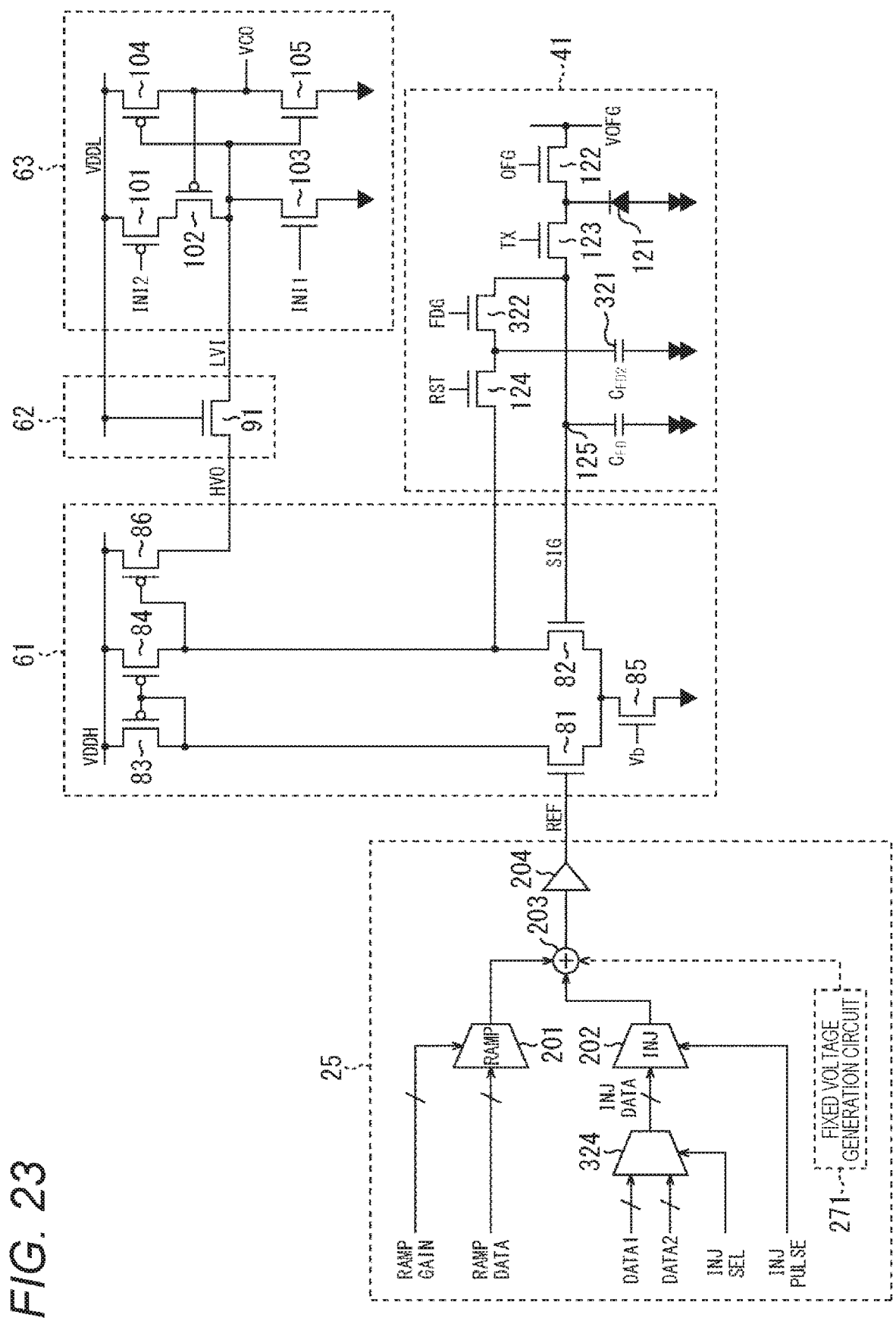
FIG. 23 is a diagram illustrating a conceptual circuit configuration of a fourth embodiment of the DAC circuit.

FIG. 23 illustrates a conceptual circuit configuration of the fourth embodiment of the DAC circuit 25.

In FIG. 23, parts corresponding to those of the second embodiment of FIG. 16 are designated by the same reference numerals, and description of the parts is omitted as appropriate.

The DAC circuit 25 of FIG. 23 is a circuit corresponding to feedthrough that occurs twice or more during the AD conversion operation. FIG. 23 illustrates, in addition to the DAC circuit 25 according to the fourth embodiment, a pixel circuit 41 and a comparison circuit 51 (a differential input circuit 61 to a positive feedback circuit 63) that generate two or more feedthroughs.

The pixel circuit 41 of FIG. 23 further includes an additional FD 321 other than the FD 125 and an NMOS transistor 322 that controls connection and disconnection of the additional FD 321 as compared with the pixel circuit 41 illustrated in FIG. 4. The NMOS transistor 322 is connected in series with the reset transistor 124, and is inserted between the drain of the transistor 82 and the gate of the transistor 82 of the differential input circuit 61 and the FD 125. The additional FD 321 is connected to a node between the NMOS transistor 322 and the reset transistor 124. The NMOS transistor 322 connects the additional FD 321 on the basis of an FDG signal supplied to the gate. It is assumed that the capacitance of FD 125 is $C_{FD}$ and the capacitance of the additional FD 321 is $C_{FD2}$. The RST signal and the FDG signal make independent transitions during the AD conversion operation, and generate feedthrough for each of the FD 125 and the additional FD 321.

The DAC circuit 25 of FIG. 23 has a configuration in which a selector 324 is newly added to the configuration of the DAC circuit 25 of the second embodiment illustrated in FIG. 16. The selector 324 is disposed at a stage preceding the injection DAC 202, selects one of the two input values DATA1 or DATA2 on the basis of a select signal INJSEL, and supplies the selected input value DATA1 or DATA2 to the injection DAC 202 as the injection data input INJ DATA.

Note that in the DAC circuit 25 of FIG. 23, the fixed voltage generation circuit 271 may or may not be provided. Furthermore, a feedback circuit using the sample-hold circuit 291 illustrated in FIG. 19 may be used instead of the fixed voltage generation circuit 271.

Figure 24:
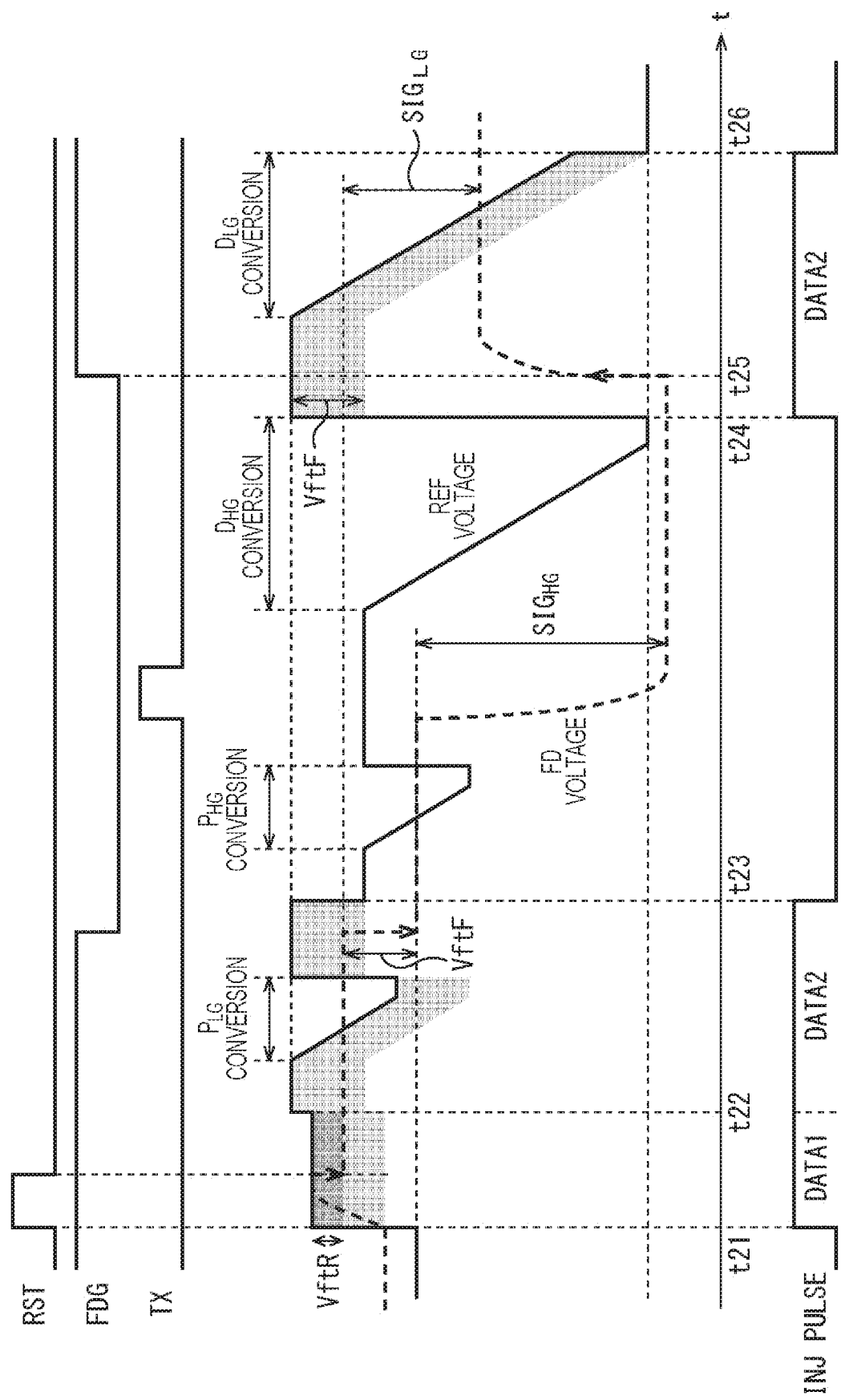
FIG. 24 is a timing chart explaining an AD conversion operation of the DAC circuit according to the fourth embodiment.

The AD conversion operation according to the fourth embodiment will be described with reference to the timing chart of FIG. 24.

The AD conversion operation includes the reset operation, followed by a total of four ramp AD conversions of $P_{LG}$ conversion, $P_{HG}$ conversion, $D_{HG}$ conversion, and DLG conversion.

First, from time t21 to time t23, the injection pulse INJ PULSE is set to active (Hi), and the injection DAC 202 outputs a voltage corresponding to the input value DATA1 or DATA2 supplied from the selector 324.

During a period from time t21 to time t22, a signal for selecting the input value DATA1 is input to the selector 324 as the select signal INJSEL, and the injection DAC 202 outputs a voltage (first voltage corresponding to the first input value) corresponding to the input value DATA1. The input value DATA1 is a value corresponding to the sum (VftR+VftF) of a feedthrough compensation voltage VftR of the reset transistor 124 and a feedthrough compensation voltage VftF of the NMOS transistor 322, and the voltage (VftR+VftF) is added to the REF voltage output during a period from time t21 to time t22.

The reset is performed by the Hi RST signal starting from the time t21. At this time, the FDG signal is Hi, the capacitance $C_{FD}$ of the FD 125 and the capacitance $C_{FD2}$ of the additional FD 321 are in a conductive state by the NMOS transistor 322, and when the RST signal returns from Hi to Lo, it is affected by feedthrough, and the FD voltage drops by the voltage VftR. The FD voltage after this drop is digitized in a next $P_{LG}$ conversion.

During a period from time t22 to time t23, a signal for selecting the input value DATA2 is input to the selector 324 as the select signal INJSEL, and the injection DAC 202 outputs a voltage (second voltage corresponding to the second input value) corresponding to the input value DATA2. The input value DATA2 is a value corresponding to only the feedthrough compensation voltage VftF of the NMOS transistor 322, and the voltage VftF is added to the REF voltage output during the period from the time t22 to the time t23.

During the reset operation, the injection DAC 202 adds the feedthrough compensation voltage VftR to the REF voltage output so that the REF ramp waveform crosses the FD voltage (SIG signal) at the center voltage of the sweep range in the $P_{LG}$ conversion performed during the period from the time t22 to the time t23.

The $P_{LG}$ conversion is processing of digitizing the FD voltage at a stage where the capacitance $C_{FD}$ of the FD 125 and the capacitance $C_{FD2}$ of the additional FD 321 are in a conductive state and charge transfer from the photoelectric conversion element 121 is not performed. In the $P_{LG}$ conversion, the injection DAC 202 lowers the REF voltage by the voltage VftR than at the time of reset.

When the $P_{LG}$ conversion ends, the FDG signal is switched from Hi to Lo, and the state transitions to a state where the capacitance $C_{FD2}$ of the additional FD 321 is cut off. Due to the feedthrough caused by the falling of the FDG signal, the FD voltage drops only by the voltage VftF. The FD voltage after this drop is digitized in a next $P_{HG}$ conversion.

During the reset operation, the injection DAC 202 adds the feedthrough compensation voltage VftF to the REF voltage output so that the REF ramp waveform of the $P_{HG}$ conversion crosses the FD voltage (SIG signal) at the center voltage of the sweep range.

The $P_{HG}$ conversion is processing of digitizing the FD voltage at a stage where the capacitance $C_{FD2}$ of the additional FD 321 is in a conductive state and charge transfer from the photoelectric conversion element 121 is not performed. In the $P_{HG}$ conversion, the injection DAC 202 lowers the REF voltage only by the voltage VftR than when the NMOS transistor 322 is switched, and it is performed in the state of 0 output.

When the $P_{HG}$ conversion ends, a TX signal supplied to the gate of the transfer transistor 123 is set to Hi, and charges are transferred from the photoelectric conversion element 121 to the FD 125. At this time, since the FDG signal is Lo and the capacitance $C_{FD2}$ of the additional FD 321 is in a cutoff state with respect to the capacitance $C_{FD}$ of the FD 125, the charge is transferred only to the FD 125, and is not transferred to the additional FD 321.

After the charge is transferred to the FD 125, the $D_{HG}$ conversion is performed. The $D_{HG}$ conversion is processing of digitizing an FD voltage in a state where charges are transferred from the photoelectric conversion element 121 to only the capacitance $C_{FD}$ of the FD 125. A difference between a $D_{HG}$ conversion result and a $P_{HG}$ conversion result becomes a first gain conversion result $SIG_{HG}$. The first gain conversion is a high-sensitivity (high-gain) AD conversion that obtains a large voltage drop by transferring photoelectric conversion charges to a very small capacitance $C_{FD}$. Because of high sensitivity, a saturation phenomenon in which the FD voltage exceeds the sweep range of the REF voltage for $D_{HG}$ conversion due to voltage drop by the transfer charge tends to occur. When saturation occurs, accurate information about the transfer charge cannot be obtained from the first gain conversion result $SIG_{HG}$.

When the $D_{HG}$ conversion ends, the injection pulse INJ PULSE is set active from time t24 to time t26. The selector 324 receives the select signal INJSEL for selecting the input value DATA2, and the selector 324 supplies the input value DATA2 to the injection DAC 202. The injection DAC 202 outputs a voltage (second voltage corresponding to the second input value) corresponding to the input value DATA2 supplied from the selector 324. The input value DATA2 is a value corresponding to only the feedthrough compensation voltage VftF of the NMOS transistor 322, and the voltage VftF is added to the REF voltage output during the period from the time t24 to the time t26.

At the time t25 after the time t24, the FDG signal supplied to the gate of the NMOS transistor 322 is controlled from Lo to Hi, and the capacitance $C_{FD2}$ of the additional FD 321 transitions to a conductive state. This causes the FD voltage to rise as illustrated in FIG. 24 due to two factors. The first factor is that some of the charges accumulated in the capacitance $C_{FD}$ of the FD 125 from the photoelectric conversion element 121 is dispersed to the capacitance $C_{FD2}$ of the additional FD 321. The second factor is due to feedthrough caused by the rising transition of the FDG signal. The voltage VftF is added to the REF voltage by the injection DAC 202 in order to compensate for the voltage rise due to the second factor and to enable a next DLG conversion result to be compared with a $P_{LG}$ conversion result.

The DLG conversion performed during the period from the time t25 to the time t26 is processing of digitizing the FD voltage in a state where charges are accumulated in both the capacitance $C_{FD}$ of the FD 125 and the capacitance $C_{FD2}$ of the additional FD 321. A difference between a DLG conversion result and a $P_{LG}$ conversion result becomes a second gain conversion result $SIG_{LG}$. The second gain conversion is a low-sensitivity (low-gain) AD conversion because a small voltage drop is caused by distributing the photoelectric conversion charge to a relatively large combined capacitance ($C_{FD}$+$C_{FD2}$). Therefore, saturation is unlikely to occur even when the amount of received light is large and the photoelectric conversion charge is large.

By performing the above AD conversion operation, for weak light, high resolution data can be obtained by the first gain conversion result $SIG_{HG}$, and for strong light, data can be obtained by the second gain conversion result $SIG_{LG}$. By arithmetic operation of Formula (1) below using the first gain conversion result $SIG_{HG}$ and the second gain conversion result $SIG_{LG}$, an integrated AD conversion result SIG can be obtained as the pixel signal SIG, and an AD conversion result having a wide dynamic range can be obtained.

$$SIG = SIG_{HG}(SIG_{LG} < SIGLIM) = SIG_{LG} * \alpha(SIG_{LG} \geq SIGLIM) \quad (1)$$

Here, SIGLIM represents a signal selection reference value, and $\alpha = (C_{FD}+C_{FD2})/C_{FD}$ represents a gain correction constant.

According to the above-described fourth embodiment, by adjusting the output of the injection DAC 202 during the AD conversion operation, an REF ramp waveform corresponding to feedthrough to the FD voltage due to switching that occurs multiple times in an AD conversion sequence is generated, and it is possible to obtain an AD conversion result having a wide dynamic range.

13. Detailed Configuration of Timing Generation Circuit

Next, a detailed configuration of a timing generation circuit 29 corresponding to the DAC circuit 25 of each embodiment described above will be described.

With the DAC circuit 25 of each embodiment described above, regarding the relative relationship between the reset FD voltage and the voltage of the REF ramp waveform, an allowable range is small. For example, as illustrated in FIG. 12, P-phase conversion processing in which the voltage sweep width during the P-phase ramp period is only 20 mV may be performed. On the other hand, KT/C noise due to switching is superimposed on the reset FD voltage, and the P-phase data has a random distribution with a standard deviation of several mV in terms of voltage due to inherent variations in the characteristics of the comparator circuit and the like. In order to convert all FD voltages up to P-phase data with a PPM-class occurrence rate with a REF ramp waveform with a limited sweep voltage width, the center of the reset FD voltage distribution must be precisely aligned with the center of the sweep range of the P-phase ramp period.

The configuration of the timing generation circuit 29 that achieves precise control of the relative relationship between the reset FD voltage and the voltage of the REF ramp waveform will be described with reference to FIG. 25.

In the DAC circuit 25 of each of the above-described embodiments, the purpose is to control the absolute voltage of the FD 125 after reset, but even if the absolute voltage of the FD 125 changes, for example, by 100 mV, a saturated charge or a leak charge will not be fatally changed and the operation range of the comparator circuit is sufficiently wide. That is, the absolute voltage control of the FD 125 after the reset has a relatively wide allowable range. It is preferable to strictly manage the relative relationship with the voltage of the REF ramp waveform even if the absolute voltage value of the FD 125 after reset is somewhat compromised.

Figure 25:
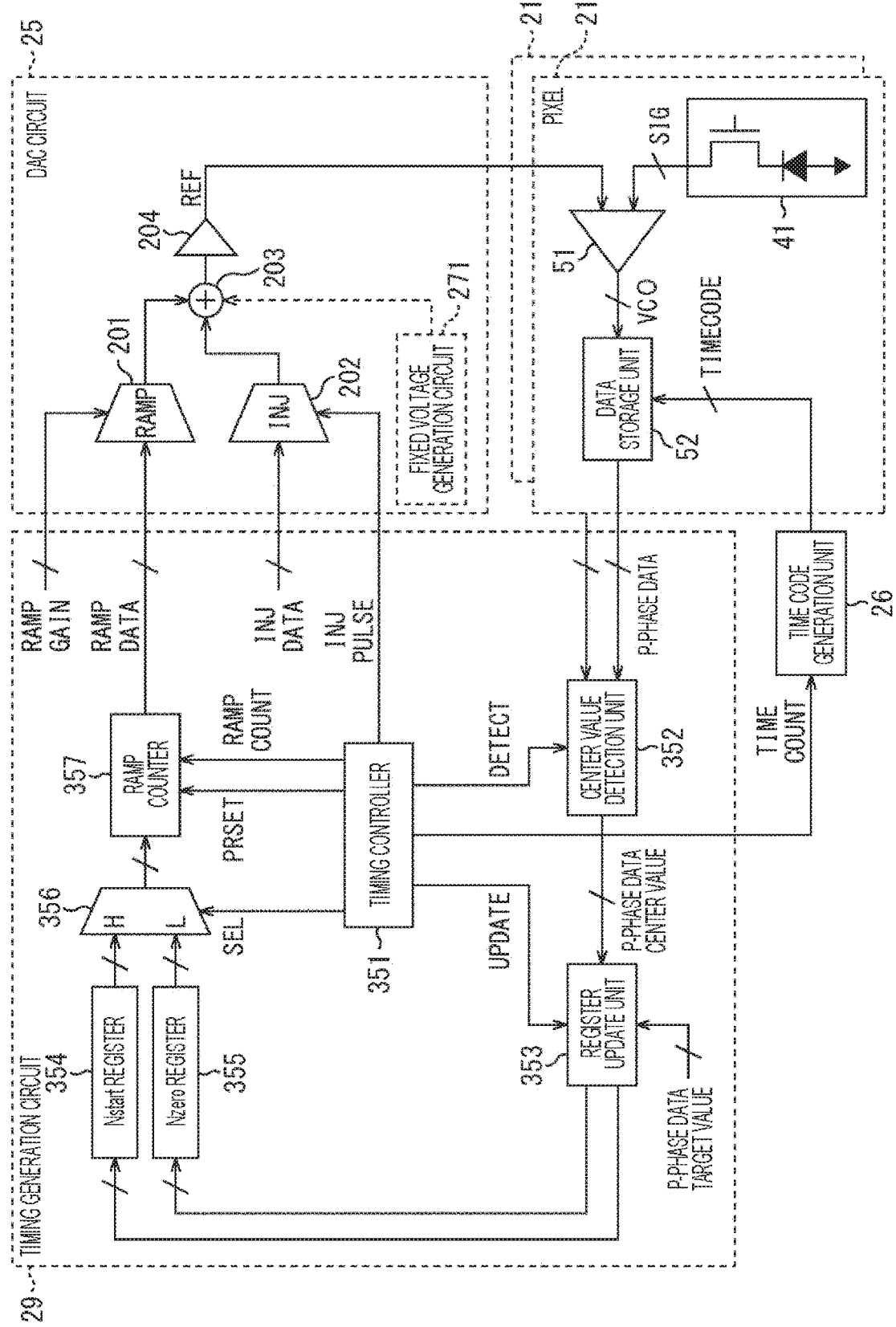
FIG. 25 is a diagram explaining a detailed configuration example of a timing generation circuit.

FIG. 25 illustrates a detailed circuit of the timing generation circuit 29 as a control circuit for controlling the voltage of the REF ramp waveform. Note that, in FIG. 25, for the sake of easy understanding, the circuits of the pixel 21, the DAC circuit 25, and the time code generation unit 26 are also illustrated.

The timing generation circuit 29 includes at least a timing controller 351, a center value detection unit 352, a register update unit 353, an Nstart register 354, an Nzero register 355, a selector 356, and a ramp counter 357.

The timing controller 351 controls each unit in the timing generation circuit 29. For example, the timing controller 351 supplies a DETECT signal giving an instruction on detection of the center value to the center value detection unit 352, and supplies an UPDATE signal giving an instruction on register updating to the register update unit 353. Furthermore, the timing controller 351 supplies the selector 356 with a SEL signal giving an instruction on selection of any one of the Nstart register 354 and the Nzero register 355, and supplies the ramp counter 357 with a PRSET signal giving an instruction on a preset (reset) of the ramp data input RAMP DATA, and a RAMPCOUNT signal giving an instruction on ramp output of the ramp data input RAMP DATA. Moreover, the timing controller 351 supplies TIMECOUNT controlling the output of the time code to the time code generation unit 26.

The center value detection unit 352 extracts P-phase data of a predetermined number of samples from the P-phase data supplied from the data storage unit 52 of each pixel 21, and detects the center value of the maximum value and the minimum value (hereinafter, referred to as the P-phase data center value). The detected P-phase data center value is supplied to the register update unit 353.

The register update unit 353 compares the P-phase data center value supplied from the center value detection unit 352 with P-phase data target value, and updates an Nzero value and an Nstart value stored in the Nstart register 354 and the Nzero register 355 such that a P-phase data center value in a next P-phase ramp period becomes close to a P-phase target value. The P-phase target value is, for example, a center voltage of the sweep range of the REF voltage during the P-phase ramp period.

The Nstart register 354 stores an Nstart value, and the Nzero register 355 stores an Nzero value. The Nstart value corresponds to an initial value of the REF ramp waveform, and the Nzero value corresponds to a contribution of the ramp DAC 201 in the REF voltage during the reset period.

The selector 356 selects any one of the Nstart value of the Nstart register 354 and the Nzero value of the Nzero register 355 on the basis of the SEL signal supplied from the timing controller 351 and supplies the selected value to the ramp counter 357.

The ramp counter 357 generates a ramp data input RAMP DATA on the basis of the Nzero value or the Nstart value, and supplies the ramp data input to the ramp DAC 201. In a case where the PRSET signal is supplied from the timing controller 351, the ramp counter 357 presets the ramp data input RAMP DATA to an output value of the selector 356.

Figure 26:
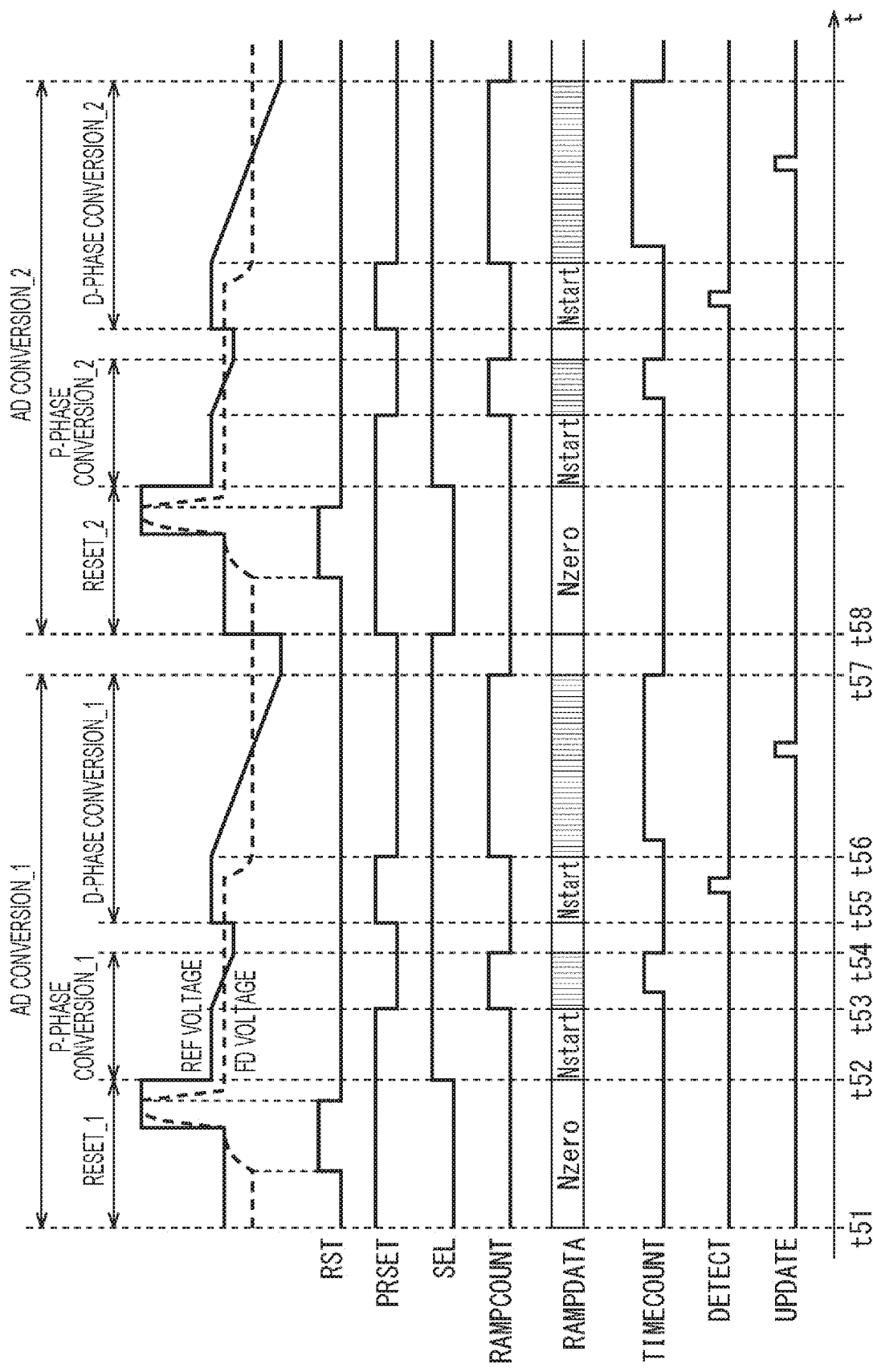
FIG. 26 is a timing chart explaining control of the timing generation circuit.

The control of the timing generation circuit 29 corresponding to the AD conversion operation will be described with reference to the timing chart of FIG. 26.

First, from time t51 to time t52 in the reset period of a first frame, the timing controller 351 supplies a Hi PRSET signal to the ramp counter 357 and supplies a Lo SEL signal to the selector 356. Therefore, the selector 365 supplies the Nzero value stored in the Nzero register 355 to the ramp counter 357, and the ramp counter 357 presets the Nzero value and supplies the ramp data input RAMP DATA to the ramp DAC 201. The ramp DAC 201 outputs a voltage corresponding to the Nzero value. During this reset period, the RST signal becomes Hi for a predetermined period, and addition of the output of the injection DAC 202 by the injection pulse INJ PULSE is also performed.

At time t52 when the P-phase conversion period of the first frame starts, the timing controller 351 controls the SEL signal to Hi and supplies the signal to the selector 356. Therefore, the selector 365 supplies the Nstart value stored in the Nstart register 354 to the ramp counter 357, and the ramp counter 357 presets the Nstart value and supplies the ramp data input RAMP DATA to the ramp DAC 201. The ramp DAC 201 outputs a voltage corresponding to the Nstart value.

At time t53 after a lapse of a predetermined time from the time t52, the timing controller 351 changes the PRSET signal to Lo and changes the RAMPCOUNT signal to Hi. As a result, the ramp counter 357 supplies the ramp DAC 201 with the ramp data input RAMP DATA that is incremented at a constant cycle. Therefore, the ramp DAC 201 drops the REF voltage at a constant gradient.

At time t54 when the ramp DAC 201 ends sweeping the width required for the P-phase conversion, the timing controller 351 returns the RAMPCOUNT signal to Lo. Therefore, the ramp data input RAMP DATA output from the ramp counter 357 is fixed, and the voltage output by the ramp DAC 201 is also fixed.

At time t55, the D-phase conversion period of the first frame is started, the PRSET signal is changed to Hi, the Nzero value is supplied to the ramp counter 357, and the ramp counter 357 presets the Nzero value.

Furthermore, between the time t55 and the time t56, the timing controller 351 sets a DETECT signal to active (Hi) and causes the center value detection unit 352 to detect the P-phase data center value. The P-phase data detected in the above-described P-phase conversion period is supplied from each pixel 21 to the center value detection unit 352, and the center value detection unit 352 detects the P-phase data center value.

During the period from the next time t56 to time t57, a RAMPCOUNT signal is set to Hi, and the ramp counter 357 supplies the ramp DAC 201 with the ramp data input RAMP DATA that is incremented at a constant cycle. Therefore, the ramp DAC 201 drops the REF voltage at a constant gradient.

Furthermore, between the time t56 and the time t57, the timing controller 351 sets an UPDATE signal to active (Hi), and causes the register update unit 353 to calculate the Nstart value and the Nzero value used in next AD conversion. The calculated Nstart value is supplied to and stored in the Nstart register 354, and the calculated Nzero value is supplied to and stored in the Nzero register 355. It is sufficient if update of the Nstart value and the Nzero value is performed from the time t56 to time t58, which is the start time of the reset period of a next frame (second frame).

As described above, the timing generation circuit 29 controls (adjusts) the REF voltage of a next frame on the basis of an AD conversion result of a previous frame. The center value detection unit 352 may calculate the P-phase data center value by a method other than the center value between the maximum value and the minimum value of the extracted P-phase data. For example, in a case where it is known that the distribution of the P-phase data is vertically asymmetric such that the lower tail tends to be longer than the upper side, the P-phase data center value may be 4:6 internally dividing point smaller than the center value of the minimum value and the maximum value, or the like. Similarly, another appropriate value, which is not the P-phase data corresponding to the center voltage of the sweep range of the REF voltage during the P-phase ramp period, may also be used for the P-phase target value.

By successively updating the Nstart value and the Nzero value, the P-phase data center value approaches the target value every time the AD conversion is repeated. Thus, the timing generation circuit 29 performs feedback control of the sweep range of the P-phase ramp period in the AD conversion operation.

<First Center Value Detection Processing>

Figure 27:
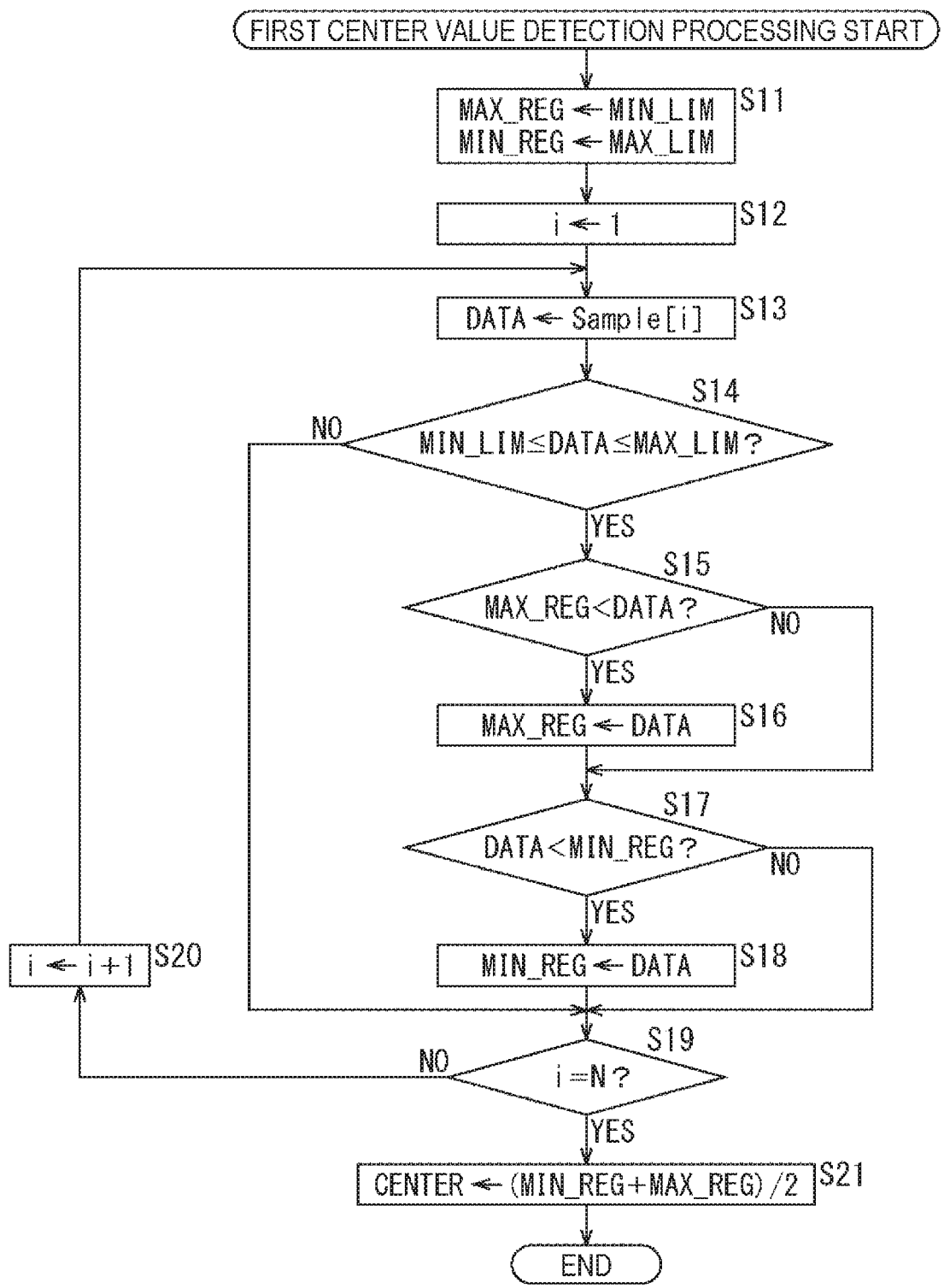
FIG. 27 is a flowchart explaining first center value detection processing.

With reference to the flowchart in FIG. 27, description will be given of the first center value detection processing for detecting the P-phase data center value by the center value detection unit 352.

First, in step S11, the center value detection unit 352 sets a minimum value MIN_LIM that the P-phase data can take to a maximum register value MAX_REG, and sets a maximum value MAX_LIM that the P-phase data can take to a minimum register value MIN_REG.

In step S12, the center value detection unit 352 sets 1 to a variable i for counting the number of samples.

In step S13, the center value detection unit 352 sets P-phase data (Sample[i]) extracted as the i-th sample to a variable DATA.

In step S14, the center value detection unit 352 determines whether the variable DATA falls within a range from the minimum value MIN_LIM that the P-phase data can take to the maximum value MAX_LIM that the P-phase data can take. That is, the center value detection unit 352 determines whether or not the variable DATA satisfies MIN_LIM≤DATA≤MAX_LIM, and verifies the validity of the value.

The P-phase data is obtained by incorporating and holding the value of the time code during the P-phase conversion into a latch using inversion of the output signal VCO of the comparison circuit 51 as a trigger. Therefore, the valid P-phase data must be any of values generated by the time code generation unit 26. In a case where there is any other data in the P-phase data, this is due to a malfunction of the comparison circuit 51 or a failure of the latch circuit.

It is meaningless to detect the P-phase data center value including an abnormal value caused by a malfunction or a failure and determine the Nzero value and the Nstart value of next AD conversion, which is harmful in many cases. For example, when the minimum value that the P-phase data can take is 10, and the maximum value is 4090, in a case where a defective pixel whose P-phase data is fixed to 0 and a defective pixel that is fixed to 5000 are mixed in the sample, the detected P-phase data center value is fixed at 2500 and does not reflect the P-phase data distribution of healthy pixels without failure. Therefore, these apparently incorrect samples need to be discarded and not used for detection of the P-phase data center value. The processing in step S14 is processing for this.

In a case where it is determined in step S14 that the variable DATA does not satisfy MIN_LIM≤DATA≤MAX_LIM, the processing proceeds to step S19.

On the other hand, in a case where it is determined in step S14 that the variable DATA satisfies MIN_LIM≤DATA≤MAX_LIM, the processing proceeds to step S15, and the center value detection unit 352 determines whether the variable DATA is larger than the maximum register value MAX_REG.

In a case where it is determined in step S15 that the variable DATA is larger than the maximum register value MAX_REG, the processing proceeds to step S16, the center value detection unit 352 sets the variable DATA to the maximum register value MAX_REG, and the processing proceeds to step S17.

On the other hand, in a case where it is determined in step S15 that the variable DATA is equal to or smaller than the maximum register value MAX_REG, step S16 is skipped and the processing proceeds to step S17.

In step S17, the center value detection unit 352 determines whether the variable DATA is smaller than the minimum register value MIN_REG. In a case where it is determined in step S17 that the variable DATA is smaller than the minimum register value MIN_REG, the processing proceeds to step S18, the center value detection unit 352 sets the variable DATA to the minimum register value MIN_REG, and the processing proceeds to step S19.

On the other hand, in a case where it is determined in step S17 that the variable DATA is equal to or greater than the minimum register value MIN_REG, step S18 is skipped and the processing proceeds to step S19.

In step S19, the center value detection unit 352 determines whether the variable i for counting the number of samples is equal to the predetermined number of samples N, that is, whether the P-phase data has been sampled the predetermined number of times of extraction.

In a case where it is determined in step S19 that the sampling of the P-phase data has not yet been performed the predetermined number of times of extraction, the processing proceeds to step S20, the variable i is incremented by 1, and the processing returns to step S13. Therefore, the P-phase data of the next sample is set in the variable DATA, and the processing of steps S14 to S19 described above is executed.

On the other hand, in a case where it is determined in step S19 that the variable i is equal to the number of samples N, the processing proceeds to step S21, the center value detection unit 352 calculates an average value of the maximum register value MAX_REG and the minimum register value MIN_REG, determines it as the P-phase data center value CENTER, and the processing ends.

As described above, the center value of the maximum value and the minimum value of the extracted P-phase data is calculated, and the P-phase data center value can be detected.

With the configuration of the timing generation circuit 29 illustrated in FIG. 25, the P-phase data is sampled from an AD conversion result, the REF ramp waveform of the ramp DAC 201 used in next AD conversion is adjusted such that an unknown feedthrough voltage can be adaptively compensated and the distribution center of the P-phase data can be led to the center of the REF ramp waveform. This makes it possible to unfailingly acquire P-phase data from all pixels even with a REF ramp waveform during a short P-phase ramp period, and it is possible to prevent a reduction in AD conversion speed by setting a longer P-phase ramp waveform (P-phase ramp period) and an increase in the power consumption of the AD conversion caused by keeping the comparison circuit 51 operated for a long time.

In the above-described first center value detection processing, the maximum value and the minimum value of the extracted sample are used, but the second largest value and the second smallest value may be used.

Figure 28:
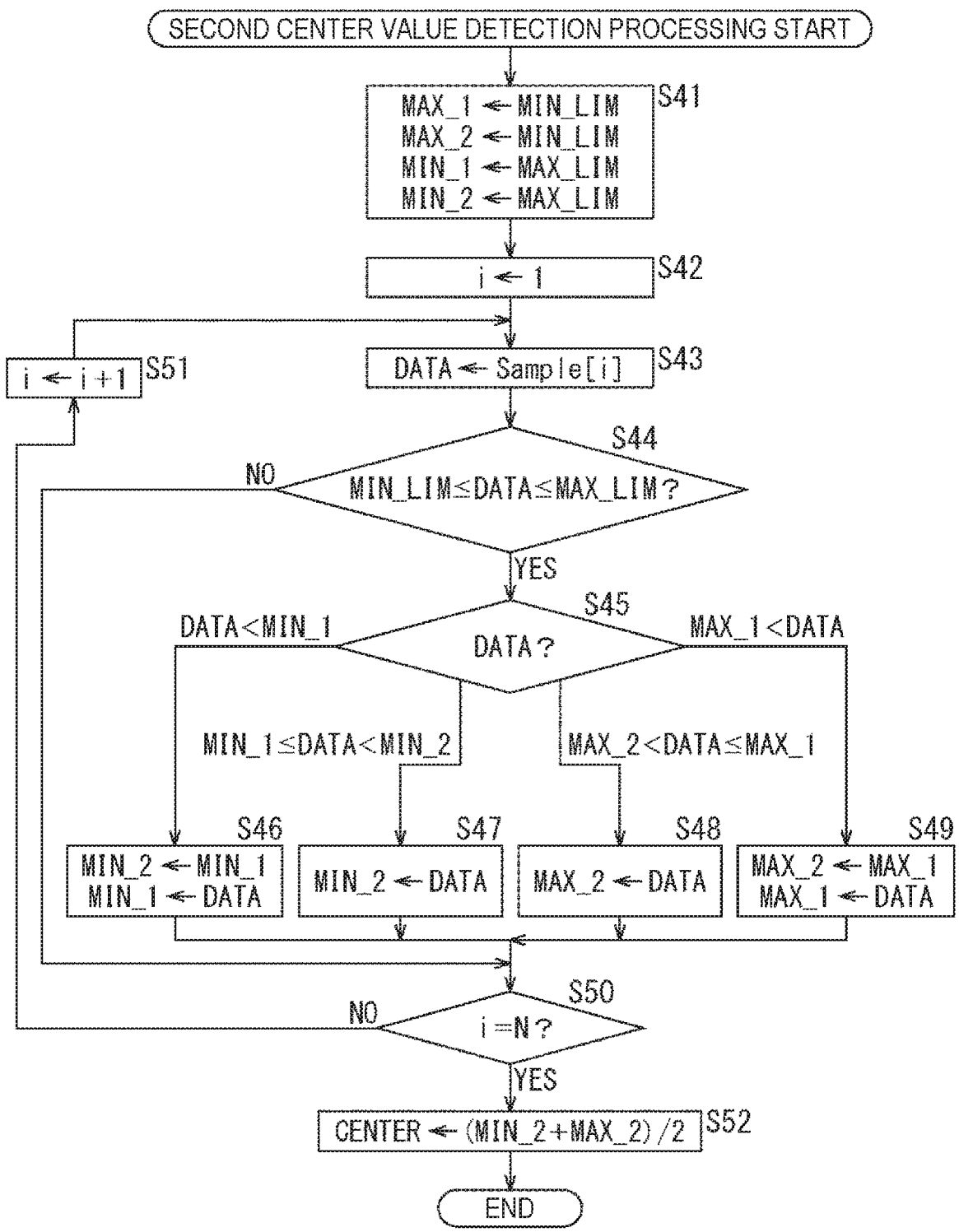
FIG. 28 is a flowchart explaining second center value detection processing.

FIG. 28 is a flowchart of the second center value detection processing that is center value detection processing in a case where the P-phase data center value is detected using the second largest value and the second smallest value.

In this processing, first, in step S41, the center value detection unit 352 sets the minimum value MIN_LIM that the P-phase data can take to a first maximum register value MAX_1 that stores the first largest sample and a second maximum register value MAX_2 that stores the second largest sample. Furthermore, the center value detection unit 352 sets the maximum value MAX_LIM that the P-phase data can take to a first minimum register value MIN_1 storing the first smallest sample and a second minimum register value MIN_2 storing the second smallest sample.

In step S42, the center value detection unit 352 sets 1 to the variable i for counting the number of samples.

In step S43, the center value detection unit 352 sets P-phase data (Sample[i]) extracted as the i-th sample to a variable DATA.

In step S44, the center value detection unit 352 determines whether the variable DATA falls within a range from the minimum value MIN_LIM that the P-phase data can take to the maximum value MAX_LIM that the P-phase data can take (MIN_LIM DATA MAX_LIM), and verifies the validity of the value.

In a case where it is determined in step S44 that the variable DATA does not satisfy MIN_LIM≤DATA≤ MAX_LIM, the processing proceeds to step S50.

On the other hand, in a case where it is determined in step S44 that the variable DATA satisfies MIN_LIM≤DATA≤ MAX_LIM, the processing proceeds to step S45, and the center value detection unit 352 determines which condition the variable DATA satisfies: DATA<MIN_1, MIN_1≤DATA<MIN_2, MAX_2<DATA≤MAX_1, or MAX_1<DATA.

In a case where it is determined in step S45 that the variable DATA satisfies the condition DATA<MIN_1, the processing proceeds to step S46. In a case where it is determined that the condition MIN_1≤DATA<MIN_2 is satisfied, the processing proceeds to step S47. In a case where it is determined that the condition MAX_2<DATA≤MAX_1 is satisfied, the processing proceeds to step S48. In a case where it is determined that the condition MAX_1<DATA is satisfied, the processing proceeds to step S49. In a case where none of the conditions is satisfied, the processing proceeds to step S50.

In a case where it is determined that the variable DATA satisfies the condition DATA<MIN_1, in step S46, the center value detection unit 352 sets the first minimum register value MIN_1 to the second minimum register value MIN_2, and sets the variable DATA to the first minimum register value MIN_1, and the processing proceeds to step S50.

In a case where it is determined that the variable DATA satisfies the condition MIN_1≤DATA<MIN_2, in step S47, the center value detection unit 352 sets the variable DATA to the second minimum register value MIN_2, and the processing proceeds to step S50.

In a case where it is determined that the variable DATA satisfies the condition MAX_2<DATA≤MAX_1, in step S48, the center value detection unit 352 sets the variable DATA to the second maximum register value MAX_2, and the processing proceeds to step S50.

In a case where it is determined that the variable DATA satisfies the condition MAX_1<DATA, in step S49, the center value detection unit 352 sets the first maximum register value MAX_1 to the second maximum register value MAX_2, and sets the variable DATA to the first maximum register value MAX_1, and the processing proceeds to step S50.

In step S50, the center value detection unit 352 determines whether the variable i for counting the number of samples is equal to the predetermined number of samples N, that is, whether the P-phase data has been sampled the predetermined number of times of extraction.

In a case where it is determined in step S50 that the sampling of the P-phase data has not yet been performed the predetermined number of times of extraction, the processing proceeds to step S51, the variable i is incremented by 1, and the processing returns to step S43. Therefore, the P-phase data of the next sample is set in the variable DATA, and the processing of steps S43 to S50 described above is executed.

On the other hand, in a case where it is determined in step S50 that the variable i is equal to the number of samples N, the processing proceeds to step S52, the center value detection unit 352 calculates an average value of the second maximum register value MAX_2 and the second minimum register value MIN_2, determines it as the P-phase data center value CENTER, and the processing ends.

As described above, the center value of the second largest value and the second smallest value of the extracted P-phase data is calculated, and the P-phase data center value can be detected.

Figure 29:
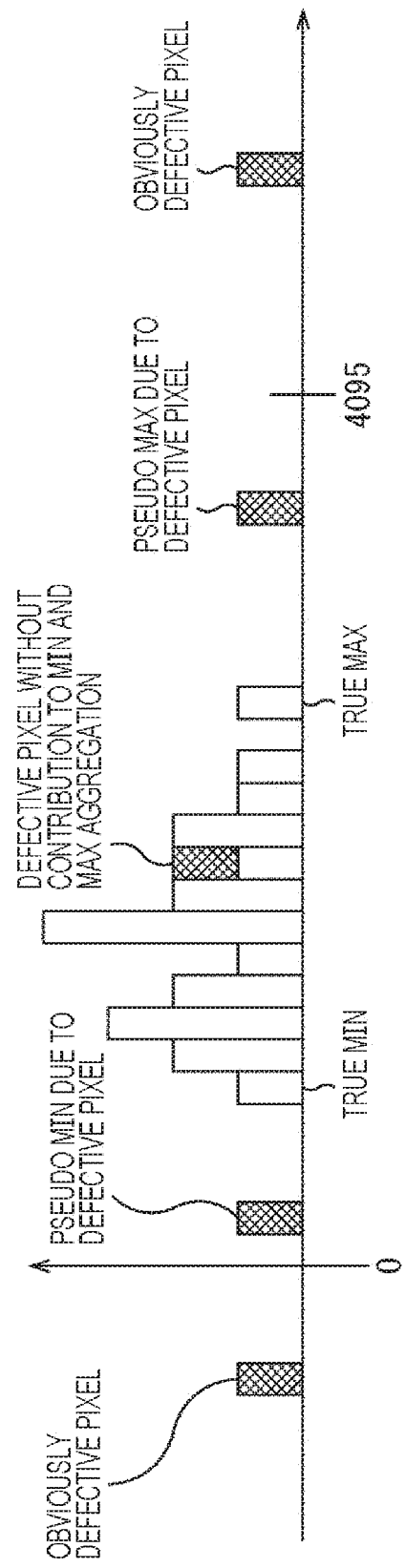
FIG. 29 is a diagram explaining an effect of the second center value detection processing.

An abnormality in P-phase data due to malfunction or failure does not always take an obvious invalid value that the P-phase data cannot take. For example, as illustrated in FIG. 29, it may be buried in the distribution range of the valid sample group, or may be out of the distribution but a value that the P-phase data can take. If it is buried in the distribution range of the valid sample group, it does not correspond to either the maximum value or the minimum value in the sample. Therefore, the P-phase data center value is not affected in a case where the average value of the maximum value and the minimum value is used as the P-phase data center value. However, in a case where the value that deviates from the distribution but the P-phase data can take, it becomes the maximum value or the minimum value, which affects the P-phase data center value.

In the AD conversion, the sweep range during the P-phase ramp period should be set so as to ensure a maximum margin for a normal circuit without failure or malfunction. Therefore, such an abnormal value should not affect the center value.

In the second center value detection processing of FIG. 28, when there is no unobvious illegal data outside the range from the minimum value to the maximum value of normal P-phase data in the sample, the second largest value and the second smallest value are adopted for calculation of the P-phase data center value as a substitute for the maximum value and the minimum value. The differences between the second largest value and the maximum value and between the second smallest value and the minimum value are negligibly small in a case where the sample size is large.

Figure 30:
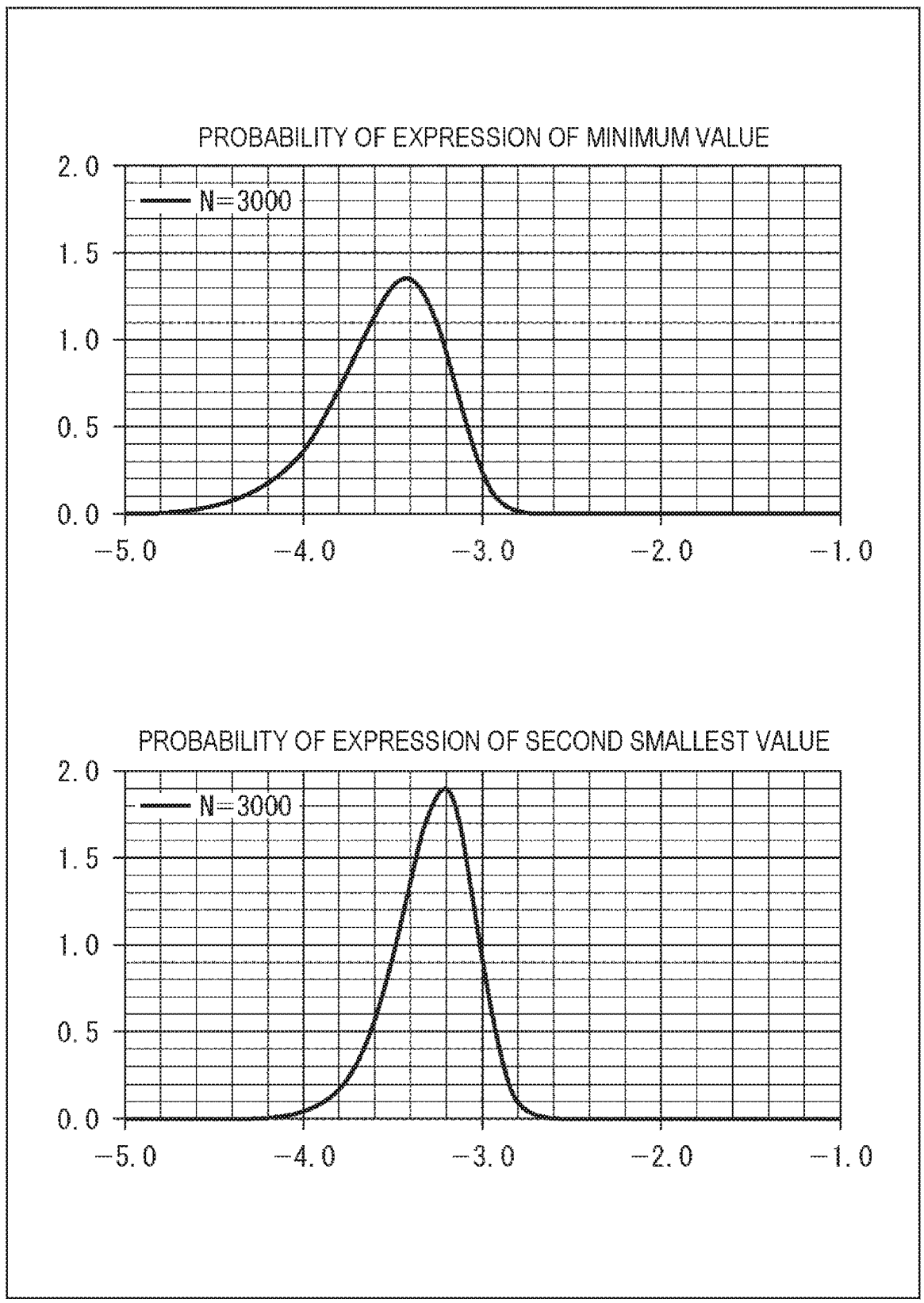
FIG. 30 is a diagram explaining an effect of the second center value detection processing.

FIG. 30 illustrates the probability that the minimum value and the second smallest value are taken when the sample follows the normal distribution as a function of how many times of standard deviation it is far from the distribution average. When the number of samples N is 3000, the smallest value is most likely to appear at 3.4 times the standard deviation, whereas the second smallest value is most likely to appear at 3.2 times the standard deviation, so there is no significant difference.

In the second center value detection processing of FIG. 28, when there is only one unobvious illegal data outside the range from the minimum value to the maximum value of the normal P-phase data in the sample, the minimum value and the maximum value of the valid P-phase data are adopted for calculation of the P-phase data center value. Therefore, if the number of samples to be extracted is appropriately selected so that the number of malfunctions and failures is at most one, the second center value detection processing in FIG. 28 is suitable as a method for detecting the P-phase data center value. In a case where the number of malfunctions and failures is expected to be at most two, it is only required to calculate the P-phase data center value from the third largest value and the third smallest value.

As can be seen from the graph of FIG. 30, the distribution of the second smallest value is narrower than the distribution of the minimum value. The third and fourth distributions are narrower. Therefore, the P-phase data center value obtained by averaging the third or fourth smallest value and the third or fourth largest value has the advantage that the fluctuation is statistically small, and is suitable for detecting the P-phase data center value depending on the number of samples extracted.

In summary, the average value of the N-th maximum value (1<N) and the M-th minimum value (1<M) of extracted P-phase data can be used depending on the number of samples extracted. Also, of course, the P-phase data center value may be calculated using a numerical value other than the average value of the N-th maximum value and the M-th minimum value of the extracted P-phase data. N and M may be the same value or different values as long as they are values greater than 1.

By adopting the configuration that calculates the P-phase data center value from the second or third largest value and smallest value, without being affected by an abnormal sample value from a defective pixel or a malfunctioning pixel mixed in the sample, the P-phase data center value can be accurately detected.

<Example of Center Value Detection Unit Having Hierarchical Structure>

Figure 31:
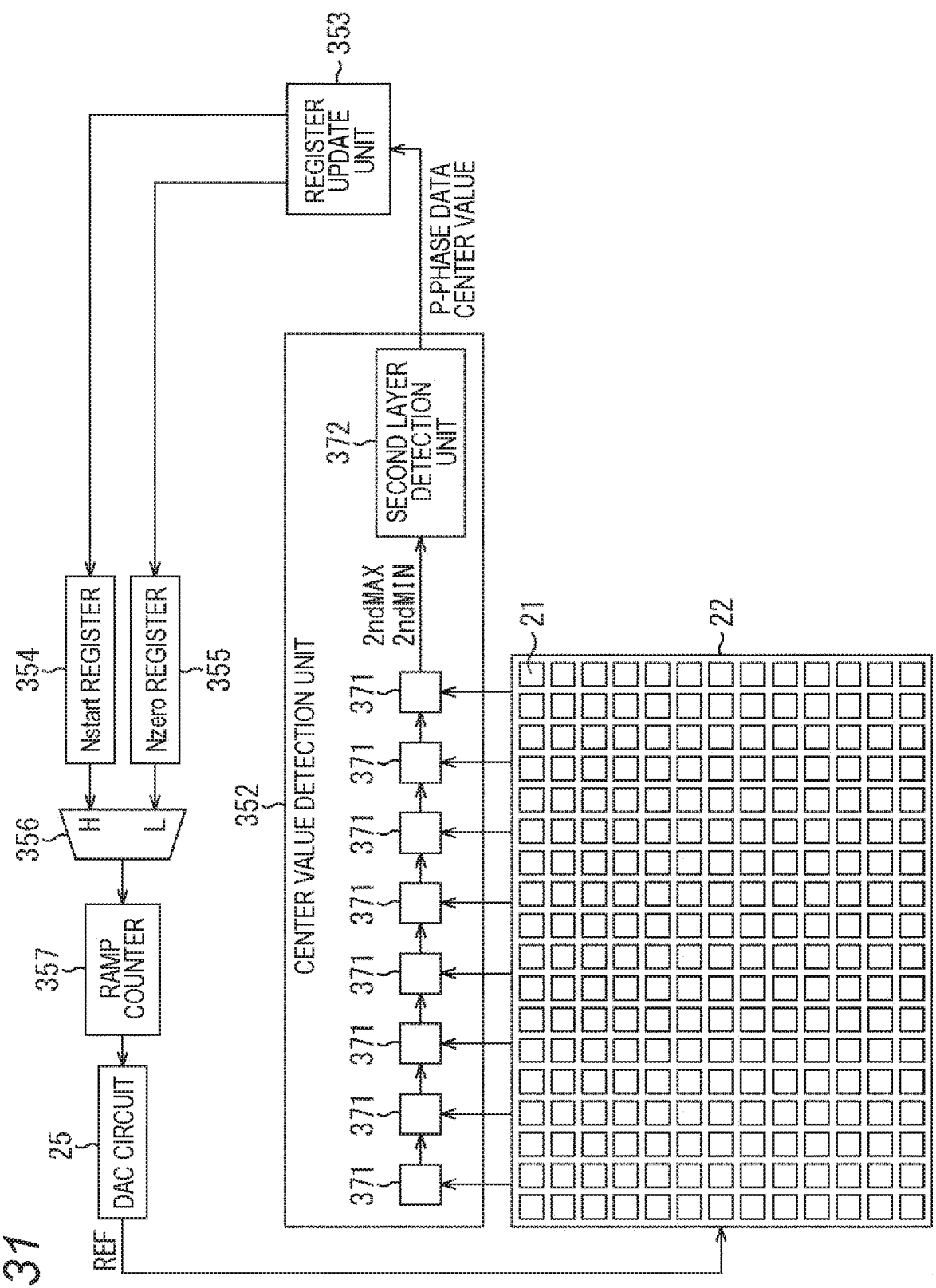
FIG. 31 is a diagram illustrating a configuration example of a center value detection unit having a hierarchical structure.

The center value detection unit 352 can be configured by a hierarchical structure as illustrated in FIG. 31.

FIG. 31 illustrates another configuration example of the center value detection unit 352.

The center value detection unit 352 includes a plurality of first layer detection units 371 provided for each column or a plurality of pixel columns of the pixel array unit 22 in which the pixels 21 are arranged in a two-dimensional array, and a second layer detection unit 372 provided in a subsequent stage thereof.

Each of the plurality of first layer detection units 371 acquires P-phase data transmitted in the column direction from each pixel of the pixel array unit 22, and performs processing similar to the second center value detection processing in FIG. 28 to detect a second maximum value 2ndMAX and a second minimum value 2ndMIN. That is, each first layer detection unit 371 detects the second maximum value 2ndMAX and the second minimum value 2ndMIN in units of one or more pixel columns.

The plurality of first layer detection units 371 transfers the detected second maximum value 2ndMAX and second minimum value 2ndMIN in the row direction by shift register, thereby supplying the detected second maximum value 2ndMAX and second minimum value 2ndMIN to the second layer detection unit 372.

The second layer detection unit 372 detects the second maximum value 2ndMAX and the second minimum value 2ndMIN through the second center value detection processing of FIG. 28 from among the plurality of second maximum values 2ndMAX and the plurality of second minimum values 2ndMIN supplied from the plurality of first layer detection units 371, and detects the P-phase data center value.

With the center value detection unit 352 having the above two-layer structure, the second maximum value 2ndMAX and the second minimum value 2ndMIN are detected in multiple stages, and the P-phase data center value is detected. Therefore, even in a case where any one of the plurality of first layer detection units 371 includes two or more abnormal P-phase data caused by failure or malfunction in the sample and outputs the abnormal value as the second largest value, because the second layer detection unit 372 excludes the value, the P-phase data center value is not adversely affected.

That is, with the center value detection unit 352 having the two-layer structure, it is possible to further enhance the resistance of the detection of the P-phase data center value relative to the occurrence of a defective pixel or a malfunctioning pixel.

Note that the first layer detection unit 371 and the second layer detection unit 372 may detect the third or fourth largest value and the second smallest value instead of detecting the second largest value and the second smallest value. Furthermore, the number of layers may be increased to three or four. Moreover, with respect to the method for calculating the P-phase data center value using a numerical value other than the average value of the N-th maximum value and the M-th minimum value of the extracted P-phase data, the number of layers may be increased to a plurality of layers to perform detection.

<Basic Concept of Updating Register Values>

Figure 32:
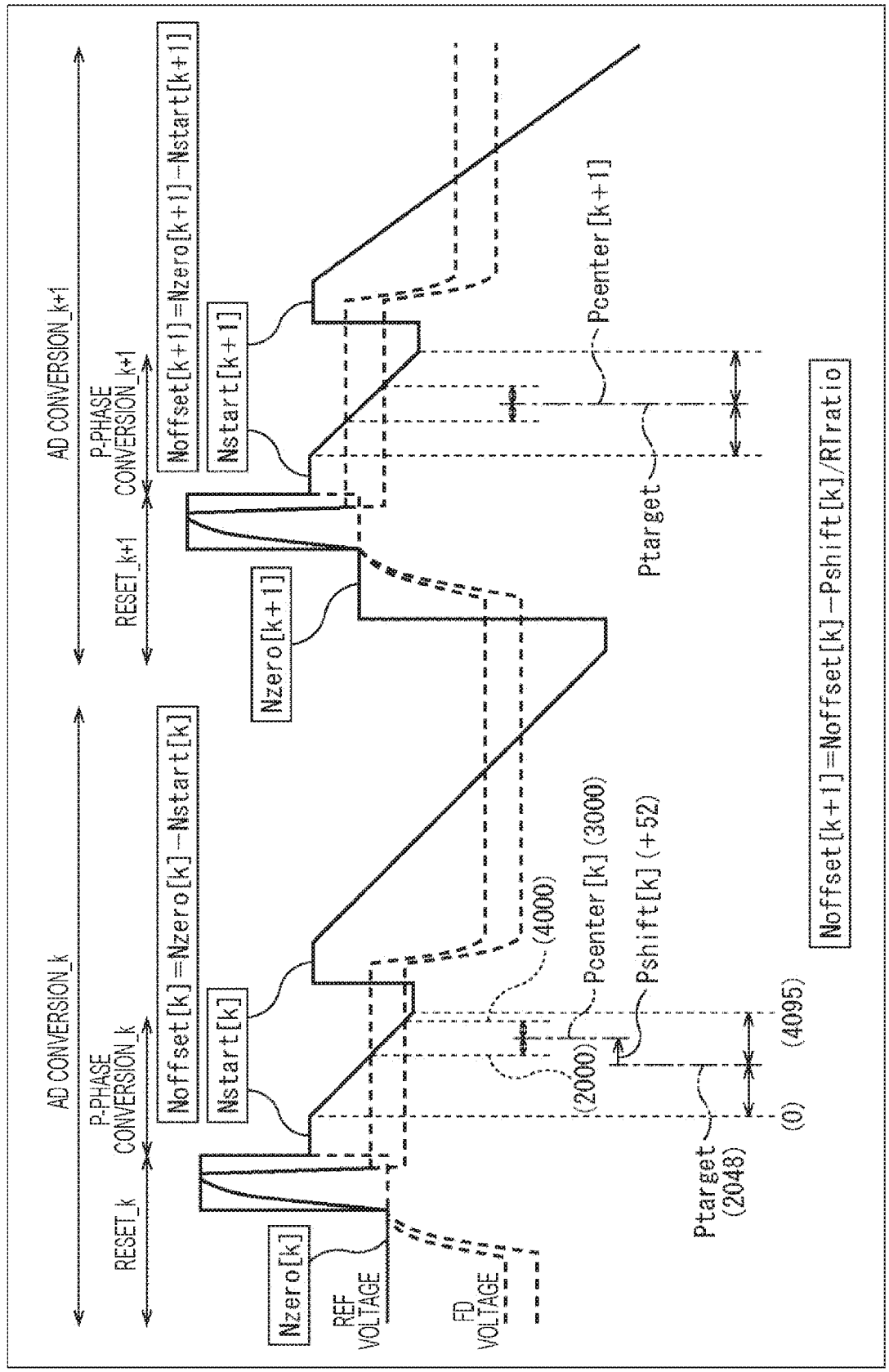
FIG. 32 is a diagram explaining a basic concept of updating a register value.

With reference to FIG. 32, the basic concept of updating the register values stored in the Nstart register 354 and the Nzero register 355 will be described.

FIG. 32 is a diagram illustrating a state in which in two consecutive AD conversions of a k-th frame and a k+1-th frame: AD conversion_k and AD conversion_k+1, the register value for controlling the ramp DAC 201 on the basis of the P-phase data center value detected by the AD conversion_k is updated and reflected on the AD conversion_k+1.

Nzero[k] and Nzero[k+1] are register values (Nzero values) in the AD conversion_k and the AD conversion_k+1 of the Nzero register 355 that is input to the ramp DAC 201 during the reset period. Nstart[k] and Nstart[k+1] are register values (Nstart values) in the AD conversion_k and the AD conversion_k+1 of the Nstart register 354 that is input to the ramp DAC 201 at the start of the P-phase conversion.

A difference Noffset between Nzero and Nstart is defined by the following formula.

$$N\text{offset}[k]=N\text{zero}[k]-N\text{start}[k] \quad (2)$$

$$N\text{offset}[k+1]=N\text{zero}[k+1]-N\text{start}[k+1] \quad (3)$$

Depending on the value of Noffset, a difference occurs in the output of the ramp DAC 201 between the reset period and the start of the P-phase conversion. In a case where the ramp DAC 201 has the configuration illustrated in FIG. 9, the output voltage of the ramp DAC 201 drops as the input numerical value increases. Therefore, the fact that Noffset is positive indicates that the output voltage of the ramp DAC 201 during the reset period where Nzero is input is lower than the output voltage of the ramp DAC 201 at the start of P-phase conversion where Nstart as input.

In the reset period of the AD conversion_k, the FD voltage is raised to a voltage obtained by adding the output voltage of the injection DAC 202 to the output voltage of the ramp DAC 201 in the reset period where Nzero[k] is input, and the RST signal is controlled to Lo and the voltage drops due to feedthrough. The drop voltage is randomly distributed in a certain range due to the characteristic variation of the comparison circuit 51 and KT/C noise of switching. The two broken lines indicating the FD voltage in FIG. 32 indicate the upper limit and the lower limit of the FD voltage distribution of the pixel 21 sampled for detecting the P-phase data center value.

In FIG. 32, for the sake of easy understanding, time codes at a predetermined REF voltage are indicated by a number in parentheses ( ).

For example, the time code generation unit 26 counts from 0 to 4095 during the P-phase conversion, and supplies the time code to the data storage unit 52 of each pixel. Time codes 0 and 4095 are limit values of values that can be acquired as P-phase data.

In the example of FIG. 32, the P-phase data of the pixel 21 corresponding to the upper limit of the FD voltage distribution is 2000, and the P-phase data of the pixel 21 corresponding to the lower limit of the FD voltage distribution is 4000. In this case, the P-phase data center value is detected to be 3000. In this example, the margin with respect to the P-phase data limit value 4095 of the P-phase data, which is the lower limit of the FD voltage distribution is small, which is not P-phase conversion in a preferable state.

The most preferable ideal state is that the P-phase data center value matches an intermediate value 2048 of the limit values at both ends of the P-phase data, and the upper and lower limits of the FD voltage distribution have the same margin with respect to the P-phase limit value.

The deviation in the AD conversion_k from the ideal state is defined by the following formula.

$$P\text{shift}[k]=P\text{center}[k]P\text{target} \quad (4)$$

Here, Pcenter[k] represents the P-phase data center value detected by the AD conversion_k, and Ptarget represents a target value to be taken by the P-phase data center value.

In the example of FIG. 32, since the P-phase data target value is the intermediate value 2048 of the limit values at both ends of the P-phase data, Pshift[k] is a positive value of +52, indicating that the reset FD voltage set on the basis of Nzero[k] is relatively lower than the REF voltage started on the basis of Nstart[k], that is, Noffset[k] is too large.

In order to eliminate this deviation from the ideal, it is only required to update the register value by the next AD conversion_k+1 so that Noffset[k+1] expressed by Formula (3) becomes an appropriate value. An appropriate value of Noffset[k+1] is represented by the following formula (5).

$$N\text{offset}[k+1]=N\text{offset}[k]\text{Rnd}(P\text{shift}[k]/RT\text{ratio}) \quad (5)$$

Here, Rnd(x) represents a function that adopts the nearest integer to x. RTratio in Formula (5) is a numerical value representing how many time codes are incremented while the ramp counter 357 is incremented by one. Generally, the time code is incremented at short time intervals in order to increase the resolution of AD conversion. In contrast, the ramp counter 357 is incremented at longer intervals. Since the REF voltage normally drives a large load capacitance, even when the output of the ramp DAC 201 has somewhat rough level difference, the REF signal supplied to the comparison circuit 51 drops with a waveform that can be seen as a straight line in practical use because of a low-pass filter effect that uses the product of the load capacitance and the drive impedance as a time constant. By increasing the RTratio, the number of gradations of the ramp DAC 201 can be reduced and the DAC circuit 25 can be simplified. Therefore, numerical values such as 4, 8, and 16 are generally used as the RTratio.

In register updating for AD conversion_k+1, values of Nzero[k+1] and Nstart[k+1] are selected to establish Formula (3) with respect to the value of Noffset[k+1] determined by Formula (5). There are many combinations of Nzero[k+1] and Nstart[k+1] that establish Formula (3), but Nzero[k+1] and Nstart[k+1] are numerical values input to the ramp DAC 201 and are non-negative integers, and Nstart[k+1] is an input value of the ramp DAC 201 at the start of the D-phase ramp period, and the smaller the possible value, the longer the sweep range. In consideration of the above, it is desirable to determine Nzero[k+1] and Nstart[k+1] by the following formula (6).

When $N\text{offset}[k+1] \geq 0$ $N\text{zero}[k+1]=N\text{offset}[k+1]$ $N\text{start}[k+1]=0$ When $N\text{offset}[k+1]<0$ $N\text{zero}[k+1]=0$ $$N\text{start}[k+1]=|N\text{offset}[k+1]| \quad (6)$$

Figure 33:
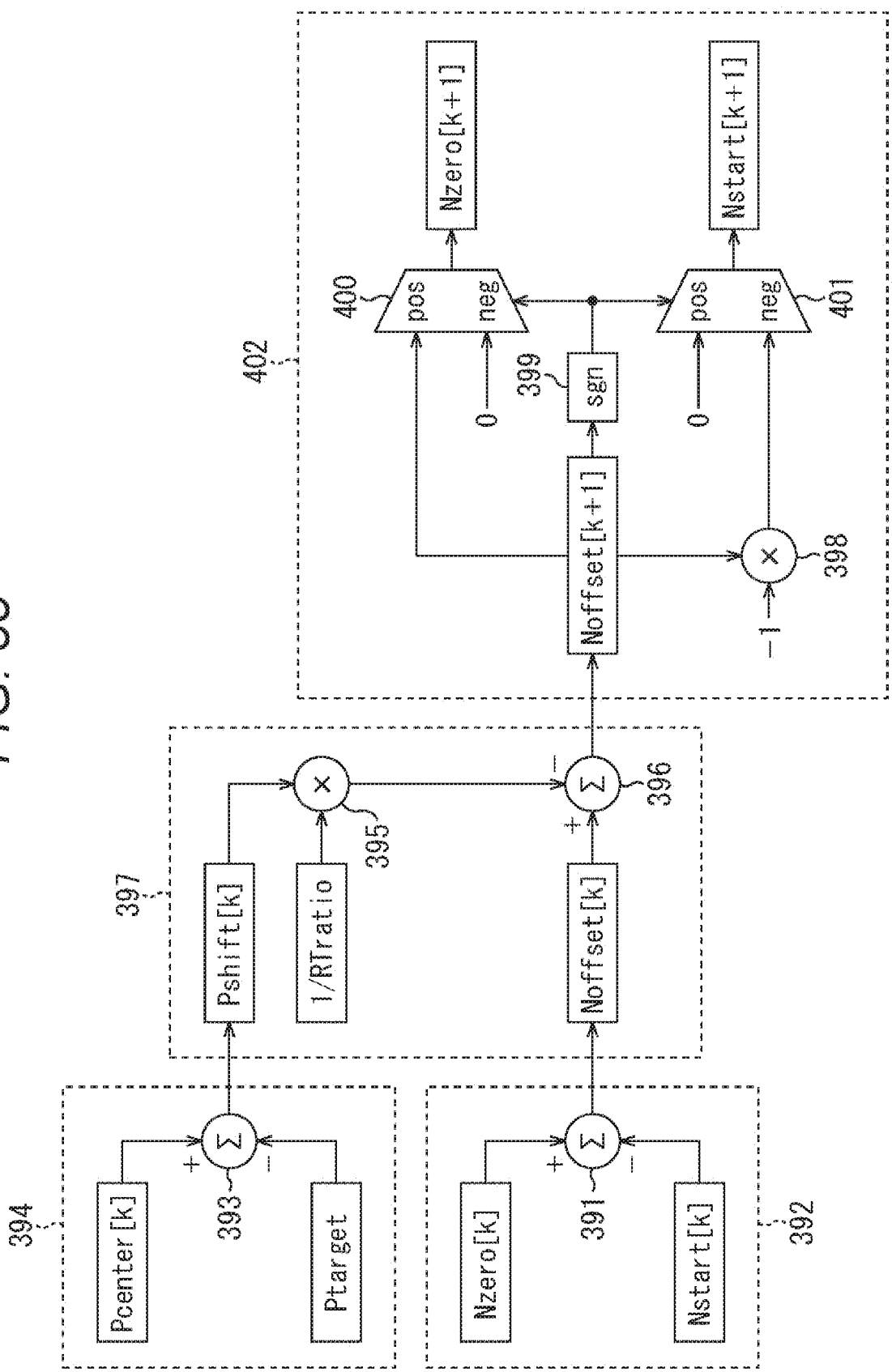
FIG. 33 is a block diagram of a circuit for performing register value update processing in FIG. 32.

FIG. 33 is a block diagram of a circuit for performing the register value update processing described with reference to FIG. 32.

A circuit 392 including an adder 391 is a circuit that performs the arithmetic operation of Formula (2) described above.

A circuit 394 including an adder 393 is a circuit that performs the arithmetic operation of Formula (4) described above.

A circuit 397 including a multiplier 395 and an adder 396 is a circuit that performs the arithmetic operation of Formula (5) described above.

A circuit 402 including a multiplier 398, a sign determiner 399, and selectors 400 and 401 is a circuit that performs the arithmetic operation of Formula (6) described above.

By updating the register value by Formula (6), the P-phase data center value in the AD conversion_k+1 becomes a value very close to the P-phase data target value. However, this is not the case in a case where the upper or lower limit of the reset FD voltage exceeds the limit value of the P-phase data in the AD conversion_k. However, even in that case, by continuing a similar register update in the subsequent AD conversion, the P-phase data center value gradually approaches the P-phase data target value, and in AD conversion following the AD conversion in which the upper and lower limits of the reset FD voltage fall within the limit values at both ends of the P-phase data, the P-phase data center value becomes a value very close to the P-phase data target value. That is, by updating the register value described with reference to FIGS. 32 and 33, fast convergence can be performed in which the register value approaches the ideal state of the P-phase conversion with as few times as possible.

When the register value update processing of FIG. 33 is continued, the Nzero value and the Nstart value become substantially constant values in each AD conversion, and Pshift keeps a small value, but these values are not completely constant but slightly fluctuate. This is because the reset FD voltage differs every time AD conversion is performed due to KT/C noise or the like and the P-phase data center value detected from the sample pixel fluctuates. It is not desirable that the parameters of the circuit operation be different each time for image acquisition. This is because the fluctuation of the parameters may cause streaks in the image or flicker between image frames.

When the amount of feedthrough is unknown and immediately after the AD conversion circuit 42 is activated, the register value greatly fluctuates due to the register value update processing illustrated in FIG. 33, but the fluctuation in the register value converges to a minute one due to P-phase data center value fluctuation through a repetition of multiple updates. If the updating of the register value is stopped at that point of time and the AD conversion is repeated with the same register value thereafter, the AD conversion circuit 42 can continue the AD conversion with a certain operation parameter.

However, when this method is used, after the register value converges and is fixed to a constant value in several AD conversions after activation, the temperature drift and voltage drift due to continuation of AD conversion for a long time cause fluctuations in the feedthrough drop voltage and the output of the DAC circuit 25, it cannot be compensated for to keep Pshift small.

In order to avoid frequent register value updates and follow the drift in the long term regularly, for example, a dead zone is provided in Pshft[k] so that when the absolute value of Pshft[k] exceeds a specific value A, the register value is updated. However, if the absolute value is equal to or smaller than A, a method of not updating the register value can be adopted.

Figure 34:
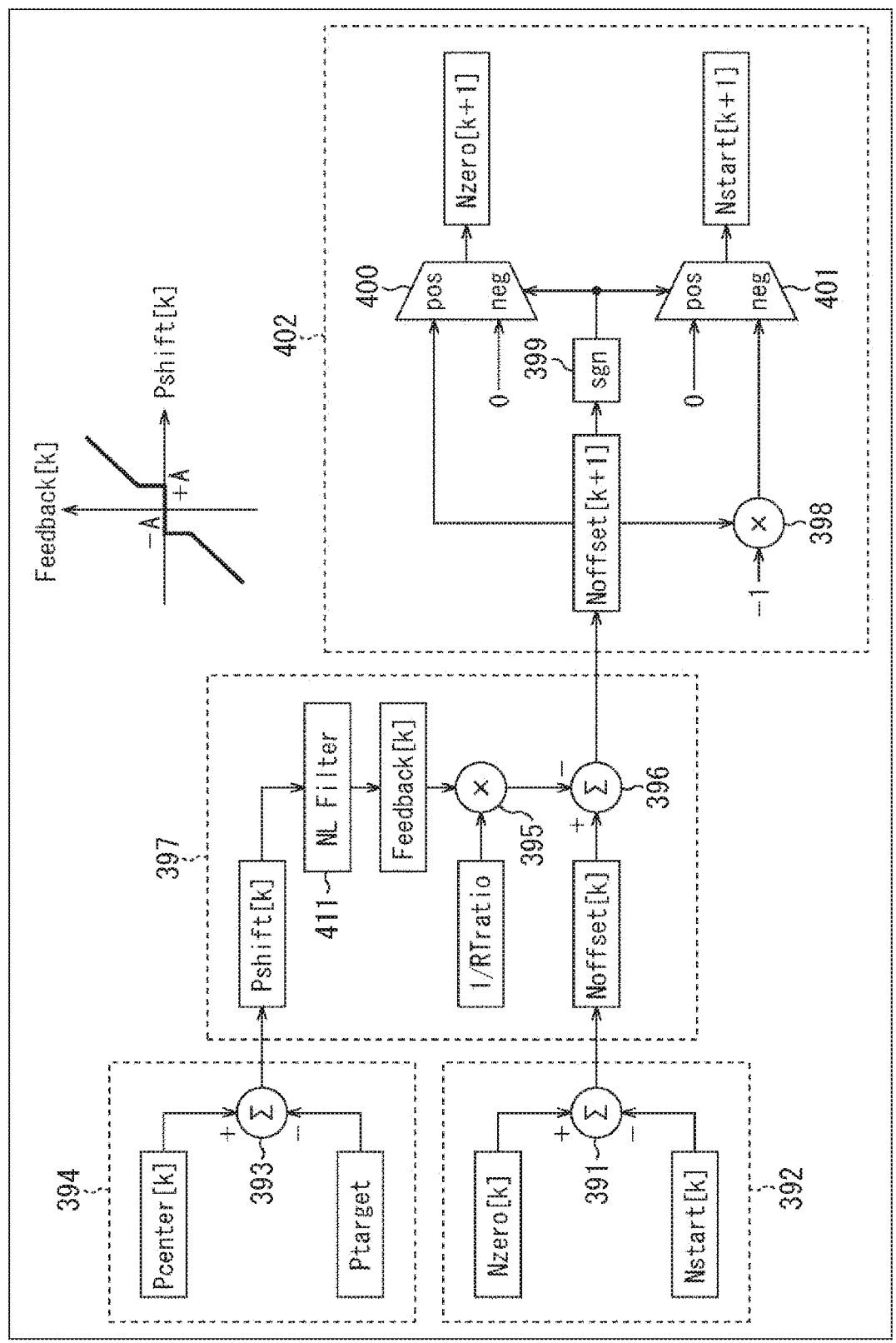
FIG. 34 is a block diagram of a circuit for performing register value update processing having a nonlinear filter.

Such a method can be achieved, for example, by adding a nonlinear filter 411 to the circuit 397 that performs the arithmetic operation of Formula (5), as illustrated in FIG. 34. The nonlinear filter 411 outputs 0 as Feedback[k] when the absolute value of Pshft[k] is equal to or smaller than the specific value A, and otherwise, outputs the input Pshft[k] as Feedback[k] to the multiplier 395.

However, in order to avoid frequent register value updates by the register value update processing of FIG. 34, it is necessary to provide a large dead zone with a large A value. If the dead zone is large, once Pshft[k] reaches a value near the end of the dead zone, it stays in that state for a long time.

In this state, since Pshft[k] is in a state of being not small, it is impossible to completely achieve the purpose of setting the upper and lower limits of the reset FD voltage distribution to have the same margin with respect to the P-phase limit value.

Figure 35A:
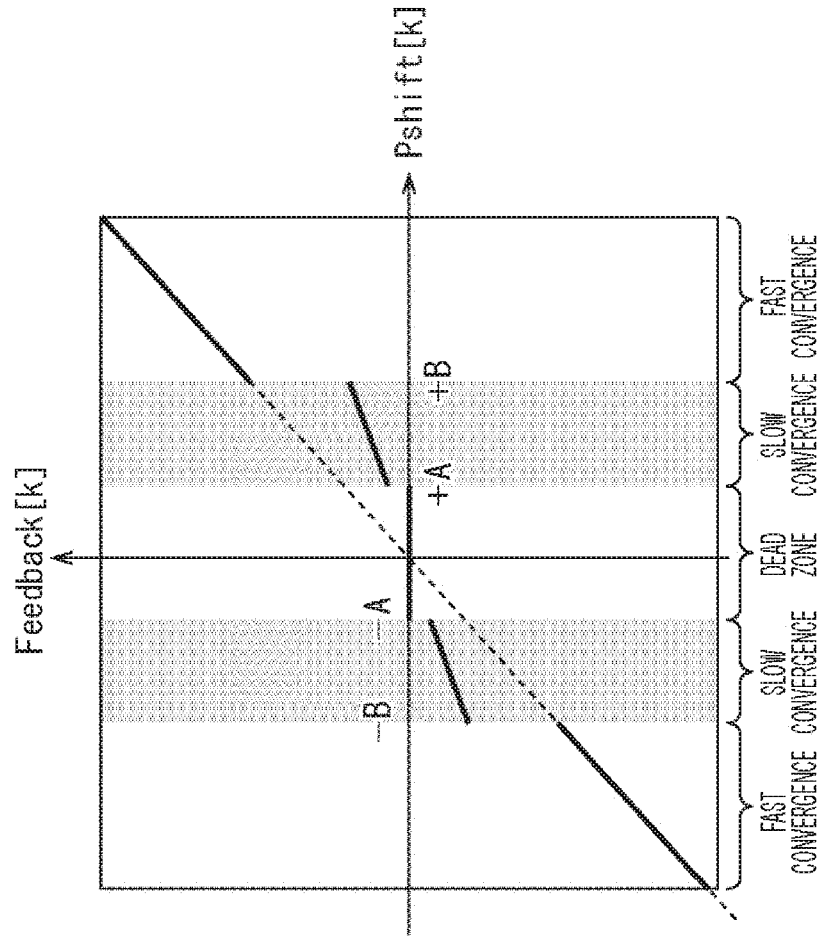
FIGS. 35A and 35B are block diagrams of a circuit for performing register value update processing having a nonlinear filter.

Therefore, in order to avoid frequent updating of the register value regularly and to follow the drift in the long term to keep Pshft at a sufficiently small value, the configuration illustrated in FIG. 35A can be adopted as the nonlinear filter 411 of FIG. 34.

The nonlinear filter 411 illustrated in FIG. 35A selects one of Case 1: 0 regardless of input, Case 2: the value obtained by attenuating the moving average of input, and Case 3: the value of the input itself, and outputs it as Feedback[k]. Cases 1 to 3 are selected based on the absolute value of the input Pshft[k]. Case 3 is selected in a case where the absolute value of Pshft[k] exceeds the specific value B, Case 2 is selected in a case where the absolute value of the moving average of the input value exceeds the specific value A, and Case 1 is selected in a case where the absolute value of the moving average of the input values is equal to or smaller than the specific value A.

Figure 35B:
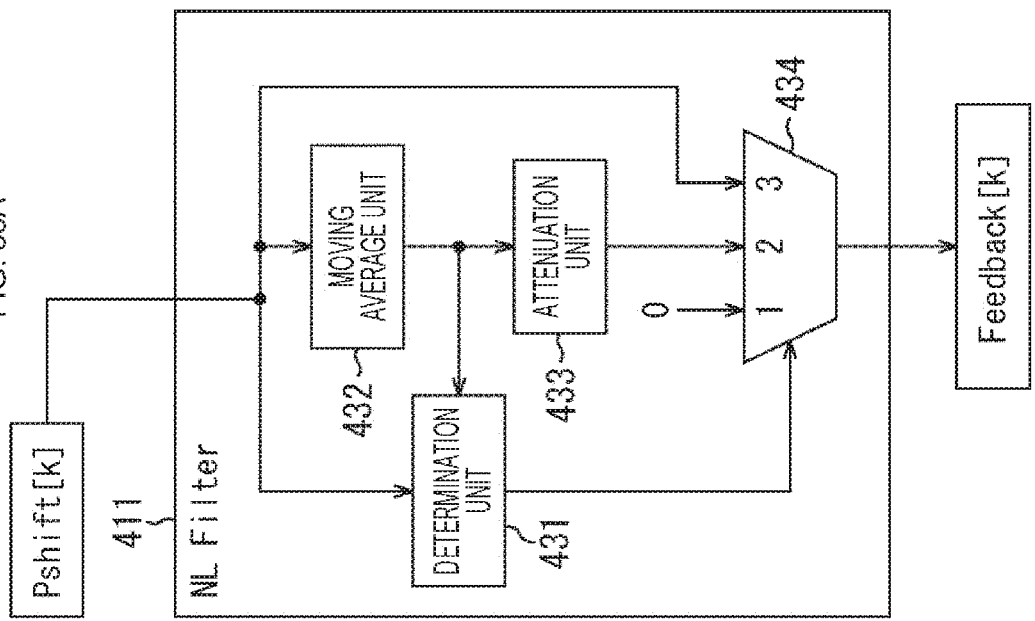

FIG. 35B is a graph illustrating input/output data by the nonlinear filter 411 of FIG. 35A in a case where the data series of the input Pshft[k] continuously takes the same value.

With the nonlinear filter 411 of FIG. 35A, in a case where the absolute value of the input Pshft[k] exceeds a specific value B, the output Feedback[k] becomes the same as the input Pshft[k], and equivalent to the circuit of FIG. 33. Accordingly, as long as the reset FD voltage distribution in the AD conversion_k from which Pshft[k] is calculated falls within the range of the limit value of the P-phase data, register value update by which Pshift[k+1] becomes a value close to 0 in the next AD conversion_k+1, and the nonlinear filter 411 attempts fast convergence. Fast convergence is performed on the basis of the reset FD voltage which fluctuates due to the KT/C noise of the sample pixel or the like. Therefore, the input Pshift[k+1] does not always become 0 in the next AD conversion_k+1.

On the other hand, in a case where the absolute value of the input Pshft[k] is a sufficiently small value, it is not necessary to update the register value anymore, and rather, it is better to repeat the AD conversion while keeping the state of the AD conversion circuit 42 with the fixed register value.

The nonlinear filter 411 of FIG. 35A takes a moving average of the latest several values of the Pshift input sequence in order to avoid the influence of fluctuation, and sets the output Feedback [k] to 0 when the absolute value is equal to or less than the specific value A. Therefore, the value of Noffset[k+1] is not updated from the value of Noffset[k], and therefore neither the Nzero value nor the Nstart value is updated. In other words, when the input Pshft[k] ranges from −A to A, it becomes a dead zone relating to Pshift.

In a case where the absolute value of the moving average value of the data series of the input Pshft[k] exceeds the specific value A, but the absolute value of the input Pshift[k] is equal to or less than the specific value B, the nonlinear filter 411 attenuates the moving average value to obtain output Feedback[k]. Thus, from the state where Pshft[k] in this range occurs to the dead zone, slow convergence is executed in which the register value is updated intermittently and in a small width.

The nonlinear filter 411 of FIG. 35A includes a determination unit 431, a moving average unit 432, an attenuation unit 433, and a selector 434.

The determination unit 431 determines one of Cases 1 to 3 on the basis of the input Pshft[k] and the moving average value of the data series, and outputs it to the selector 434. The moving average unit 432 calculates a moving average value of the data series of the input Pshft[k], and supplies the moving average value to the determination unit 431 and the attenuation unit 433. The attenuation unit 433 performs attenuation processing on the moving average value of the data series of the input Pshft[k], and outputs the processed value to the selector 434.

In the update of the register value using the nonlinear filter 411 in FIG. 35A, when the amount of feedthrough amount is unknown and immediately after the AD conversion circuit 42 is activated, fast convergence is performed, the absolute value of Pshft[k] becomes equal to or less than the specific value B. Next, by slow convergence, a register value is reached such that the absolute value of Pshft[k] becomes equal to or less than the specific value A, and the register value is not updated.

Figure 36:
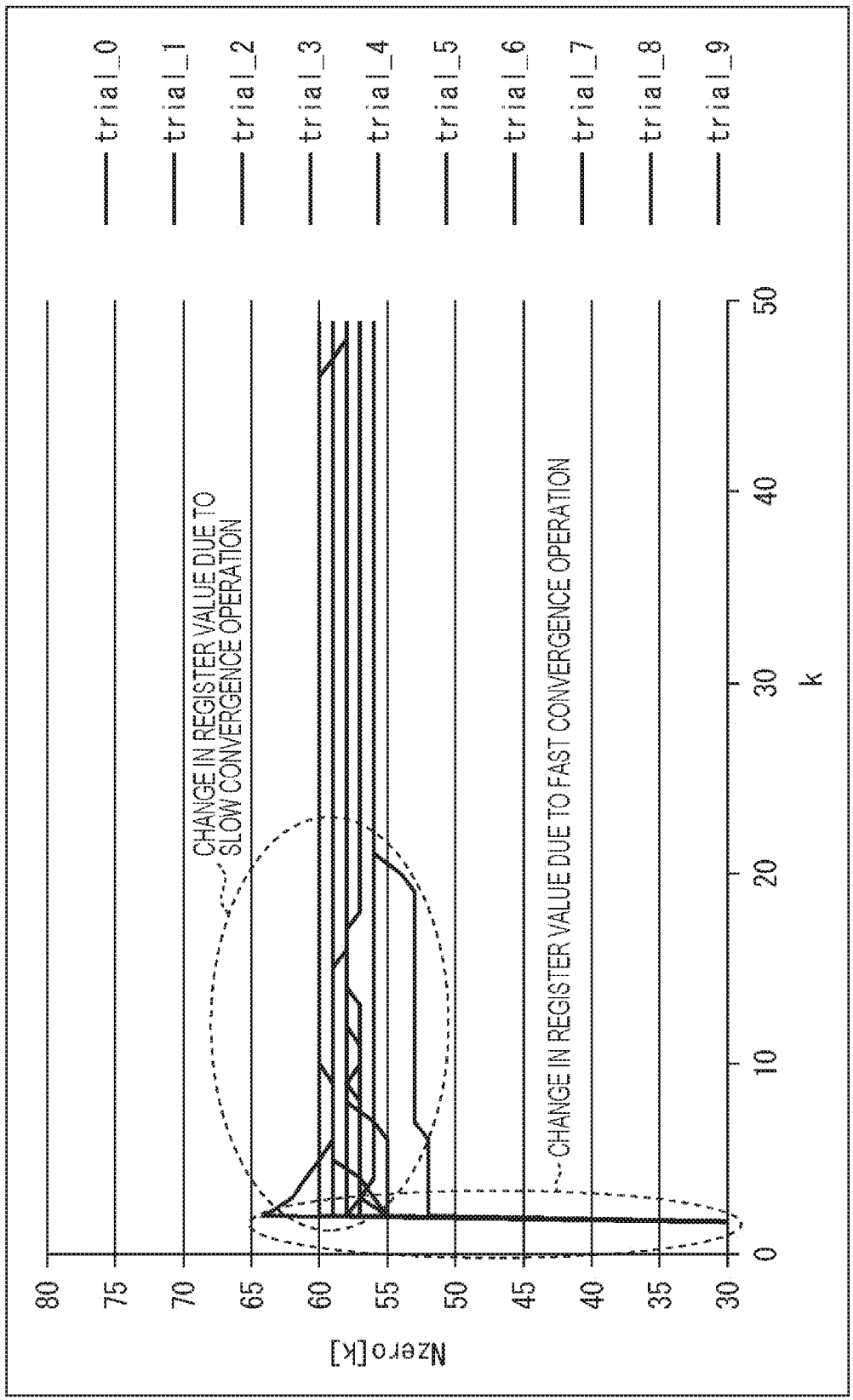
FIG. 36 is a diagram illustrating a simulation result of a register value update circuit in FIGS. 35A and 35B.

FIG. 36 is a graph illustrating simulation results obtained by updating the register value using the nonlinear filter 411 of FIGS. 35A and 35B. In the simulation of FIG. 36, KT/C noise is generated by a random number model.

According to the simulation results of FIG. 36, after the fast convergence operation is performed from the number of times of update k=2 to 3, and a change in register values change due to the slow convergence operation up to about k=20 occurs sporadically. Thereafter, register update is rarely performed.

When the register value update processing using the nonlinear filter 411 of FIG. 35A is continued, Pshift once converges within the dead zone after activation, and thereafter, in a case where Pshift that deviates from the dead zone due to temperature drift and power supply drift occurs, slow convergence is performed again, and the relative relationship between the reset FD voltage distribution and the REF voltage in P-phase conversion is appropriately maintained.

Thus, on the basis of a difference in absolute value between the detected P-phase data center value and the desired P-phase data target value, a fast convergence zone, a slow convergence zone, and a dead zone are set, and feedback with different sensitivities is performed. As a result, the control parameters of the REF ramp waveform of the ramp DAC 201 does not needlessly repeat fluctuation little by little, but continue to adapt to the state fluctuation due to the drift, thereby always generating the optimum REF ramp waveform.

14. Fifth Embodiment of DAC Circuit

Figure 37:
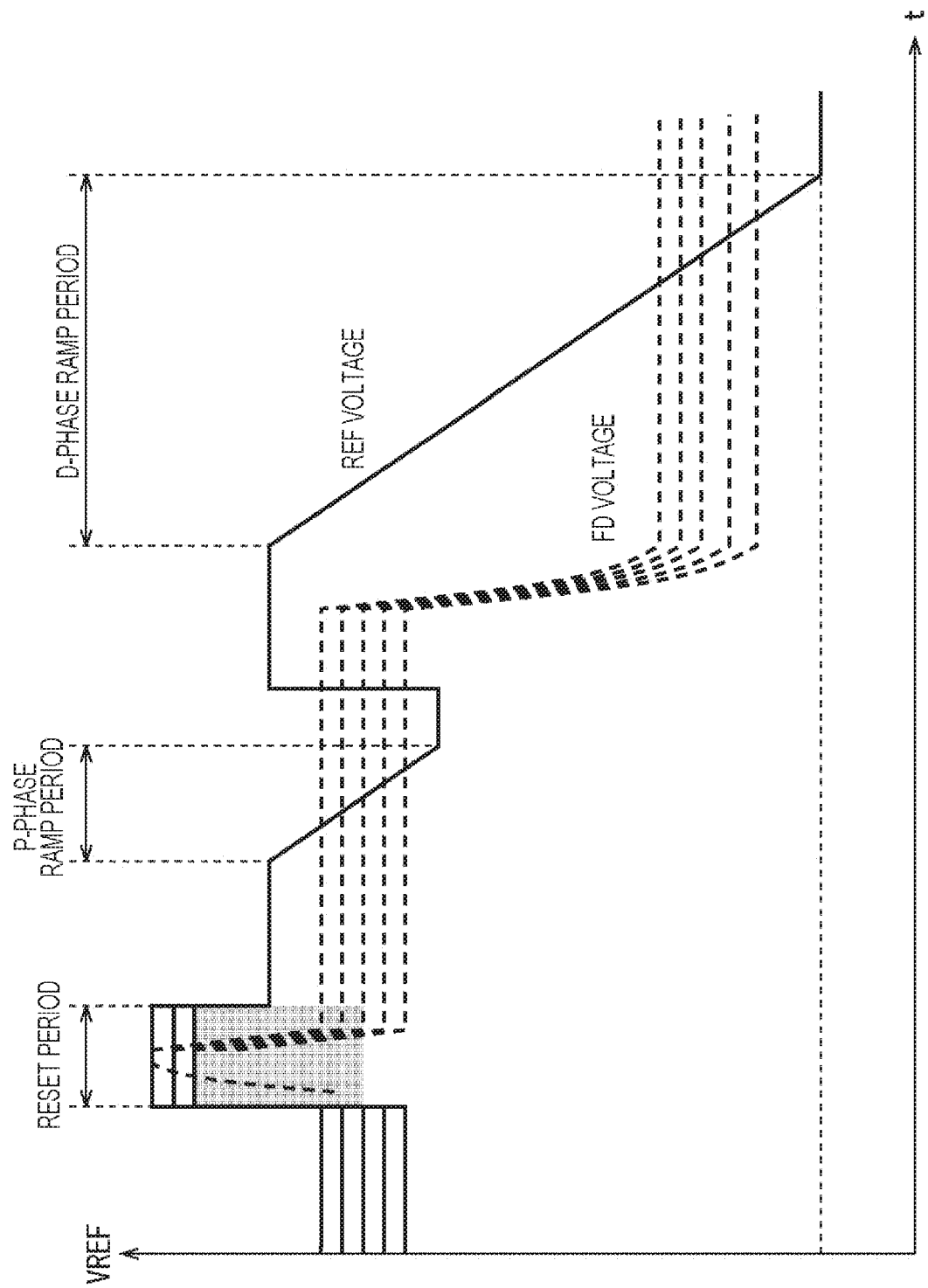
FIG. 37 is a diagram illustrating an example of control by a combination of the timing generation circuit of FIG. 25 and the DAC circuit of the second embodiment.

In a case where the configuration of a combination of the timing generation circuit 29 illustrated in FIG. 25 and the DAC circuit 25 of the second embodiment of FIG. 16 using a fixed bias is adopted, a change in the REF voltage waveform and the FD voltage waveform by changing the register value is as illustrated in FIG. 37. When the input setting of the injection DAC 202 is appropriate, Noffset does not become negative, the Nstart value is always 0, and only the Nzero value changes. The fact that the Nstart value is always 0 and the bias voltage is fixed means that the start voltage of the P-phase ramp period is always constant, and the REF ramp waveform (P-phase ramp waveform) during the P-phase ramp period does not change. Therefore, the adjustment of the relative relationship between the reset FD voltage and the REF voltage during the P-phase ramp period is performed, such that the reset FD voltage is adjusted to the center of the P-phase ramp waveform. The adjustment is performed by updating the register value, and the REF voltage at the time of reset is adjusted. As a result, the center of distribution of the reset FD voltage matches the center voltage of the P-phase ramp waveform.

The center voltage of the P-phase ramp waveform is a voltage that is lower than the start REF voltage of the P-phase ramp period by half the sweep voltage width during the P-phase ramp period. Since the start REF voltage of the P-phase ramp period and the sweep voltage width of the P-phase ramp period also change when the AD conversion gain changes, the center voltage of the P-phase ramp waveform also changes, and the center of the distribution of the reset FD voltage also changes.

The reset FD voltage has an ideal value (ideal voltage) that is determined based on the requirements for the amount of saturated charge and leak charge as described above. Therefore, it is desirable to adjust the center voltage of the P-phase ramp waveform to the ideal voltage without depending on the AD conversion gain.

Figure 38:
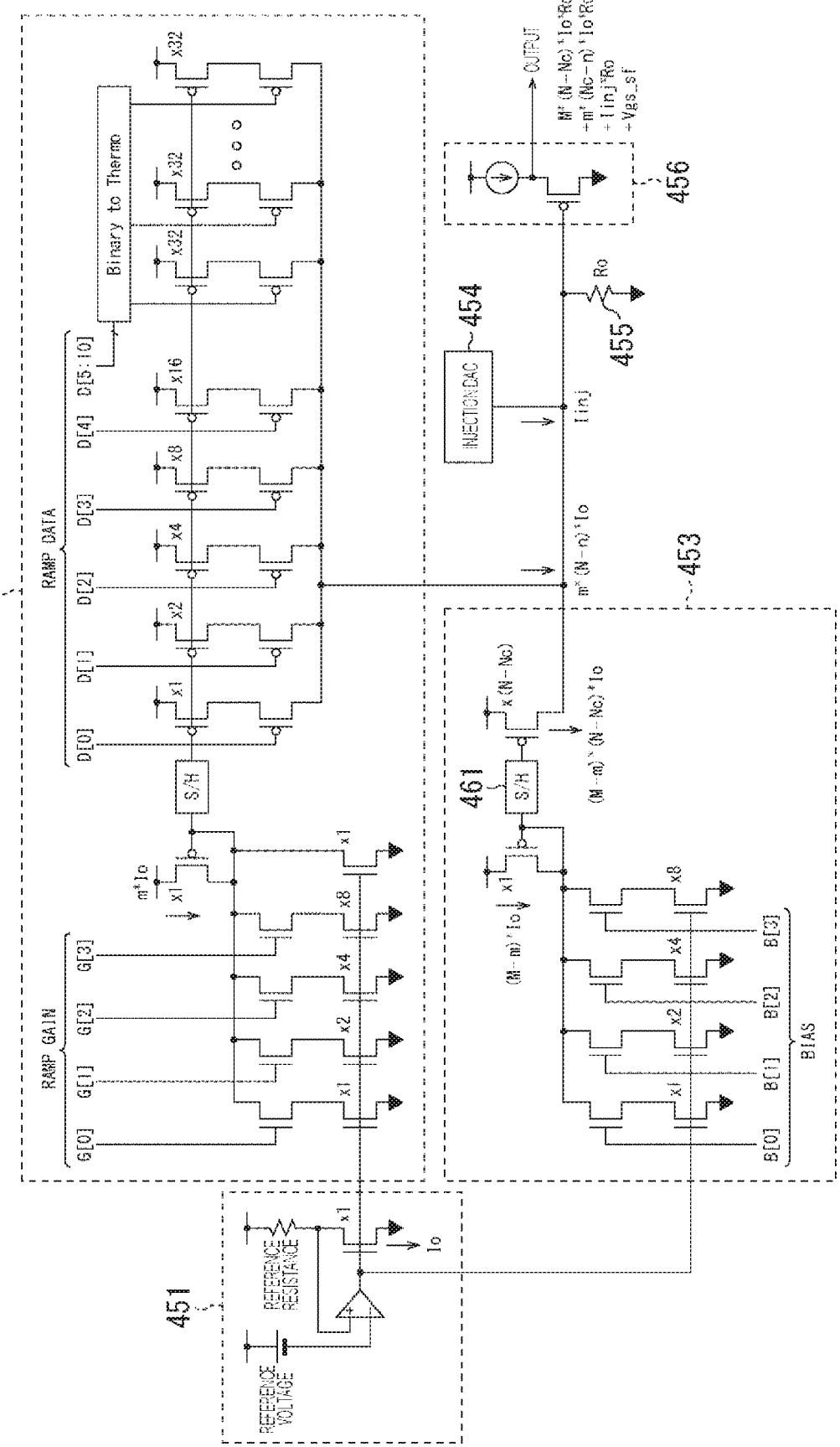
FIG. 38 is a diagram illustrating a circuit configuration of a fifth embodiment of the DAC circuit.

FIG. 38 illustrates a configuration example of the DAC circuit 25 in which the center voltage of the P-phase ramp waveform can be adjusted to an ideal voltage without depending on the AD conversion gain, which is the fifth embodiment of the DAC circuit 25.

The DAC circuit 25 of FIG. 38 includes a reference current generation circuit 451, a ramp DAC 452, a bias DAC 453, an injection DAC 454, a load resistor 455, and a source follower circuit 456.

The reference current generation circuit 451 supplies a reference current Io to the ramp DAC 452 and the bias DAC unit 453. The ramp DAC 452 is similar to the ramp DAC 201 of FIG. 9 without the reference current generation circuit 231, and the injection DAC 454 is similar to the injection current generation unit 243 of the injection DAC 202 of FIG. 10. The bias DAC 453 outputs current obtained when reference current Io supplied from the reference current generation circuit 451 is multiplied by a predetermined number according to a numerical value (bias setting input BIAS) input to the bias setting bus B[0:3] and is held and output by the sample-hold circuit 461, to the load resistor 455.

Here, when the value of the gain setting bus G[0:3] given to the ramp DAC 452 is m, a value of (M-m) where M is a fixed value is input to the bias setting bus B[0:3] of the bias DAC 453. The ratio of the output current of the ramp DAC 452 to the master transistor current when 0 is given to the ramp data bus D[0:10] of the ramp DAC 452 is N, and when the value of the ramp data bus D[0:10] given to the ramp DAC 452 at the center of the P-phase ramp waveform is Nc, the bias DAC 453 multiplies the reference current Io by (M−m)*(N−Nc) and applies a current to the load resistor 455.

When the value of the ramp data bus D[0:10] given to the ramp DAC 452 is n, the current output of the ramp DAC 452 is m*(N−n)*Io. Since the sum of the output current of the bias DAC 453, the output current of the ramp DAC 452, and the output current Iinj of the injection DAC 454 is applied to the load resistor 455 of the resistor Ro, the output voltage Vref of the DAC circuit 25 in FIG. 38 is represented by the following formula (7) where the offset voltage of the source follower circuit 456 is Vgs_sf.

$$Vref = M*(N-Nc)*Io*Ro + m*(Nc-n)*Io*Ro + Iinj*Ro + Vgs\_sf \quad (7)$$

The center voltage Vpcenter of the P-phase ramp waveform is given by the following formula (8) in which n=Nc and Iinj=0 are substituted in Formula (7).

$$Vpcenter = M*(N-Nc)*Io*Ro + Vgs\_sf \quad (8)$$

Formula (8) indicates that the center voltage of the P-phase ramp waveform is a constant independent of the gain setting of the ramp DAC 452, that is, the value m of the gain setting bus G[0:3].

Therefore, by adjusting the bias voltage using the bias DAC 453, the DAC circuit 25 of FIG. 38 can adjust the center voltage of the P-phase ramp waveform to be the ideal voltage without depending on the AD conversion gain. The setting of the reset FD voltage can be performed by the parameter M of the value (M−m) input to the bias setting bus B [0:3] of the bias DAC 453.

15. Control Variation Example of DAC Circuit of the Third Embodiment

Figure 39:
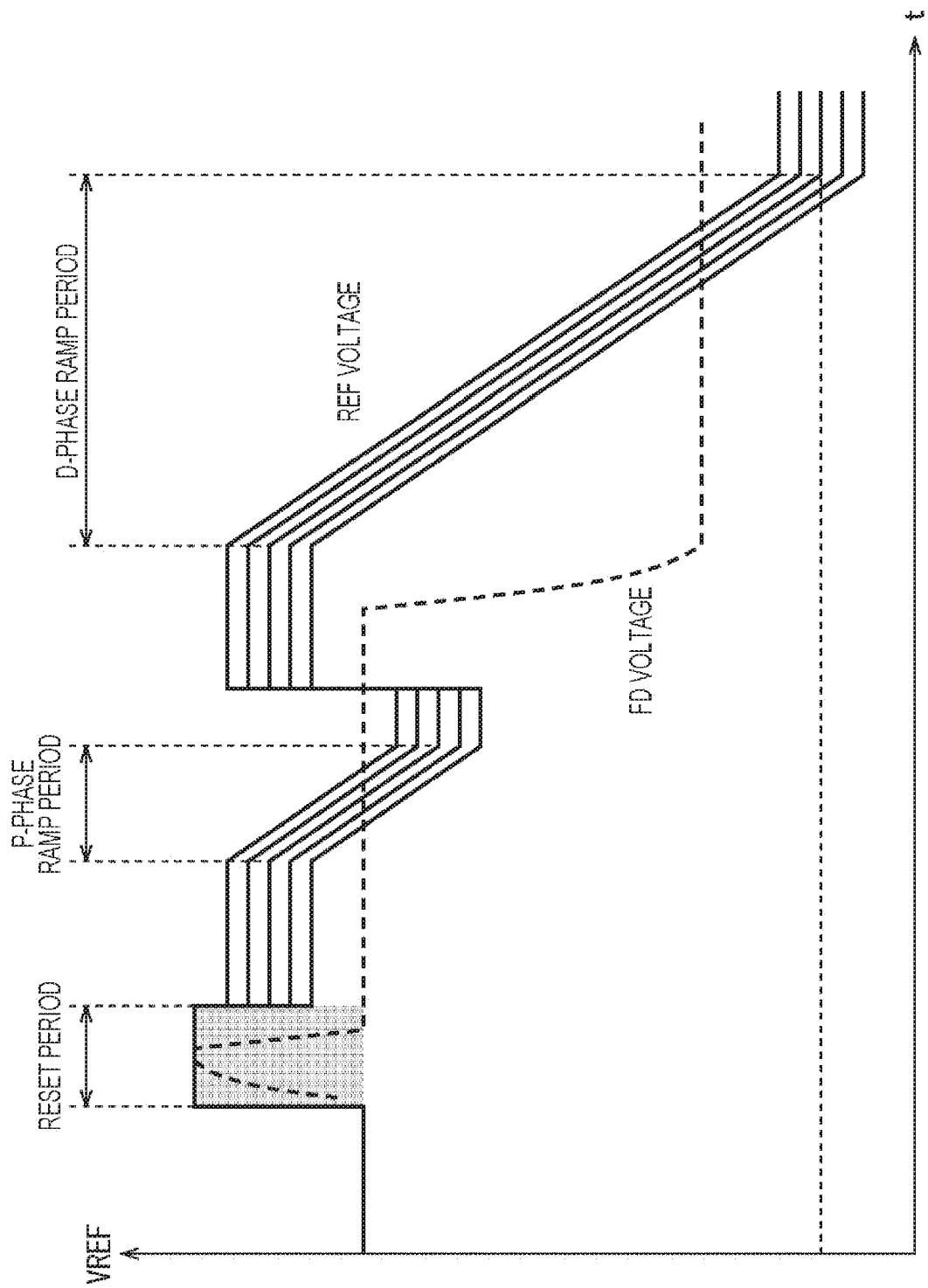
FIG. 39 is a diagram illustrating an example of control by a combination of the timing generation circuit of FIG. 25 and the DAC circuit of the third embodiment.

Next, in a case where the configuration of a combination of the timing generation circuit 29 illustrated in FIG. 25, the sample-hold circuit 291, and the DAC circuit 25 of the third embodiment of FIG. 19 using the feedback circuit is adopted, a change in the REF voltage waveform and the FD voltage waveform by changing the register value is as illustrated in FIG. 39.

The time origin in FIG. 39 corresponds to the time t13 in FIG. 22. In this case, what changes by the change in the Nzero value are the start voltage of the P-phase ramp waveform and the P-phase ramp waveform, and the reset FD voltage does not change.

However, even when the REF voltage during reset is controlled by giving the target voltage using the feedback circuit of FIG. 19, the reset FD voltage does not match the target voltage unless the output voltage of the injection DAC 202 matches the feedthrough drop voltage.

In order to bring the reset FD voltage close to the target voltage, the output voltage of the injection DAC 202 must be as close as possible to the feedthrough drop voltage. However, since the control of the absolute value of the reset FD voltage has a large allowable range as described above, even if the gradation voltage of the injection DAC 202 is not so fine, it is only required to set the input of the injection DAC 202 to the appropriate nearest value such that the output voltage of the injection DAC 202 matches the feedthrough drop voltage within the allowable range.

Figure 40:
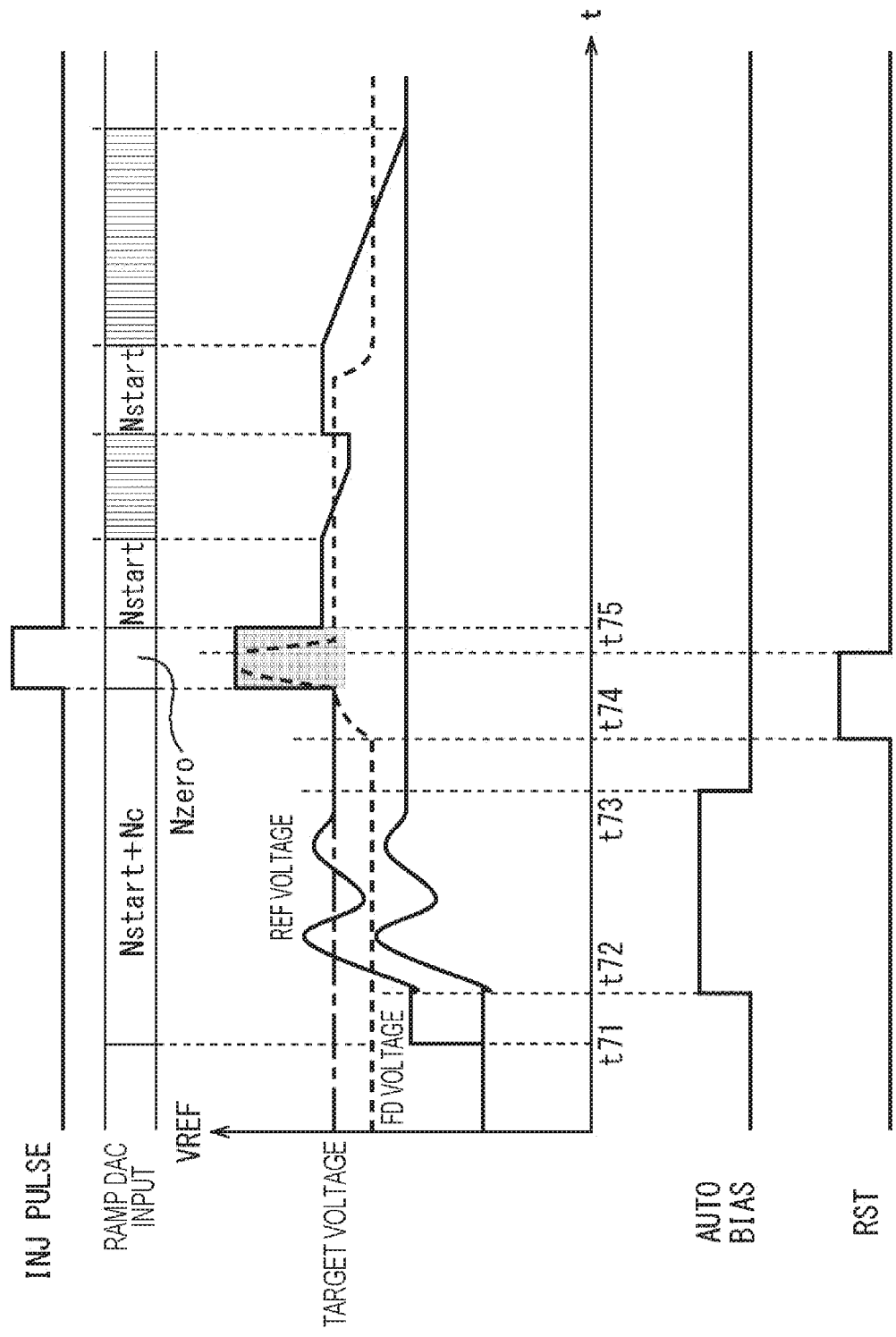
FIG. 40 is a diagram illustrating another example of control by a combination of the timing generation circuit of FIG. 25 and the DAC circuit of the third embodiment.

In order to strictly control the reset FD voltage by combining the DAC circuit 25 of the third embodiment of FIG. 19 and the timing generation circuit 29 illustrated in FIG. 25, the DAC circuit 25 of FIG. 19 performs the control as illustrated in FIG. 40.

In the timing chart of FIG. 40, the value of (Nstart+Nc), that is, the value to output the center voltage of the P-phase ramp waveform is input to the ramp DAC 201 during the period from time t72 to time t73 when the AUTOBIAS pulse is active and the feedback circuit is valid. As a result, the bias output is held at a bias voltage such that the center voltage of the P-phase ramp waveform matches the target voltage.

During the period when the next injection DAC 202 is outputting, the Nzero value is input to the ramp DAC 201. In a case where the output voltage of the injection DAC 202 does not completely match the feedthrough drop voltage, the Nzero value is adjusted by continuing the register update processing by the timing generation circuit 29 of FIG. 25, and the reset FD voltage is distributed around the center voltage of the P-phase ramp waveform, that is, the target voltage.

16. Acquisition of P-Phase Data by Light-Shielded Pixel

In the above-described embodiment, the pixels for acquiring the P-phase data are not particularly limited for each pixel of the pixel array unit 22, but an example in which the pixels are limited to the light-shielded pixels will be described below.

Figure 41:
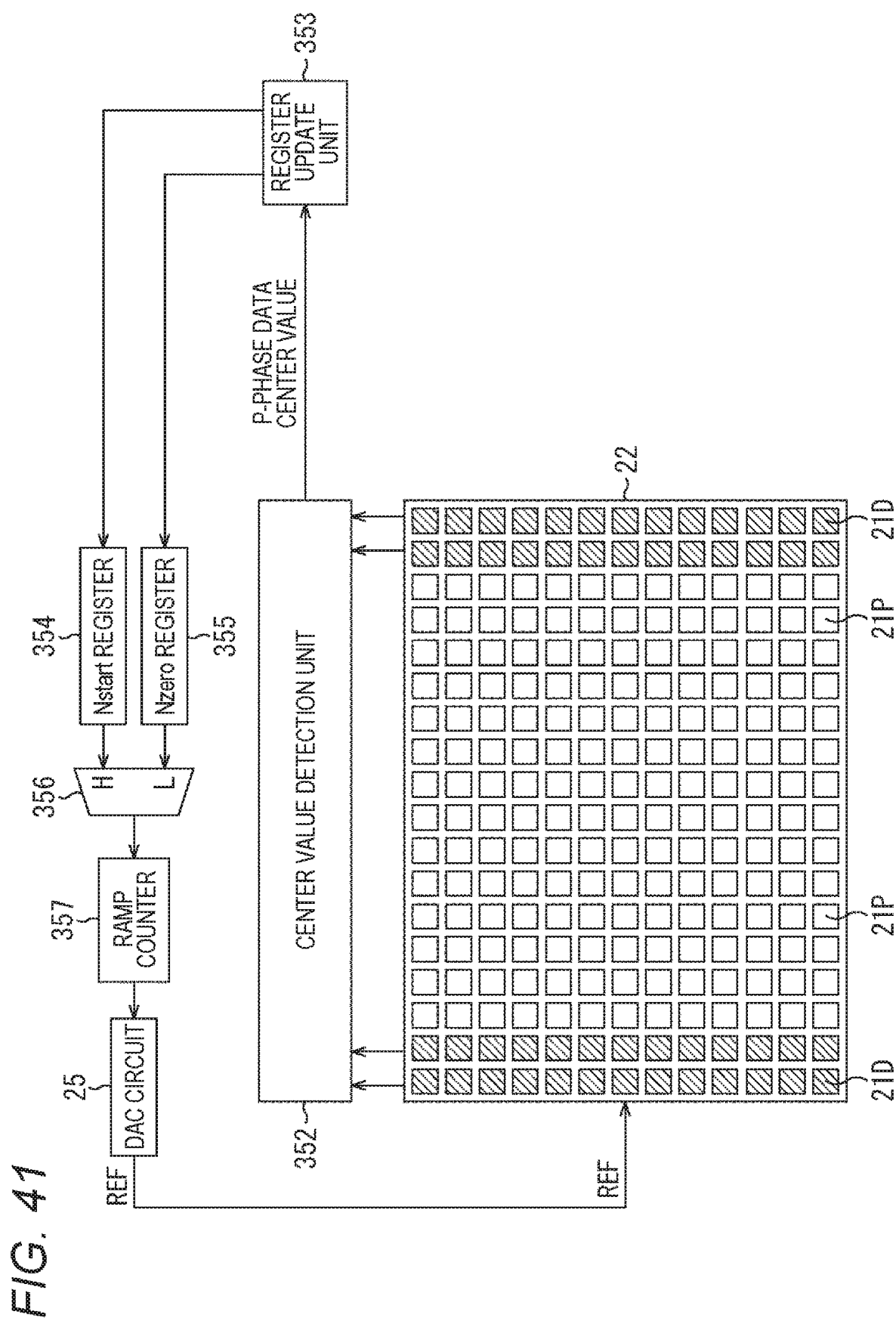
FIG. 41 is a diagram explaining acquisition of P-phase data by a light-shielded pixel.

As illustrated in FIG. 41, the pixels 21 of the pixel array unit 22 include a normal pixel 21P for imaging that receives incident light and performs photoelectric conversion, and a light-shielded pixel 21D that is the same as the normal pixel 21P in electrical characteristics but is shielded so that incident light does not enter the photoelectric conversion element 121 by a shielding body. The light-shielded pixel 21D is provided in an optical black (OPB) region for detecting a black level, and is also called an OPB pixel.

Since the P-phase data is acquired after resetting the FD 125 and before transferring the charge from the photoelectric conversion element, it is basically not affected by the exposure. However, in a case where the photoelectric conversion element 121 is exposed to strong light and generates a large amount of charges, some of the charges can leak over a potential barrier to the region of the FD 125 in the same semiconductor substrate. In the P-phase data acquired in such a situation, in addition to the feedthrough drop, the drop due to the leaked charge is superimposed, and the drop due to the leaked charge is also superimposed on the P-phase data center value.

Control of the REF ramp waveform by detecting the P-phase data center value is performed by adjusting the distribution center of the reset FD voltage to the center of the P-phase ramp for pixels in a normal state where no charge leaks so as to optimize the margin with respect to the P-phase limit value. Therefore, it is not preferable that the P-phase data of a charge leaking pixel be sampled to affect the detection of the P-phase data center value.

Therefore, the center value detection unit 352 of the timing generation circuit 29 samples the P-phase data of the light-shielded pixel 21D from among the plurality of pixels 21 of the pixel array unit 22, and detects the P-phase data center value. Then, the register value is updated on the basis of the detected P-phase data center value. In FIG. 41, the light-shielded pixels 21D are arranged in several columns at both left and right ends of the pixel array unit 22.

Figure 42:
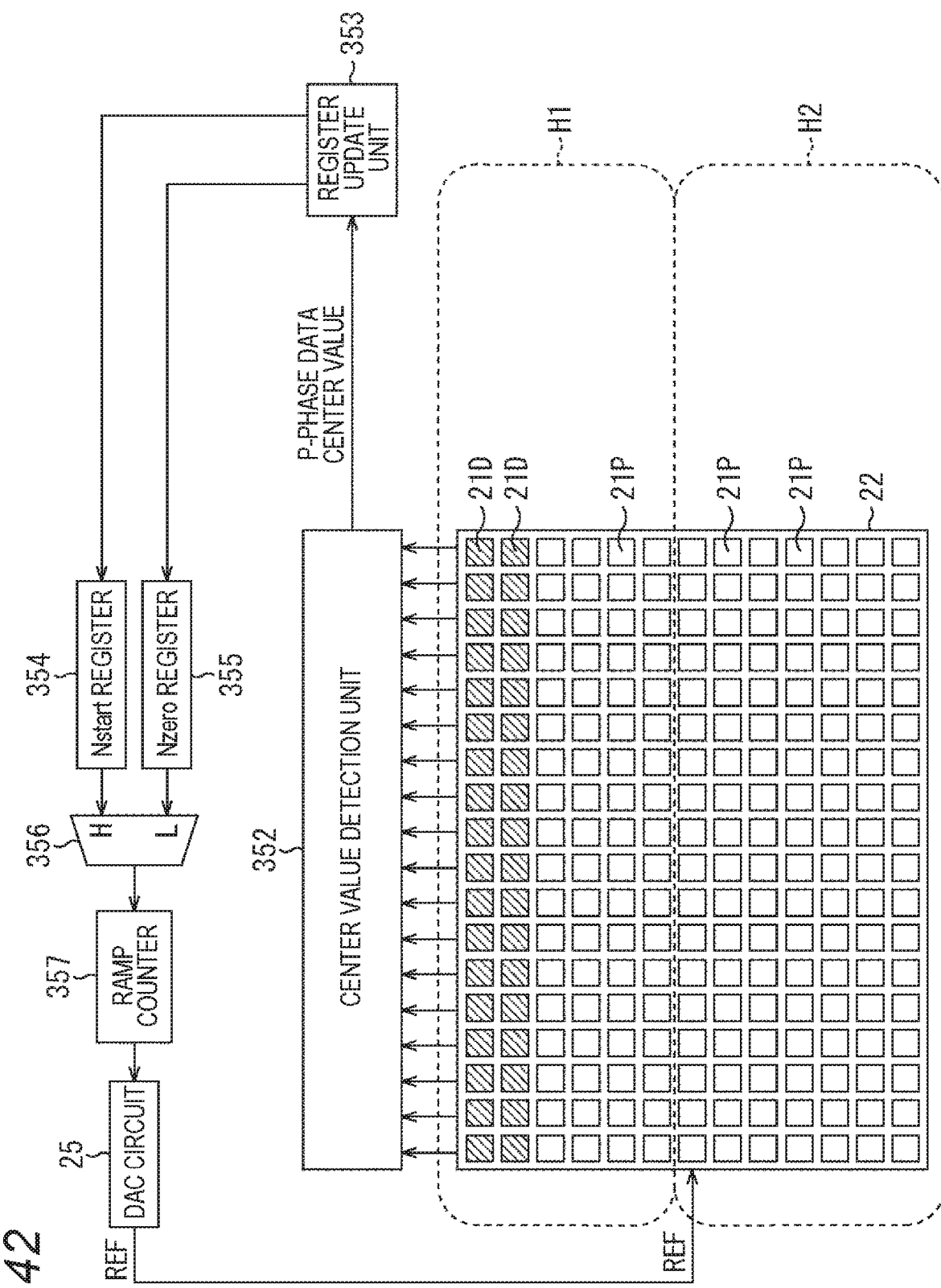
FIG. 42 is a diagram explaining acquisition of P-phase data by a light-shielded pixel.

On the other hand, FIG. 42 illustrates an example in which the light-shielded pixels 21D are arranged in several columns at the upper end of the pixel array unit 22. The center value detection unit 352 of the timing generation circuit 29 samples the P-phase data of the light-shielded pixels 21D from the plurality of pixels 21 of the pixel array unit 22, and detects the P-phase data center value. Then, the register value is updated on the basis of the detected P-phase data center value.

In this way, by limiting the pixels 21 that detect the P-phase data center value to the light-shielded pixels 21D, even in a situation where strong light is incident on some of the pixels 21 of the pixel array unit 22 and charges overflowing from the photoelectric conversion element 121 flow into the FD 125, it is possible to accurately detect the P-phase data center value.

Note that, as illustrated in FIG. 42, in a case where the pixel array unit 22 is divided into a first region H1 and a second region H2 and the AD conversion processing is executed separately for each region, the second region H2 lacks the light-shielded pixel 21D and therefore the P-phase data center value cannot be detected.

Figure 43:
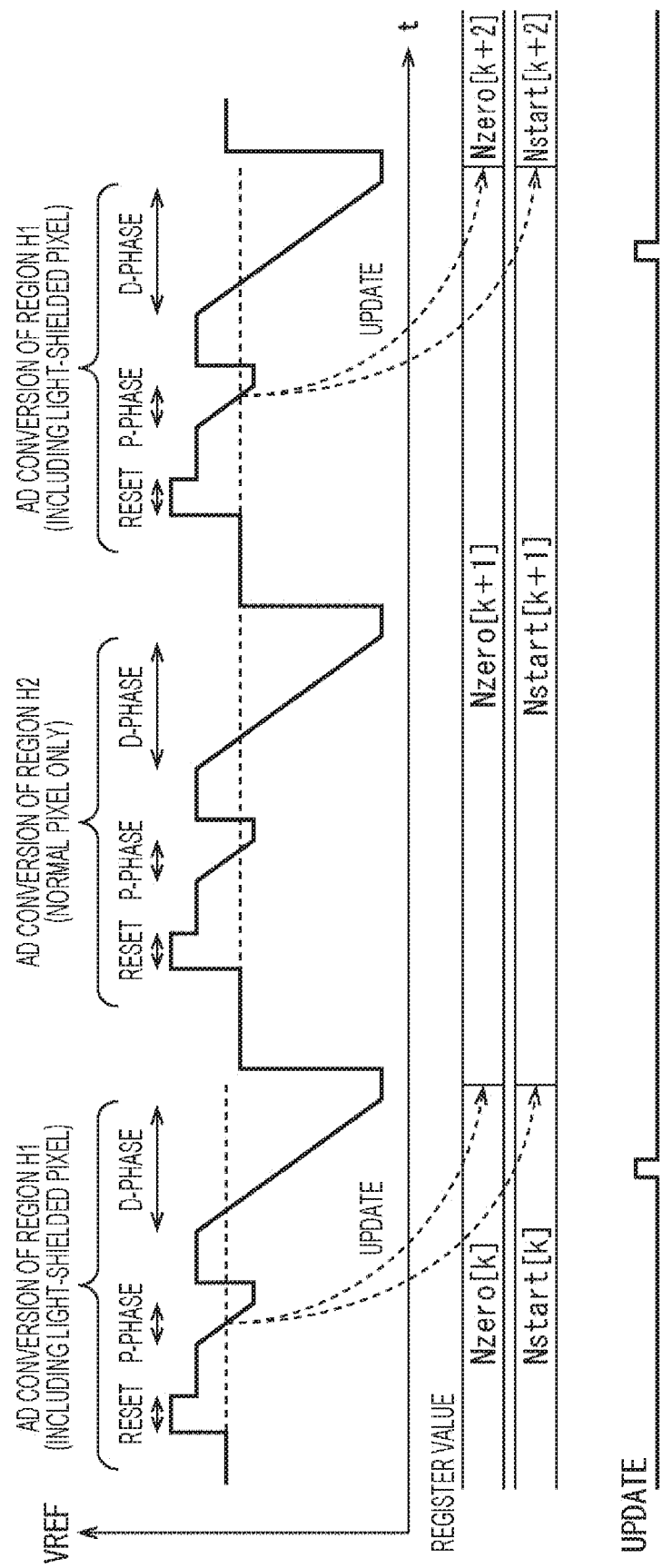
FIG. 43 is a diagram explaining updating of a register in the light-shielded pixel configuration in FIG. 42.

In this case, the timing controller 351 of the timing generation circuit 29 supplies the UPDATE signal instructing the register update to the register update unit 353 only in the AD conversion processing of the first region H1 as illustrated in FIG. 43 to update the register value. The timing controller 351 does not update the register value in the AD conversion processing of the second region H2. Again, as the register value when performing the AD conversion processing on the first region H1, the register value updated in the last AD conversion processing on the first region H1 is used as it is.

Figure 44:
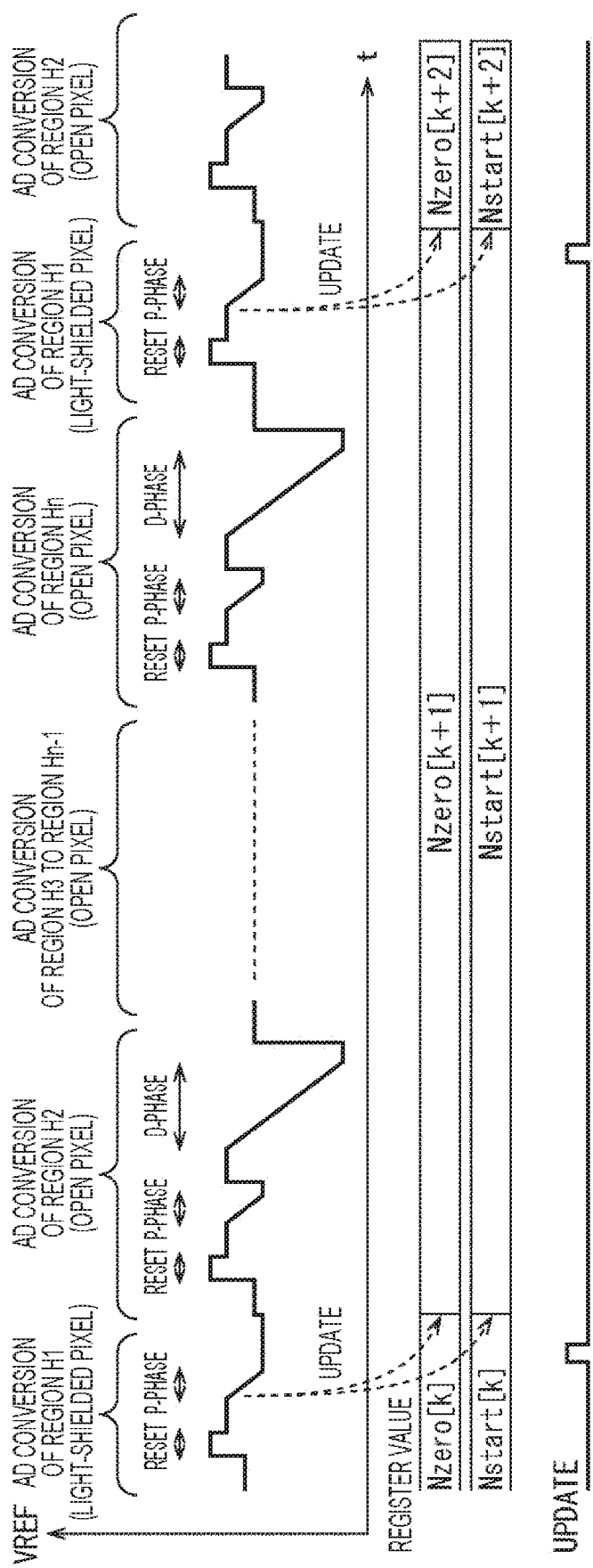
FIG. 44 is a diagram explaining updating of a register in the light-shielded pixel configuration in FIG. 42.

Further, for example, in a case where the pixel array unit 22 is divided into n regions from a first region H1 to an n-th region Hn and a predetermined region (for example, the first region H1) includes only the light-shielded pixels 21D, as illustrated in FIG. 44, acquisition of D-phase data can be omitted in the AD conversion processing of the first region H1 including only the light-shielded pixels 21D. Since no light information enters the light-shielded pixels 21D, there is no need to acquire D-phase data after the acquisition of the P-phase data and perform CDS arithmetic operation arithmetically operate a difference between both acquired data. It is only necessary to acquire the P-phase data to detect the P-phase data center value.

Note that even in the light-shielded pixels 21D, in a pixel adjacent to the normal pixel 21P, the charge overflowing from the photoelectric conversion element 121 of the normal pixel 21P can leak to the FD 125 of the light-shielded pixel 21D. In order to avoid such an influence, it is preferable to sample the light-shielded pixel 21D which is sufficiently far from the normal pixel 21P and has no influence of the charge leakage among the light-shielded pixels 21D. A guard band structure for trapping leakage charges may be provided between the light-shielded pixel 21D to be sampled and the nearest normal pixel 21P.

17. Other Detailed Configuration of Timing Generation Circuit

Figure 45:
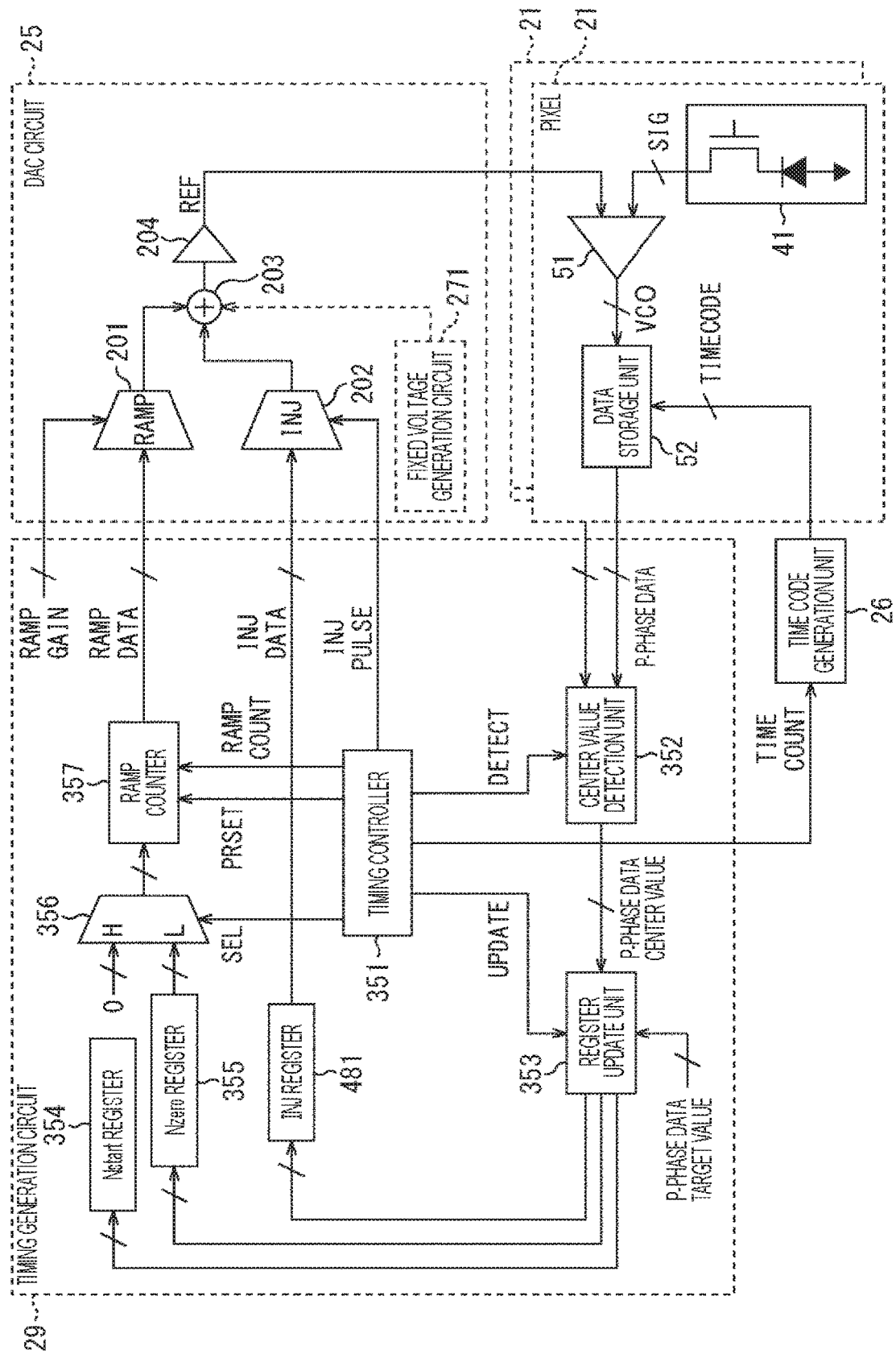
FIG. 45 is a diagram explaining another detailed configuration example of the timing generation circuit.

FIG. 45 illustrates another configuration example of the timing generation circuit 29.

In FIG. 45, parts corresponding to the configuration of the timing generation circuit 29 illustrated in FIG. 25 are designated by the same reference numerals, and their description is omitted.

The timing generation circuit 29 in FIG. 45 controls the relative relationship between the reset FD voltage and the REF ramp waveform by another method.

Specifically, an INJ register 481 for generating the injection data input INJ DATA is newly provided, and the Nzero value given as an input to the ramp DAC 201 at the time of reset and the injection data input INJ DATA input to the injection DAC 202 are adjusted. The Nstart value, which is a preset value at the start of the sweep of the P-phase ramp period and the D-phase ramp period of the ramp DAC 201, is fixed to 0.

In the timing generation circuit 29 of FIG. 25, when a register value update algorithm executed in the circuit of FIG. 33 or 34 continuously updates the Nzero value and the Nstart value, the Nstart value can be a nonzero positive integer. This means that the start voltage of the P-phase ramp waveform and the D-phase ramp waveform used for AD conversion is not the maximum output voltage of the ramp DAC 201. In a case where the ramp DAC 201 does not have a sufficient number of steps, sweeping the D-phase data from a large positive integer Nstart value may not be able to completely sweep the range to be swept during the D-phase ramp period.

The Nstart value is a positive integer when the center of the P-phase ramp waveform does not match the P-phase data center value unless sweeping starts at a low voltage of the P-phase ramp waveform even when the Nzero value is 0 and the ramp DAC 201 outputs the maximum output voltage at the time of reset, meaning that the voltage addition at the time of reset by the injection DAC 202 is unduly insufficient with respect to the drop voltage by the reset feedthrough.

The timing generation circuit 29 of FIG. 45 increases the value of the INJ register 481, which is the input of the injection DAC 202, by 1 in a case where the update value of the Nstart value becomes a non-zero positive integer in the register value update algorithm described in FIG. 33. Thus, the addition voltage by the injection DAC 202 during the reset in next AD conversion is increased.

Furthermore, in the timing generation circuit 29 of FIG. 25, when the register value update algorithm executed in the circuit of FIG. 33 or 34 continuously updates the Nzero value and the Nstart value, the updated Nzero value can exceed the input range allowed in the ramp DAC 201. This is when the center of the P-phase ramp waveform does not match the P-phase data center value even when the output of the ramp DAC 201 at reset is lowered to the lower limit voltage, meaning that the voltage addition at the time of reset by the injection DAC 202 is unduly exceeded with respect to the drop voltage by the reset feedthrough.

In a case where the updated value of the Nzero value exceeds the allowable maximum input value of the ramp DAC 201 by the register value update algorithm described with reference to FIG. 33, the timing generation circuit 29 of FIG. 45 reduces the value of the INJ register 481, which is the input of the injection DAC 202, by one, thereby reducing the addition voltage by the injection DAC 202 during the reset in the next AD conversion.

With the timing generation circuit 29 of FIG. 45, even if the initial value given to the input of the injection DAC 202 is not appropriate because the voltage drop amount due to the reset feedthrough is unknown or drift variability, the input value of the injection DAC 202 is gradually corrected to an appropriate value for reset feedthrough.

The timing generation circuit 29 of FIG. 45 is a double feedback system that feeds back the difference between the center of the P-phase ramp waveform and the P-phase data center value to the Nzero value of the Nzero register 355 and the INJ DATA of the INJ register 481. In order to ensure a stable operation of the system, it is an effective means that the feedback band of the INJ register 481 is set low, for example, once the INJ register 481 is updated, then the INJ register 481 is not updated by a plurality of number of times of AD conversion, preferably about 10 times, and only the Nzero value of the Nzero register 355 is updated, and the like.

Also with the configuration of the timing generation circuit 29 of FIG. 45, the P-phase data is sampled from an AD conversion result, the REF ramp waveform of the ramp DAC 201 used in next AD conversion is adjusted such that an unknown feedthrough voltage can be adaptively compensated and the distribution center of the P-phase data can be led to the center of the REF ramp waveform. This makes it possible to unfailingly acquire P-phase data from all pixels even with a REF ramp waveform during a short P-phase ramp period, and it is possible to prevent a reduction in AD conversion speed by setting a longer P-phase ramp waveform (P-phase ramp period) and an increase in the power consumption of the AD conversion caused by keeping the comparison circuit 51 operated for a long time.

18. Sixth Embodiment of DAC Circuit

Figure 46:
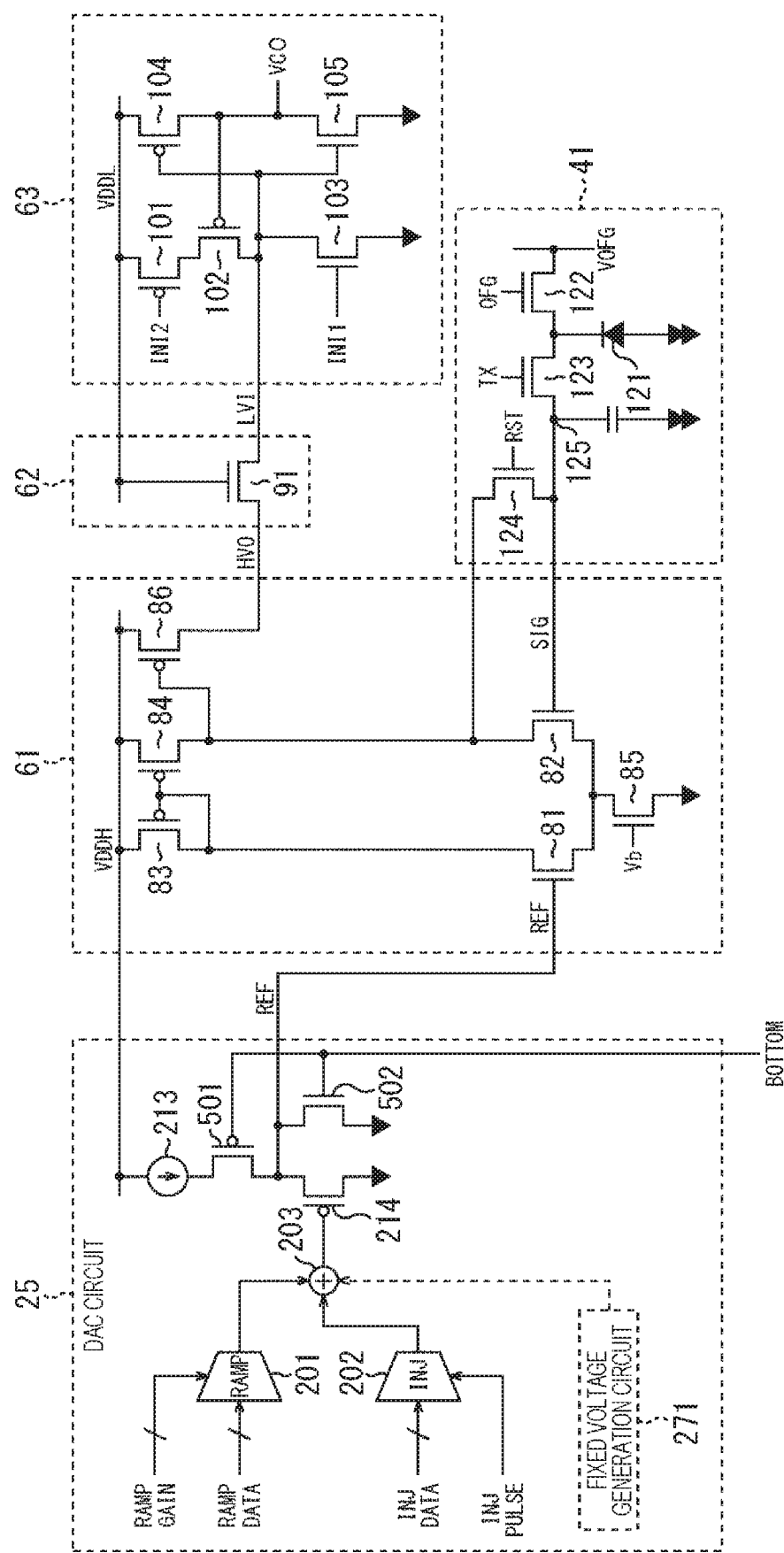
FIG. 46 is a diagram illustrating a circuit configuration of a sixth embodiment of the DAC circuit.

FIG. 46 illustrates a circuit configuration of the sixth embodiment of the DAC circuit 25. Note that FIG. 46 also illustrates the pixel circuit 41 and the comparison circuit 51 (the differential input circuit 61 to the positive feedback circuit 63).

The DAC circuit 25 of FIG. 46 is configured to enable input of a first output control signal BOTTOM and when the first output control signal BOTTOM becomes active, the DAC circuit 25 outputs a predetermined voltage (first specific voltage).

Specifically, in the DAC circuit 25 of FIG. 46, a PMOS transistor 501 is newly provided between the current source 213 and the PMOS transistor 214 constituting the source follower circuit 215 of FIG. 8, and an NMOS transistor 502 is newly provided between the output terminal and the GND of the DAC circuit 25. The first output control signal BOTTOM is supplied to the gates of the PMOS transistor 501 and the NMOS transistor 502. The PMOS transistor 501 and the NMOS transistor 502 constitute an output control circuit that controls the output voltage of the DAC circuit 25 to a specific voltage level.

When the first output control signal BOTTOM becomes active (Hi), the DAC circuit 25 sets the output REF voltage to the GND level. This output voltage is outside the output voltage range that can be operated by a digital numeric bus input to the DAC circuit 25. When the REF voltage is set to GND, then the current consumption of the FD direct-coupled comparator 61 can be set to 0 without operating the current source control bias Vb.

19. Seventh Embodiment of DAC Circuit

Next, the seventh embodiment of the DAC circuit 25 will be described with reference to FIG. 47.

Figure 47:
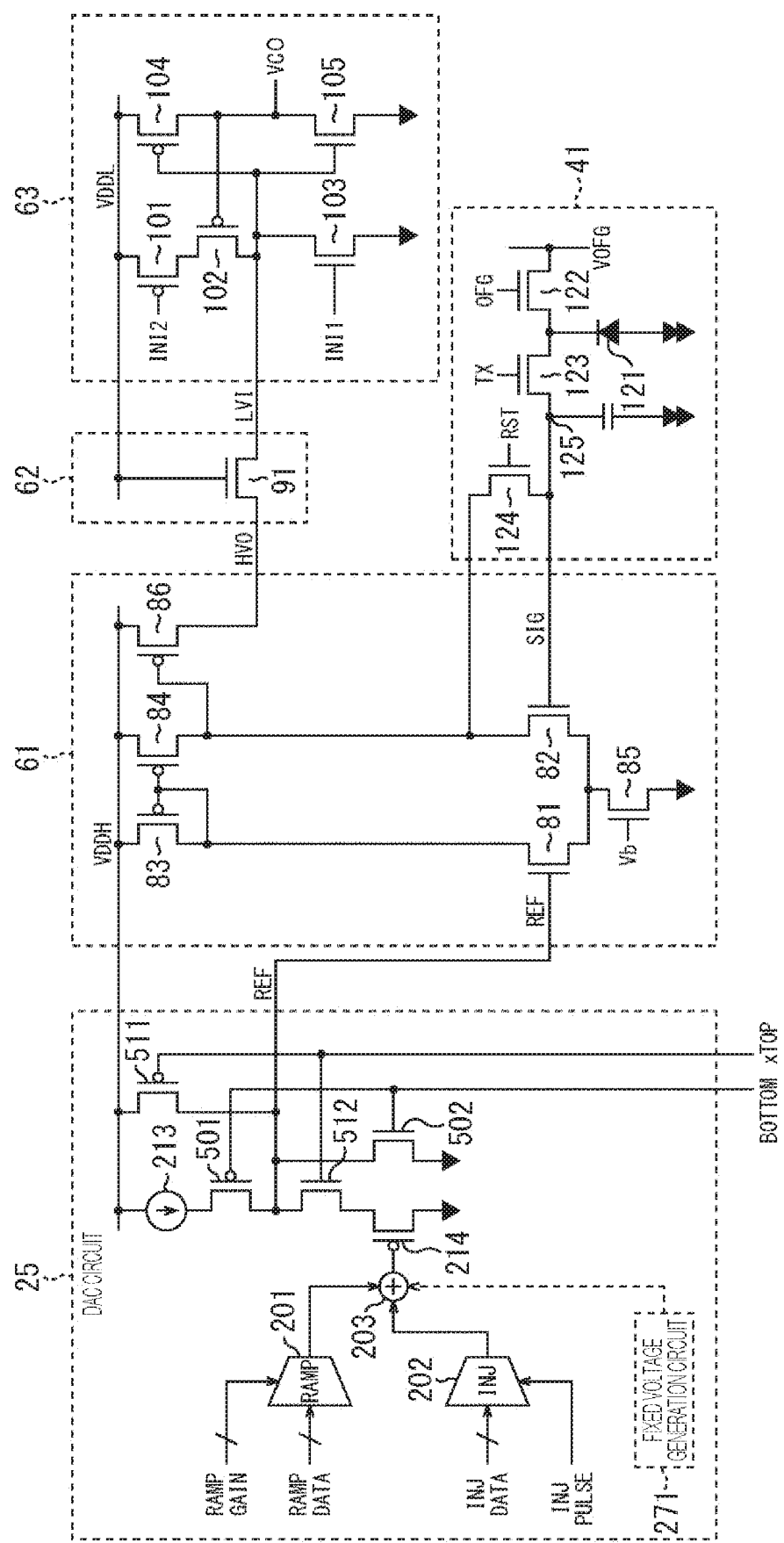
FIG. 47 is a diagram illustrating a circuit configuration of a seventh embodiment of the DAC circuit.

In FIG. 47, parts corresponding to those of FIG. 46 are designated by the same reference numerals, description of the parts is omitted as appropriate, and different parts are described.

The DAC circuit 25 of FIG. 47 is configured to enable input of a second output control signal xTOP in addition to the first output control signal BOTTOM of FIG. 46 and when the second output control signal xTOP becomes active, the DAC circuit 25 further outputs a predetermined voltage (second specific voltage) different from that when the first output control signal BOTTOM is active.

Specifically, in the DAC circuit 25 of FIG. 47, a PMOS transistor 511 is newly provided between the first power supply voltage VDDH and the output terminal of the DAC circuit 25, and an NMOS transistor 512 is newly provided between the output terminal of the DAC circuit 25 and the PMOS transistor 214. The second output control signal xTOP is supplied to gates of the PMOS transistor 511 and the NMOS transistor 512. In the DAC circuit 25 of FIG. 47, the PMOS transistor 501, the NMOS transistor 502, the PMOS transistor 511, and the NMOS transistor 512 constitute an output control circuit that controls the output voltage of the DAC circuit 25 to a specific voltage level.

When the second output control signal xTOP becomes active (Lo), the DAC circuit 25 sets the output REF voltage to the power supply voltage level (VDDH). This output voltage is also outside the output voltage range that can be operated by a digital numeric bus input to the DAC circuit 25. Simultaneous activation of the first output control signal BOTTOM and the second output control signal xTOP is prohibited.

The back gate of the NMOS transistor omitted in FIGS. 46 and 47 may be the same as GND in the drawings or may be a negative voltage equal to or lower than that.

Figure 48:
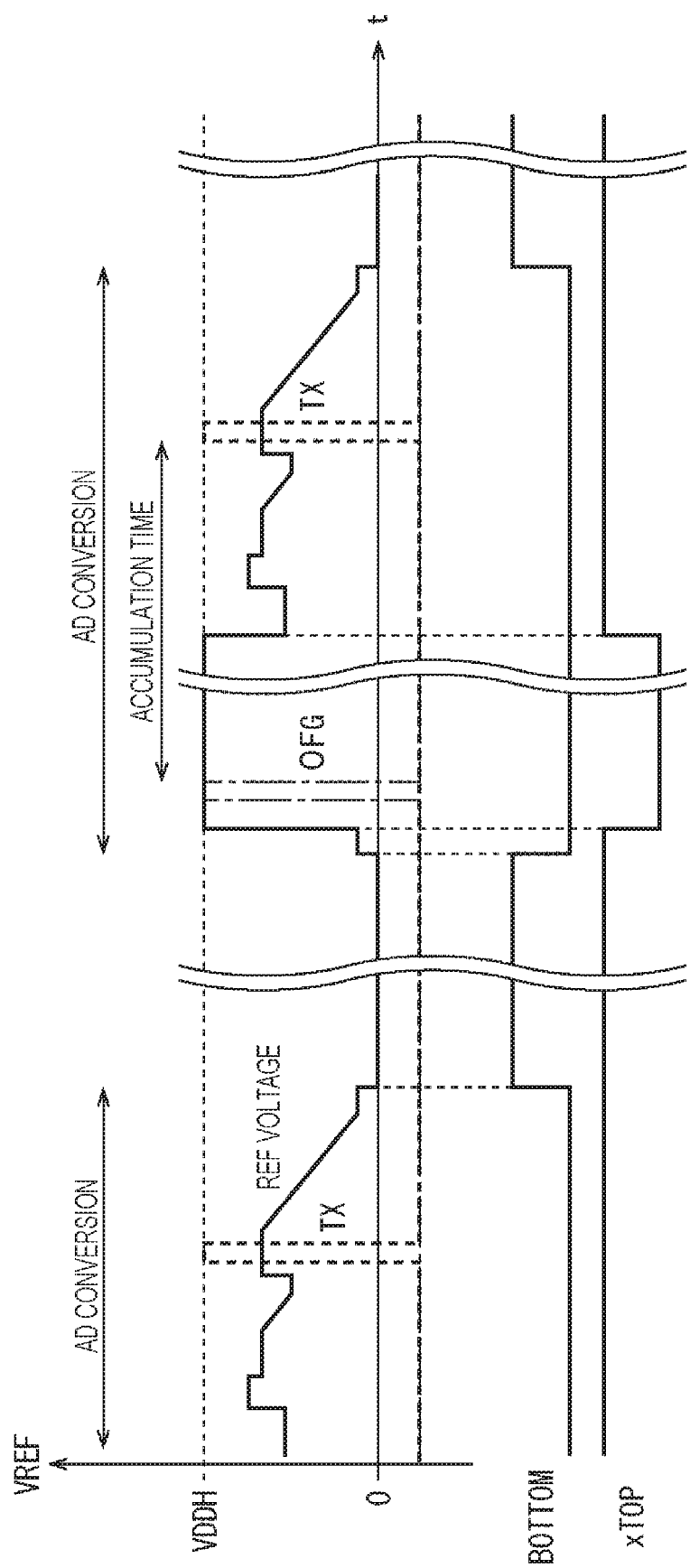
FIG. 48 is a timing chart illustrating driving by the DAC circuit in FIG. 47.

FIG. 48 is a timing chart illustrating the driving of the first output control signal BOTTOM and the second output control signal xTOP in the AD conversion processing.

As illustrated in FIG. 48, in a case where the AD conversion processing is executed intermittently, the DAC circuit 25 of FIGS. 46 and 47, from the end of the AD conversion to the start of the next AD conversion, transitions to a standby state where the first output control signal BOTTOM is active (Hi), the REF voltage is 0, and the current consumption of the comparison circuit 51 is 0. Thus, the time-average circuit power consumption can be suppressed.

The source and the drain of the NMOS transistor constituting the comparison circuit 51 are islands of an N-type region floating on the P-type semiconductor substrate 11, and can be emitters for emitting electrons to the substrate. The same semiconductor substrate 11 has an N-type region in which electrons generated from light by the photoelectric conversion element 121 are stored, and the N-type region is close to the source and drain of the NMOS transistor. If the source or drain of the NMOS transistor becomes the emitter and the electrons leak to the N-type region of the photoelectric conversion element 121, the charges become a noise with respect to light-induced electrons, so-called dark current noise. In order to reduce this noise, it is desirable that the source and the drain of the NMOS transistor constituting the comparison circuit 51 have a potential as high as possible.

The accumulation of the photoinduced electrons is performed in an accumulation period illustrated in FIG. 48 from when the electrons in the N-type region of the photoelectric conversion element 121 are cleared by setting the OFG signal indicated by the dashed line to Hi to when the electrons are transferred to the FD 125 by setting the TX signal indicated by the broken line to Hi. During the accumulation period, until the AD conversion operation starts, the second output control signal xTOP is activated (Lo), the REF voltage is raised to the power supply voltage level, and the source and the drain of the NMOS transistor excluding the source of the current source NMOS transistor of the comparison circuit 51 are raised to a position near the power supply voltage. Thus, the dark current noise during this period can be minimized.

The noise electrons accumulated during the period from the end of the AD conversion operation to the time when the OFG signal becomes Hi are discharged by turning on the discharge transistor 122 and do not become noise in the next AD conversion. Therefore, it is not necessary to set the source and the drain of the NMOS transistor of the comparison circuit 51 to a high voltage. Rather, during that period, it is desirable to bring the state to a standby state where the first output control signal BOTTOM is activated (Hi), the REF voltage is lowered to the GND level, and the consumption current of the comparison circuit 51 during that period is eliminated such that the time-average consumption current of the comparison circuit 51 is reduced.

The NMOS transistor 502 that has the first output control signal BOTTOM at the gate and shunts the REF voltage output to GND, and the PMOS transistor 511 that has the second output control signal xTOP at the gate and shunts the REF voltage output to the power supply voltage are inserted between a huge load capacitance by a large number of wirings that transmit the REF voltage and low impedance GND or power supply voltage. If a huge pull-down or pull-up current flows at the moment when the first output control signal BOTTOM or the second output control signal xTOP becomes active, the MOS transistors and the wiring transmitting the REF voltage can be damaged. To prevent such damage, peak current reduction measures are effective including adjusting the aspect ratio of those MOS transistors to high resistance, inserting a damping resistor in series with the MOS transistor, switching the first output control signal BOTTOM and the second output control signal xTOP from inert to active at a gentle gradient, and the like.

With the configuration in which the REF voltage output by the DAC circuit 25 is set to the GND level in a case where the first output control signal BOTTOM of the DAC circuit 25 according to the sixth embodiment and the seventh embodiment is active (Hi), the consumption power of the FD direct-coupled comparator 61 during the non-conversion period of the intermittent AD conversion can be reduced.

Furthermore, with the configuration in which the REF voltage output by the DAC circuit 25 is set to the power supply voltage level in a case where the second output control signal xTOP of the DAC circuit 25 according to the seventh embodiment is active (Lo), during the charge accumulation of the photoelectric conversion element 121, the bias voltage of the FD direct-coupled comparator 61 can be kept high and the dark current noise can be suppressed.

Note that, in the DAC circuit 25 of FIG. 46, a standby mode by the first output control signal BOTTOM is added. In the DAC circuit 25 of FIG. 47, the standby mode by the first output control signal BOTTOM and a dark current countermeasure mode by the second output control signal xTOP are added. Although not illustrated, the configuration of the DAC circuit 25 in which only the dark current countermeasure mode by the second output control signal xTOP is added is also possible.

In the above-described example, as the configuration of the solid-state imaging element 1 including the DAC circuit 25 and the timing generation circuit 29 according to each embodiment, a configuration including one AD conversion circuit 42 for one pixel or a plurality of pixels is adopted and described. However, the present technology is also applicable to a column AD type solid-state imaging element including one AD conversion circuit 42 for each column.

20. Examples of Application to Electronic Equipment

Furthermore, the present technology is not limited to application to a solid-state imaging element. That is, the present technology can be generally applied to electronic equipment using a solid-state imaging element in an image capturing unit (photoelectric conversion unit) such as an imaging apparatus such as a digital still camera, video camera, or the like, a portable terminal apparatus having an imaging function, or a copying machine using the solid-state imaging element for an image reading unit. The solid-state imaging element may be in a form of being formed as one chip or may be in a module form having an imaging function in which an imaging unit and a signal processing unit or an optical system are collectively packaged.

Figure 49:
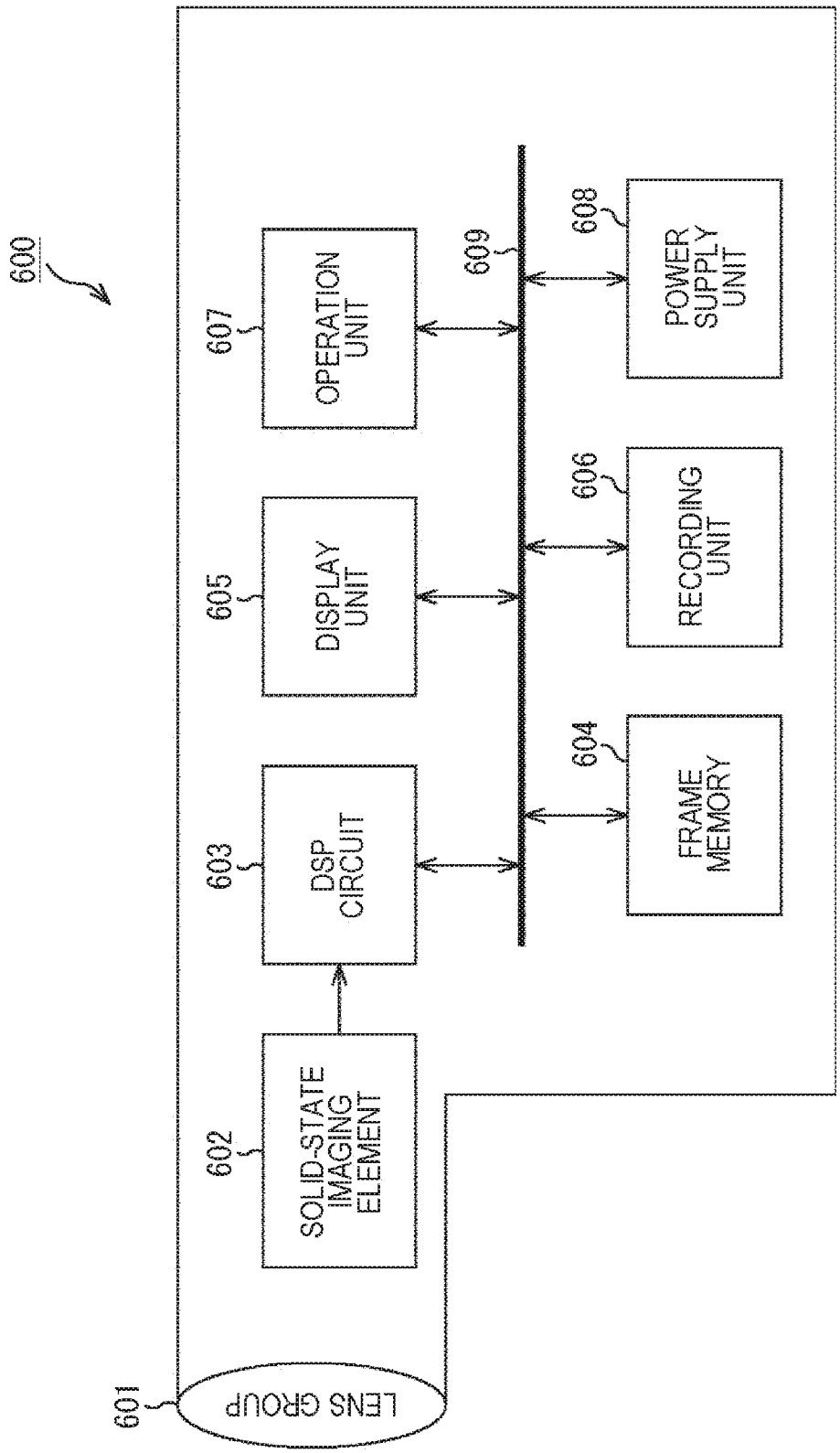
FIG. 49 is a block diagram illustrating a configuration example of an imaging apparatus, which is electronic equipment to which the present technology has been applied.

FIG. 49 is a block diagram illustrating a configuration example of an imaging apparatus, which is electronic equipment to which the present technology has been applied.

An imaging apparatus 600 in FIG. 49 includes an optical unit 601 including a lens group and the like, a solid-state imaging element (imaging device) 602 that adopts the configuration of the solid-state imaging element 1 of FIG. 1, and a digital signal processor (DSP) circuit 603 that is a camera signal processing circuit. Furthermore, the imaging apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to each other via a bus line 609.

The optical unit 601 takes in incident light (image light) from a subject and forms an image on an imaging surface of the solid-state imaging element 602. The solid-state imaging element 602 converts the amount of incident light that forms an image on the imaging surface by the optical unit 601 into an electric signal in units of pixel, and outputs the electric signal as a pixel signal. As the solid-state imaging element 602, the solid-state imaging element 1 of FIG. 1, that is, the solid-state imaging element including the DAC circuit 25 achieved with a small-scale circuit configuration can be used.

The display unit 605 includes, for example, a thin display such as a liquid crystal display (LCD) or an organic electro luminescence (EL) display, and displays a moving image or a still image captured by the solid-state imaging element 602. The recording unit 606 records a moving image or a still image captured by the solid-state imaging element 602 on a recording medium such as a hard disk, a semiconductor memory, or the like.

The operation unit 607 issues operation instructions with respect to various functions of the imaging apparatus 600 under a user's operation. The power supply unit 608 appropriately supplies various power sources, which are operation power for the DSP circuit 603, the frame memory 604, the display unit 605, the recording unit 606, and the operation unit 607, to these supply targets.

As described above, by using the solid-state imaging element 1 including the DAC circuit 25 and the timing generation circuit 29 described above as the solid-state imaging element 602, the size can be reduced. Accordingly, it is possible to reduce the size of the imaging apparatus 600 such as a video camera, a digital still camera, and a camera module for mobile equipment such as a mobile phone.

21. Application Examples to Mobile Objects

The technology according to the present disclosure (present technology) is applicable to a variety of products. For example, the technology according to the present disclosure may be implemented as apparatuses mounted on any type of movable bodies such as automobiles, electric vehicles, hybrid electric vehicles, motorcycles, bicycles, personal mobilities, airplanes, drones, ships, or robots.

Figure 50:
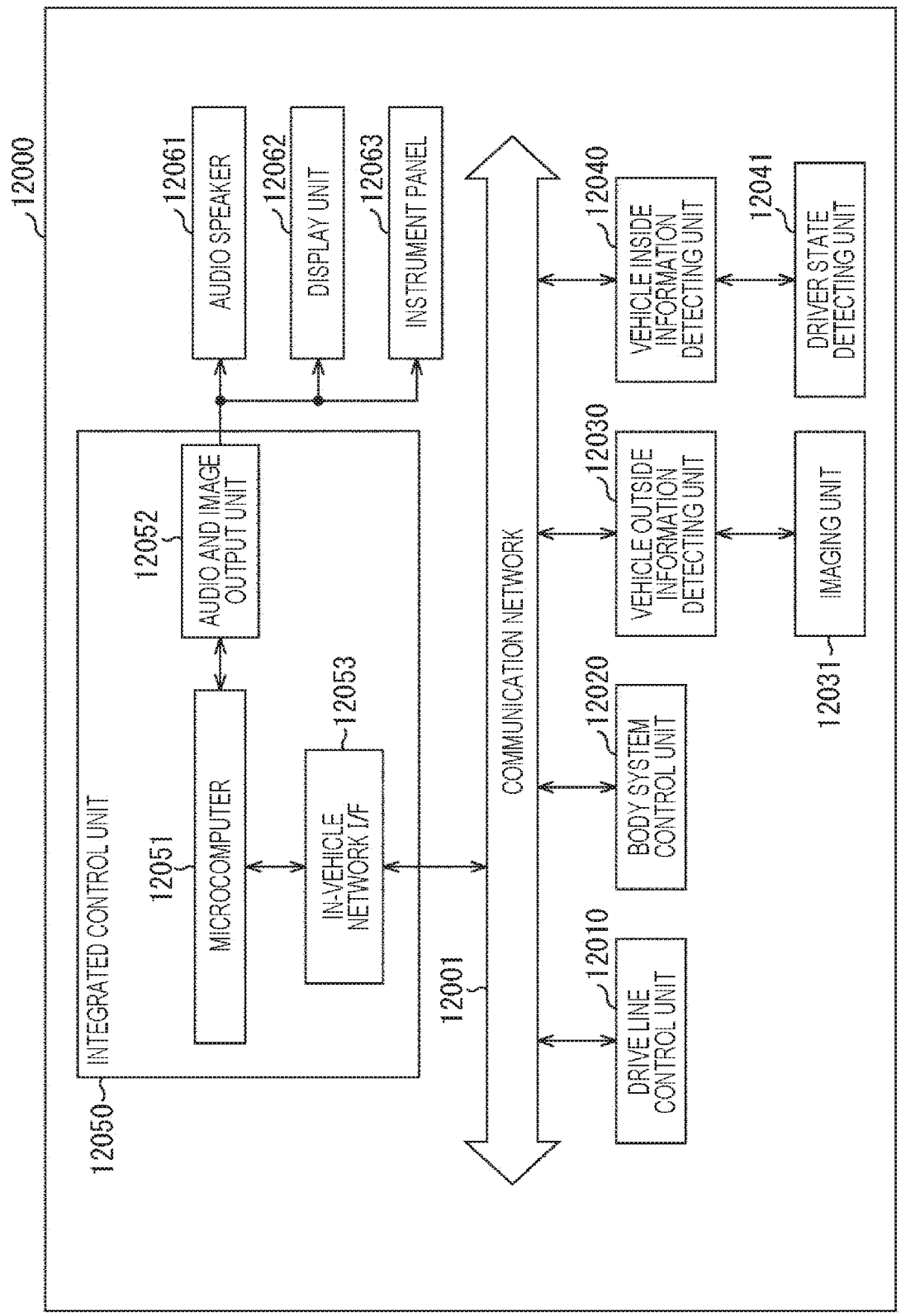
FIG. 50 is a block diagram illustrating an example of a schematic configuration of a vehicle control system.

FIG. 50 is a block diagram illustrating a schematic configuration example of a vehicle control system, which is an example of a movable body control system to which the technology according to the present disclosure can be applied.

The vehicle control system 12000 includes a plurality of electronic control units connected via a communication network 12001. In the example illustrated in FIG. 50, the vehicle control system 12000 includes a drive line control unit 12010, a body system control unit 12020, a vehicle outside information detecting unit 12030, a vehicle inside information detecting unit 12040, and an integrated control unit 12050. Furthermore, a microcomputer 12051, an audio and image output unit 12052, and an in-vehicle network interface (I/F) 12053 are illustrated as functional configurations of the integrated control unit 12050.

The drive line control unit 12010 controls the operation of apparatuses related to the drive line of the vehicle in accordance with a variety of programs. For example, the drive line control unit 12010 functions as a control apparatus for a driving force generating apparatus such as an internal combustion engine or a driving motor that generates the driving force of the vehicle, a driving force transferring mechanism that transfers the driving force to wheels, a steering mechanism that adjusts the steering angle of the vehicle, a braking apparatus that generates the braking force of the vehicle, and the like.

The body system control unit 12020 controls the operations of a variety of apparatuses attached to the vehicle body in accordance with a variety of programs. For example, the body system control unit 12020 functions as a control apparatus for a keyless entry system, a smart key system, a power window apparatus, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 accepts input of these radio waves or signals, and controls the vehicle door lock apparatus, the power window apparatus, the lights, or the like.

The vehicle outside information detecting unit 12030 detects information regarding the outside of the vehicle including the vehicle control system 12000. For example, the imaging unit 12031 is connected to the vehicle outside information detecting unit 12030. The vehicle outside information detecting unit 12030 causes the imaging unit 12031 to capture images of the outside of the vehicle, and receives the captured image. The vehicle outside information detecting unit 12030 may perform processing of detecting an object such as a person, a car, an obstacle, a traffic sign, or a letter on a road, or processing of detecting the distance on the basis of the received image.

The imaging unit 12031 is an optical sensor that receives light and outputs an electric signal corresponding to the amount of received light. The imaging unit 12031 can output the electric signal as the image or output the electric signal as ranging information. Furthermore, the light received by the imaging unit 12031 may be visible light or invisible light such as infrared light.

The vehicle inside information detecting unit 12040 detects information of the inside of the vehicle. The vehicle inside information detecting unit 12040 is connected, for example, to a driver state detecting unit 12041 that detects the state of the driver. The driver state detecting unit 12041 includes, for example, a camera that images a driver, and the vehicle inside information detecting unit 12040 may compute the degree of the driver's tiredness or the degree of the driver's concentration or determine whether or not the driver has a doze, on the basis of detection information input from the driver state detecting unit 12041.

The microcomputer 12051 can calculate a control target value of the driving force generating apparatus, the steering mechanism, or the braking apparatus on the basis of information regarding the inside and outside of the vehicle acquired by the vehicle outside information detecting unit 12030 or the vehicle inside information detecting unit 12040, and output a control instruction to the drive line control unit 12010. For example, the microcomputer 12051 can perform cooperative control for the purpose of executing the functions of the advanced driver assistance system (ADAS) including vehicle collision avoidance or impact reduction, follow-up driving based on the inter-vehicle distance, constant vehicle speed driving, vehicle collision warning, vehicle lane deviation warning, or the like.

Furthermore, the microcomputer 12051 can perform cooperative control for the purpose of automatic driving or the like for autonomous running without depending on the driver's operation through control of the driving force generating apparatus, the steering mechanism, the braking apparatus, or the like on the basis of information around the vehicle acquired by the vehicle outside information detecting unit 12030 or the vehicle inside information detecting unit 12040.

Furthermore, the microcomputer 12051 can output a control instruction to the body system control unit 12020 on the basis of the information outside the vehicle obtained by the vehicle outside information detecting unit 12030. For example, the microcomputer 12051 can perform the cooperative control for realizing glare protection such as controlling the head light according to a position of a preceding vehicle or an oncoming vehicle detected by the vehicle outside information detecting unit 12030 to switch a high beam to a low beam.

The audio and image output unit 12052 transmits an output signal of at least one of a sound or an image to an output apparatus capable of visually or aurally notifying a passenger of the vehicle or the outside of the vehicle of information. In the example of FIG. 50, an audio speaker 12061, a display unit 12062, and an instrument panel 12063 are exemplified as the output apparatus. For example, the display unit 12062 may include at least one of an onboard display or a head-up display.

Figure 51:
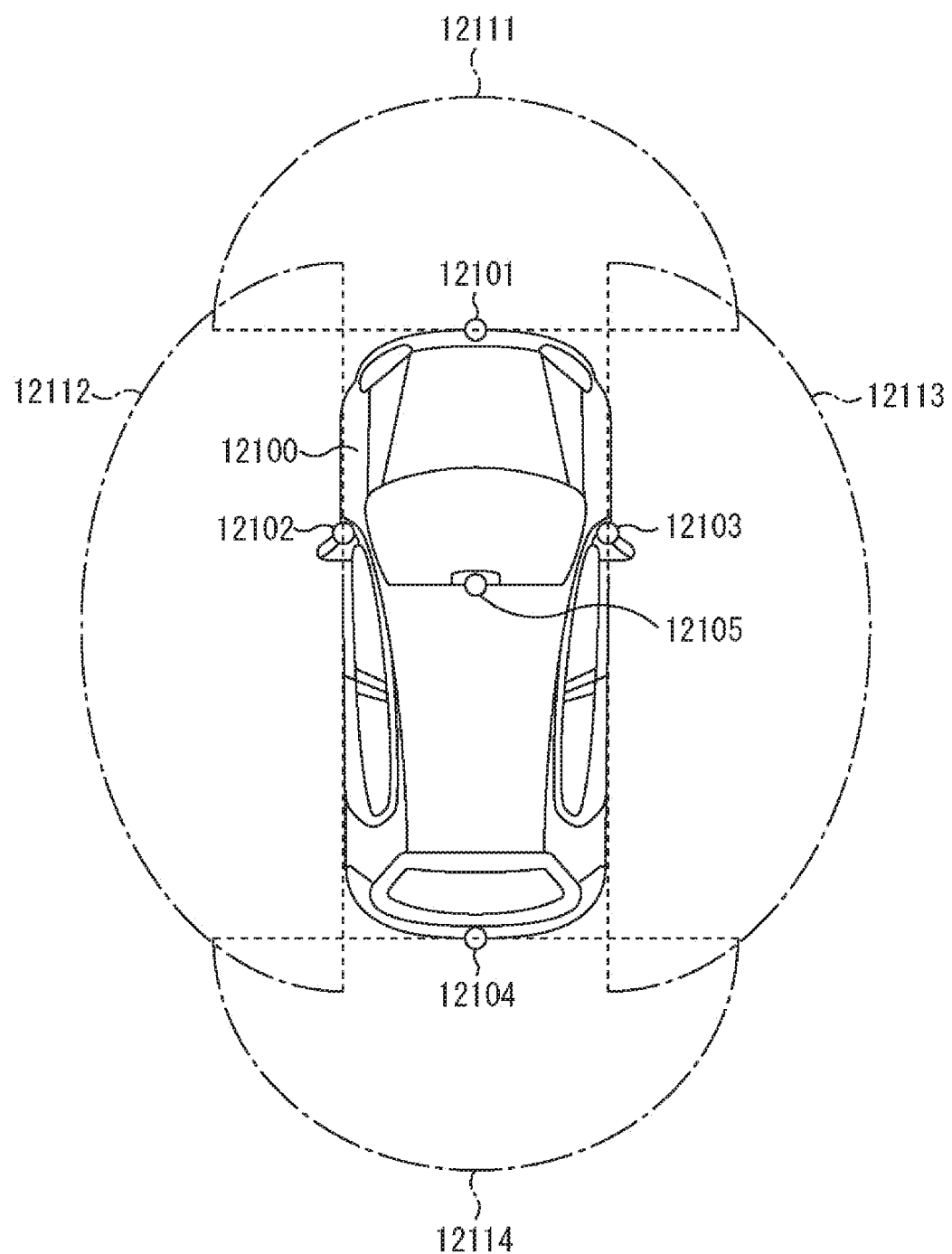
FIG. 51 is an explanatory diagram illustrating an example of installation positions of a vehicle outside information detecting section and an imaging unit.

FIG. 51 is a view illustrating an example of an installation position of the imaging unit 12031.

In FIG. 51, a vehicle 12100 includes imaging units 12101, 12102, 12103, 12104, and 12105 as the imaging unit 12031.

Imaging units 12101, 12102, 12103, 12104 and 12105 are positioned, for example, at the front nose, a side mirror, the rear bumper, the back door, the upper part of the windshield in the vehicle compartment, or the like of a vehicle 12100. The imaging unit 12101 attached to the front nose and the imaging unit 12105 attached to the upper part of the windshield in the vehicle compartment mainly acquire images of the area ahead of the vehicle 12100. The imaging units 12102 and 12103 attached to the side mirrors mainly acquire images of the areas on the sides of the vehicle 12100. The imaging unit 12104 attached to the rear bumper or the back door mainly acquires images of the area behind the vehicle 12100. Forward images acquired by the imaging units 12101 and 12105 are used mainly to detect a preceding vehicle, a pedestrian, an obstacle, a traffic light, a traffic sign, a lane, or the like.

Note that FIG. 51 illustrates an example of the respective imaging ranges of the imaging units 12101 to 12104. An imaging range 12111 represents the imaging range of the imaging unit 12101 attached to the front nose. Imaging ranges 12112 and 12113 respectively represent the imaging ranges of the imaging units 12102 and 12103 attached to the side mirrors. An imaging range 12114 represents the imaging range of the imaging unit 12104 attached to the rear bumper or the back door. For example, overlaying image data captured by the imaging units 12101 to 12104 offers an overhead image that looks down on the vehicle 12100.

At least one of the imaging units 12101 to 12104 may have a function of obtaining distance information. For example, at least one of the imaging units 12101 to 12104 may be a stereo camera including a plurality of image sensors, or may be an image sensor having pixels for phase difference detection.

For example, the microcomputer 12051 may extract especially a closest three-dimensional object on a traveling path of the vehicle 12100, the three-dimensional object traveling at a predetermined speed (for example, 0 km/h or higher) in a direction substantially the same as that of the vehicle 12100 as the preceding vehicle by determining a distance to each three-dimensional object in the imaging ranges 12111 to 12114 and change in time of the distance (relative speed relative to the vehicle 12100) on the basis of the distance information obtained from the imaging units 12101 to 12104. Moreover, the microcomputer 12051 can set an inter-vehicle distance to be secured in advance from the preceding vehicle, and can perform automatic brake control (including follow-up stop control), automatic acceleration control (including follow-up start control) and the like. In this manner, it is possible to perform the cooperative control for realizing automatic driving or the like to autonomously travel independent from the operation of the driver.

For example, the microcomputer 12051 can extract three-dimensional object data regarding the three-dimensional object while sorting the data into a two-wheeled vehicle, a regular vehicle, a large vehicle, a pedestrian, and other three-dimensional object such as a utility pole on the basis of the distance information obtained from the imaging units 12101 to 12104 and use the data for automatically avoiding obstacles. For example, the microcomputer 12051 discriminates obstacles around the vehicle 12100 into an obstacle visibly recognizable to a driver of the vehicle 12100 and an obstacle difficult to visually recognize. Then, the microcomputer 12051 determines a collision risk indicating a degree of risk of collision with each obstacle, and when the collision risk is equal to or higher than a set value and there is a possibility of collision, the microcomputer 12051 can perform driving assistance for avoiding the collision by outputting an alarm to the driver via the audio speaker 12061 and the display unit 12062 or performing forced deceleration or avoidance steering via the drive line control unit 12010.

At least one of the imaging units 12101 to 12104 may be an infrared camera for detecting infrared rays. For example, the microcomputer 12051 can recognize a pedestrian by determining whether or not there is a pedestrian in the captured images of the imaging units 12101 to 12104. Such pedestrian recognition is carried out, for example, by a procedure of extracting feature points in the captured images of the imaging units 12101 to 12104 as infrared cameras and a procedure of performing pattern matching processing on a series of feature points indicating an outline of an object to discriminate whether or not the object is a pedestrian. When the microcomputer 12051 determines that there is a pedestrian in the captured images of the imaging units 12101 to 12104 and recognizes the pedestrian, the audio and image output unit 12052 causes the display unit 12062 to superimpose a rectangular contour for emphasis on the recognized pedestrian. Furthermore, the audio and image output unit 12052 may cause the display unit 12062 to display icons or the like indicating pedestrians at desired positions.

An example of the vehicle control system to which the technology according to the present disclosure is applicable is heretofore described. The technology according to the present disclosure can be applied to the imaging unit 12031 among the configurations described above. Specifically, as the imaging unit 12031, the solid-state imaging element 1 including the DAC circuit 25 and the timing generation circuit 29 described above can be applied. By applying the technology according to the present disclosure to the imaging unit 12031, it is possible to acquire a more easily-viewed captured image and acquire distance information while reducing the size. Furthermore, it is possible to reduce driver fatigue and increase the degree of safety of the driver and the vehicle by using the obtained captured image and distance information.

<Example of Using Image Sensor>

Figure 52:
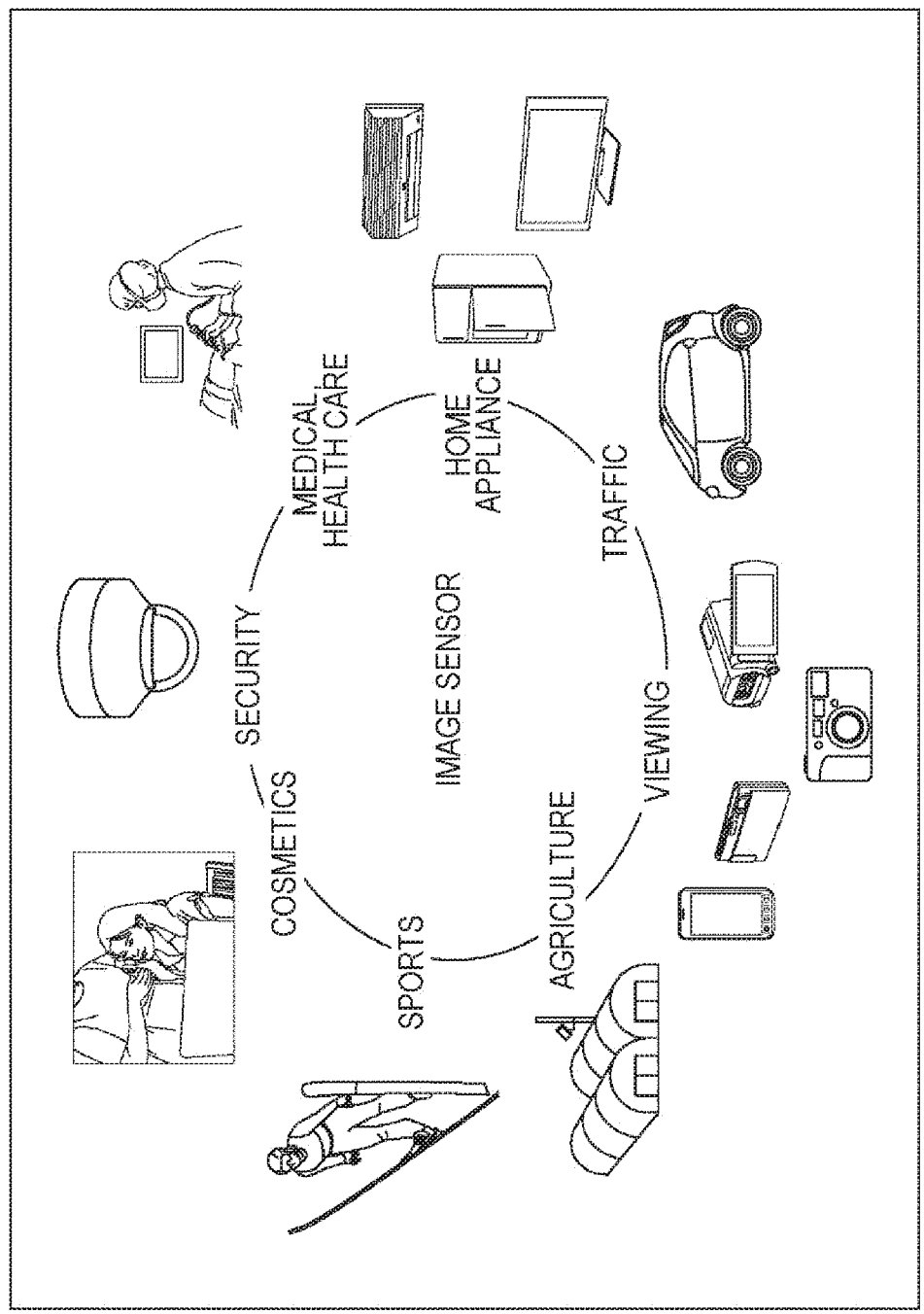
FIG. 52 is a diagram explaining an example of use of an image sensor.

FIG. 52 is a diagram illustrating an example of use of an image sensor using the solid-state imaging element 1 described above.

The image sensor using the solid-state imaging element 1 described above can be used in various cases for sensing light such as visible light, infrared light, ultraviolet light, and X-ray, for example, as described below.

Apparatuses for capturing images for viewing, such as digital cameras and mobile equipment with camera function Apparatuses used for traffic, such as in-vehicle sensors for imaging the front, rear, surroundings, inside, etc. of the vehicle, surveillance cameras for monitoring running vehicles and roads, and distance measurement sensors that measure the distance between vehicles and the like for safety driving for automatic stop and the like, recognition of a driver's state, and the like Apparatuses used in household appliances such as TVs, refrigerators, air conditioners, etc., for imaging user gestures and performing equipment operations in accordance with the gestures Apparatuses used for medical and health care, such as endoscopes and apparatuses that perform blood vessel imaging by receiving infrared light Apparatuses used for security, such as surveillance cameras for crime prevention and cameras for person authentication Apparatuses used for beauty, such as a skin measuring instrument for imaging the skin and a microscope for imaging the scalp Apparatuses used for sports, such as action cameras and wearable cameras for sports applications and the like Apparatuses used for agriculture, such as cameras for monitoring the state of fields and crops The embodiment of the present technology is not limited to the aforementioned embodiments, but various changes may be made within the scope not departing from the gist of the present technology.

For example, the form which combines all or one part of the aforementioned plurality of embodiments can be adopted.

This present technology is applicable not only to solid-state imaging elements that perform AD conversion of capacitive signals having signal voltages due to photoelectric conversion charges, but also to sensors for environmental parasitic capacitance and electric fields, for example, circuits that perform AD conversion of detection signals from fingerprint sensors and touch panels, and is particularly suitable for circuits that perform AD conversion collectively on a large number of capacitive sensors simultaneously.

Note that the effects described in the present description are merely illustrative and are not limitative, and effects not described in the present specification may be provided.

Note that the present technology may be configured as below.

(1)
A DAC circuit includes:
a ramp DAC that generates a ramp signal that changes in voltage with a constant time gradient;
an injection DAC that outputs a predetermined voltage during a reset period for resetting a comparison target voltage to be compared with the ramp signal; and an adding circuit that adds an output of the ramp DAC and
an output of the injection DAC and outputs the outputs to a comparison circuit as a comparison reference voltage.

(2)
The DAC circuit according to (1), in which
the ramp DAC and the injection DAC change an output voltage at a predetermined step voltage according to an input value, and the step voltage of the ramp DAC is set smaller than the step voltage of the injection DAC.

(3)
The DAC circuit according to (1) or (2), further including
a fixed voltage generation circuit that generates a predetermined fixed bias voltage, in which
the adding circuit further adds an output of the fixed voltage generation circuit to the output of the ramp DAC and the output of the injection DAC, and outputs the outputs to the comparison circuit as the comparison reference voltage.

(4)
The DAC circuit according to (3), in which
the fixed voltage generation circuit includes a sample-hold circuit, and
the fixed voltage generation circuit outputs the predetermined fixed bias voltage when the sample-hold circuit is in a hold mode.

(5)
The DAC circuit according to any of (1) to (4), further including
a selector that selects any one of a first input value and a second input value and supplies the selected input value to the injection DAC, in which
the injection DAC outputs a first voltage based on the first input value or a second voltage based on the second input value supplied from the selector.

(6)
The DAC circuit according to (5), in which
the comparison circuit performs comparison between the comparison target voltage generated by transferring a signal charge and the comparison reference voltage a plurality of times.

(7)
The DAC circuit according to any of (1) to (6), further including
a control circuit that determines an input value for controlling a voltage of the ramp signal of a next frame on the basis of an AD conversion result of a previous frame and supplies the input value to the ramp DAC, in which
the ramp DAC generates the ramp signal on the basis of the input value supplied from the control circuit.

(8)
The DAC circuit according to (7), in which
the control circuit uses an average value of an N-th maximum value (1<N) and an M-th minimum value (1<M) of a plurality of pixels extracted from the previous frame to detect a P-phase data center value, which is a center value of P-phase data indicating a reset level of the pixels in CDS processing, and determine the input value for controlling the voltage of the ramp signal of the next frame.

(9)
The DAC circuit according to (8), in which
the control circuit detects the average value of the N-th maximum value and the M-th minimum value of the plurality of pixels extracted from the previous frame in multiple stages.

(10)
The DAC circuit according to (8) or (9), in which
the control circuit sets a fast convergence zone, a slow convergence zone, and a dead zone with respect to an absolute value of a difference between the detected P-phase data center value and a desired P-phase data target value, and applies feedback with different sensitivities.

(11)
The DAC circuit according to any of (8) to (10), in which
the control circuit extracts only light-shielded pixels of the previous frame as the plurality of pixels.

(12)
The DAC circuit according to any of (1) to (11), further including
an output control circuit that outputs a specific voltage level to the comparison circuit on the basis of an output control signal.

(13)
The DAC circuit according to (12), in which
the output control circuit causes the comparison circuit to output a GND level in a case where a first output control signal as the output control signal becomes active.

(14)
The DAC circuit according to (12) or (13), in which
the output control circuit causes the comparison circuit to output a power supply voltage level in a case where a second output control signal as the output control signal becomes active.

(15)
The DAC circuit according to any of (1) to (14), in which
the comparison circuit includes a differential input circuit,
one input of the differential input circuit is DC-directly coupled to the comparison target voltage generated by transferring a signal charge,
another input of the differential input circuit is DC-directly coupled to the comparison reference voltage, and
the comparison circuit resets the comparison target voltage to the comparison reference voltage during the reset period.

(16)
The DAC circuit according to any of (1) to (14), in which
the comparison circuit includes a differential input circuit,
one input of the differential input circuit is DC-directly coupled to a reverse bias diode that accumulates a photo-electrically converted signal charge,
another input of the differential input circuit is DC-directly coupled to the comparison reference voltage, and
the comparison circuit resets a voltage of the reverse bias diode to the comparison reference voltage during the reset period.

(17)
A solid-state imaging element including:
a DAC circuit including:
a ramp DAC that generates a ramp signal that changes in voltage with a constant time gradient;
an injection DAC that outputs a predetermined voltage during a reset period for resetting a comparison target voltage to be compared with the ramp signal; and
an adding circuit that adds an output of the ramp DAC and an output of the injection DAC and outputs the outputs to a comparison circuit as a comparison reference voltage.

(18)

Electronic equipment including:

a solid-state imaging element including a DAC circuit including:

a ramp DAC that generates a ramp signal that changes in voltage with a constant time gradient;

an injection DAC that outputs a predetermined voltage during a reset period for resetting a comparison target voltage to be compared with the ramp signal; and an adding circuit that adds an output of the ramp DAC and an output of the injection DAC and outputs the outputs to a comparison circuit as a comparison reference voltage.

(B1)

The DAC circuit including:

an output control circuit that outputs a specific voltage level to a comparison circuit on the basis of an output control signal, and the specific voltage level is a voltage exceeding a range obtained by multiplying a step voltage by a DAC input value.

(B2)

The DAC circuit according to (B1), in which the output control circuit causes the comparison circuit to output a GND level in a case where a first output control signal as the output control signal becomes active.

(B3)

The DAC circuit according to (B1) or (B2), in which the output control circuit causes the comparison circuit to output a power supply voltage level in a case where a second output control signal as the output control signal becomes active.

REFERENCE SIGNS LIST

1 Solid-state imaging element
21 Pixel
22 Pixel array unit
25 DAC circuit
29 Timing generation circuit
41 Pixel circuit
42 AD conversion circuit
51 Comparison circuit
61 Differential input circuit (comparator)
121 Photoelectric conversion element
122 Discharge transistor
123 Transfer transistor
124 Reset transistor
125 FD (floating diffusion layer)
201 Ramp DAC
202 Injection DAC
203 Adding circuit
204 Current amplification circuit
222 Sample-hold circuit
271 Fixed voltage generation circuit
272 Fixed current source
291 Sample-hold circuit
291 Error amplifier
293 Voltage source
321 Additional FD
324 Selector
351 Timing controller
352 Center value detection unit
353 Register update unit
371 First layer detection unit
372 Second layer detection unit
411 Nonlinear filter
431 Determination unit
432 Moving average unit
433 Attenuation unit
434 Selector
452 Ramp DAC
453 Bias DAC
454 Injection DAC
481 INJ register
501 PMOS transistor
502 NMOS transistor
600 Imaging apparatus
602 Solid-state imaging element

The invention claimed is:

1. A DAC circuit, comprising:

a ramp DAC configured to generate a ramp signal that changes in voltage with a constant time gradient;

an injection DAC configured to output a determined voltage during a reset period to reset a comparison target voltage to be compared with the ramp signal;

a fixed voltage generation circuit configured to generate a determined fixed bias voltage; and an adding circuit configured to:

add an output of the fixed voltage generation circuit to an output of the ramp DAC and an output of the injection DAC; and output a result of the addition to a comparison circuit as a comparison reference voltage.

2. The DAC circuit according to claim 1, wherein the ramp DAC and the injection DAC are further configured to change an output voltage at a step voltage according to an input value, and a step voltage of the ramp DAC is set smaller than a step voltage of the injection DAC.

3. The DAC circuit according to claim 1, wherein the fixed voltage generation circuit includes a sample-hold circuit, and the fixed voltage generation circuit is further configured to output the determined fixed bias voltage when the sample-hold circuit is in a hold mode.

4. The DAC circuit according to claim 1, further comprising a selector configured to:

select one of a first input value and a second input value; and supply the selected one of the first input value and the second input value to the injection DAC, wherein the injection DAC is further configured to output a first voltage based on the first input value or a second voltage based on the second input value supplied from the selector.

5. The DAC circuit according to claim 4, wherein the comparison circuit is configured to compare the comparison target voltage and the comparison reference voltage a plurality of times, and the comparison target voltage is generated based on transfer of a signal charge.

6. The DAC circuit according to claim 1, further comprising a control circuit configured to:

determine an input value to control a voltage of the ramp signal of a next frame based on an AD conversion result of a previous frame; and supply the input value to the ramp DAC, wherein the ramp DAC is further configured to generate the ramp signal based on the input value supplied from the control circuit.

7. The DAC circuit according to claim 6, wherein the control circuit is further configured to:

detect a P-phase data center value based on an average value of an N-th maximum value (1<N) and an M-th minimum value (1<M) of a plurality of pixels extracted from the previous frame, wherein the P-phase data center value is a center value of P-phase data indicating a reset level of the pixels in a correlated double sampling (CDS) processing; and determine the input value to control the voltage of the ramp signal of the next frame.

8. The DAC circuit according to claim 7, wherein the control circuit is further configured to detect the average value of the N-th maximum value and the M-th minimum value of the plurality of pixels extracted from the previous frame in multiple stages.

9. The DAC circuit according to claim 7, wherein the control circuit is further configured to:

seta fast convergence zone, a slow convergence zone, and a dead zone with respect to an absolute value of a difference between the detected P-phase data center value and a desired P-phase data target value; and
apply feedback with different sensitivities.

10. The DAC circuit according to claim 7, wherein the control circuit is further configured to extract only light-shielded pixels of the previous frame as the plurality of pixels.

11. The DAC circuit according to claim 1, further comprising an output control circuit configured to output a specific voltage level to the comparison circuit based on an output control signal.

12. The DAC circuit according to claim 11, wherein the output control circuit is further configured to cause the comparison circuit to output a GND level based on a first output control signal, as the output control signal, that becomes active.

13. The DAC circuit according to claim 11, wherein the output control circuit is further configured to cause the comparison circuit to output a power supply voltage level based on a second output control signal, as the output control signal, that becomes active.

14. The DAC circuit according to claim 1, wherein
the comparison circuit includes a differential input circuit,
a first input of the differential input circuit is DC-directly coupled to the comparison target voltage generated based on transfer of a signal charge,
a second input of the differential input circuit is DC-directly coupled to the comparison reference voltage, and
the comparison circuit is further configured to reset the comparison target voltage to the comparison reference voltage during the reset period.

15. The DAC circuit according to claim 1, wherein
the comparison circuit includes a differential input circuit,
a first input of the differential input circuit is DC-directly coupled to a reverse bias diode that accumulates a photoelectrically converted signal charge,
a second input of the differential input circuit is DC-directly coupled to the comparison reference voltage, and
the comparison circuit is further configured to reset a voltage of the reverse bias diode to the comparison reference voltage during the reset period.

16. A solid-state imaging element, comprising:
a DAC circuit including:
a ramp DAC configured to generate a ramp signal that changes in voltage with a constant time gradient;
an injection DAC configured to output a determined voltage during a reset period to reset a comparison target voltage to be compared with the ramp signal;
a fixed voltage generation circuit configured to generate a determined fixed bias voltage; and
an adding circuit configured to:
add an output of the fixed voltage generation circuit to an output of the ramp DAC and an output of the injection DAC; and
output a result of the addition to a comparison circuit as a comparison reference voltage.

17. An electronic equipment, comprising:
a solid-state imaging element including a DAC circuit, wherein the DAC circuit includes:
a ramp DAC configured to generate a ramp signal that changes in voltage with a constant time gradient;
an injection DAC configured to output a determined voltage during a reset period to reset a comparison target voltage to be compared with the ramp signal;
a fixed voltage generation circuit configured to generate a determined fixed bias voltage; and
an adding circuit configured to:
add an output of the fixed voltage generation circuit to an output of the ramp DAC and an output of the injection DAC; and
output a result of the addition to a comparison circuit as a comparison reference voltage.

\* \* \* \* \*